United States Patent
Morgenshtein et al.

(10) Patent No.: US 7,345,511 B2
(45) Date of Patent: Mar. 18, 2008

(54) LOGIC CIRCUIT AND METHOD OF LOGIC CIRCUIT DESIGN

(75) Inventors: Arkadiy Morgenshtein, Kiryat Motzkin (IL); Alexander Fish, Hadera (IL); Israel A. Wagner, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 266 days.

(21) Appl. No.: 10/648,474

(22) Filed: Aug. 27, 2003

(65) Prior Publication Data
US 2004/0130349 A1 Jul. 8, 2004

Related U.S. Application Data

(60) Provisional application No. 60/406,751, filed on Aug. 29, 2002.

(51) Int. Cl.
*H03K 19/094* (2006.01)
*H03K 19/20* (2006.01)

(52) U.S. Cl. .................. 326/122; 326/112; 326/113

(58) Field of Classification Search .............. 326/55, 326/112, 113, 119, 120, 121, 122
See application file for complete search history.

(56) References Cited

U.S. PATENT DOCUMENTS

| | | | | |
|---|---|---|---|---|
| 3,986,042 A | * | 10/1976 | Padgett et al. | 326/121 |
| 5,412,599 A | * | 5/1995 | Daniele et al. | 365/185.14 |
| 5,917,758 A | * | 6/1999 | Keeth | 365/189.05 |
| 6,084,437 A | * | 7/2000 | Sako | 326/113 |
| 6,124,736 A | | 9/2000 | Yamashita et al. | |
| 6,185,719 B1 | | 2/2001 | Sako | |
| 6,486,708 B2 | | 11/2002 | Yamashita et al. | |

OTHER PUBLICATIONS

Al-Assadi et al, "Pass-Transistor Logic Design", *Int. J. Electronics*, 70(4):739-749, 1991.
Chandrakasan et al, "Minimizing Power Consumption in Digital CMOS Circuits", *Proc. IEEE*, 83(4):498-523, 1995.

(Continued)

*Primary Examiner*—Daniel D. Chang

(57) ABSTRACT

A complementary logic circuit contains a first logic input, a second logic input, a first dedicated logic terminal, a second dedicated logic terminal, a first logic block, and a second logic block. The first logic block consists of a network of p-type transistors for implementing a predetermined logic function. The p-type transistor network has an outer diffusion connection, a first network gate connection, and an inner diffusion connection. The outer diffusion connection of the p-type transistor network is connected to the first dedicated logic terminal, and the first network gate connection of the p-type transistor network is connected to the first logic input. The second logic block consists of a network of n-type transistors which implements a logic function complementary to the logic function implemented by the first logic block. The n-type transistor network has an outer diffusion connection, a first network gate connection, and an inner diffusion connection. The outer diffusion connection of the n-type transistor network is connected to the second dedicated logic terminal, and the first network gate connection of the n-type transistor network is connected to the second logic input. The inner diffusion connections of the p-type network and of the n-type network are connected together to form a common diffusion logic terminal.

43 Claims, 56 Drawing Sheets
(12 of 56 Drawing Sheet(s) Filed in Color)

OTHER PUBLICATIONS

Ozdag et al, "High-Speed QDI Asynchronous Pipelines", *Proc. 8th Int. Symposium on Asynchronous Circuits and Systems*, Apr. 2002, pp. 1-10.

Morgenshtein et al, "Gate-Diffusion Input (GDI)—A Novel Power Efficient Method for Digital Circuits: A Design Methodology", *14th Annual IEEE International ASIC/SOC Conference*, Sep. 2001, pp. 39-43.

Morgenshtein et al, "Gate-Diffusion Input (GDI): A Power Eficient Method for Digital Combinatorial Circuits", *IEEE Trans. VLSD Systems*, 10(5):566-581, Oct. 2002.

Morgenshtein et al, "Asynchronous exagerate Gate-Diffusion Input (GDI) Circuits", *ISCAS 2002 IEEE International Symposium on Circuits and Systems*, May 2002, pp. 1-8.

David et al, "An Efficient Implementation of Boolean Functions as Self-Timed Circuits", *IEEE Trans. On Computers*, 41(1):2-11, 1992.

Alidina et al, "Precomputation-Based Sequential Logic Optimization for Low Power", *IEEE Trans. VLSD Systems*, 2(4):426-436, 1994.

Zimmerman et al, "Low-Power Logic Styles: CMOS Versus Pass-Transistor Logic", *IEEE J. Solid-State Circuits*, 32(7):1079-1090, 1997.

Yano et al, "Top-Down Pass-Transistor Logic Design", *IEEE J. Solid-State Circuits*, 31(6):792-803, 1996.

Chandrakasan et al, "Low-Power CMOS Digital Design", *IEEE J. Solid-State Circuits*, 27(4):473-484, 1992.

* cited by examiner

Out=$\overline{F}$P+FN=$\overline{(AB+C)}$P+(AB+C)N

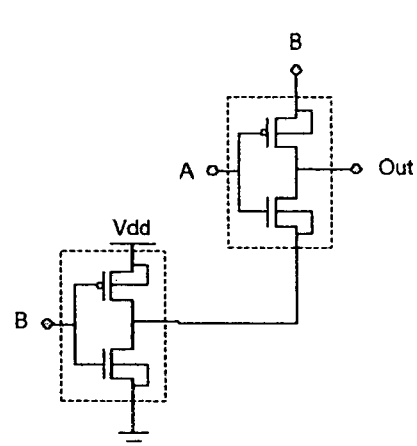
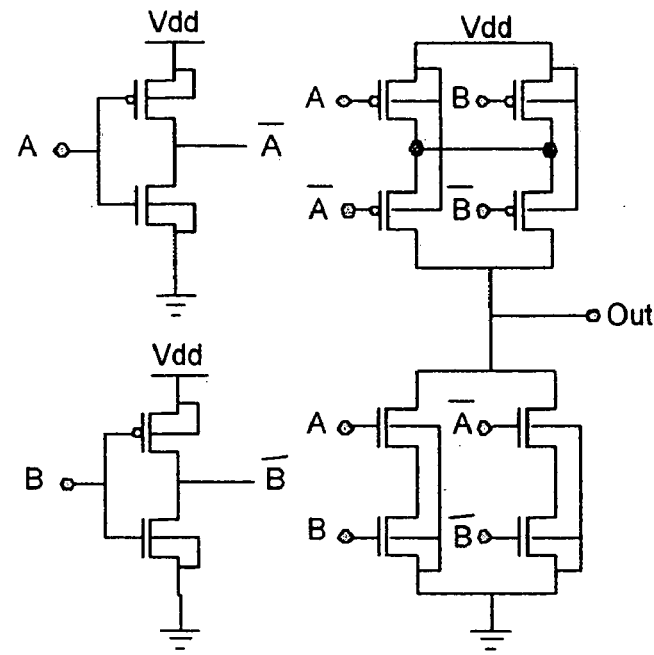
GDI
4 transistors
CMOS – Prior art
12 transistors
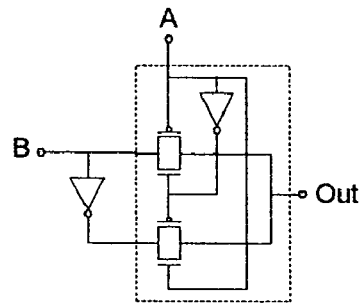
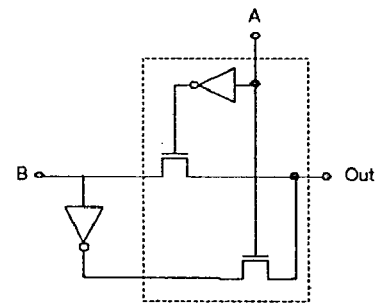
TG – Prior art
8 transistors
N-PG – Prior art
6 transistors
XOR gate
Fig. 18a

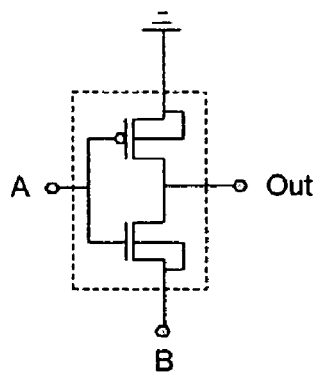
GDI
2 transistors
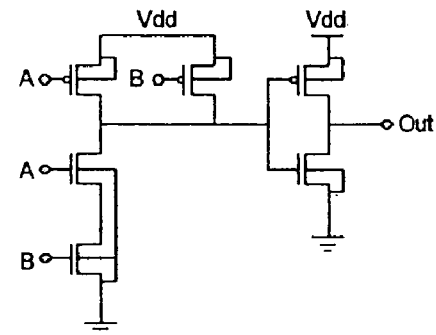
CMOS - Prior art
6 transistors
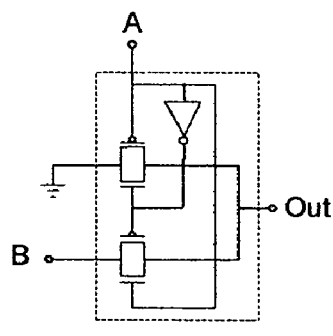
TG - Prior art
6 transistors
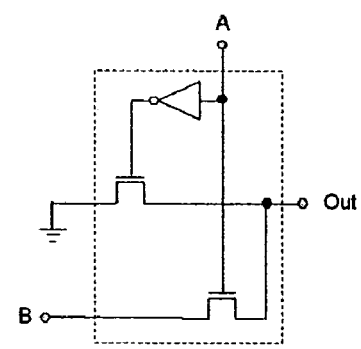
N-PG - Prior art
4 transistors
AND gate
Fig. 18b

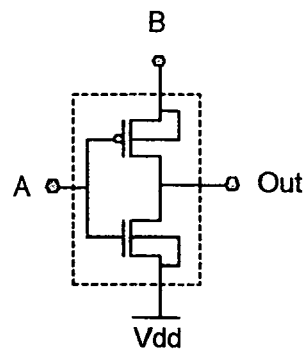
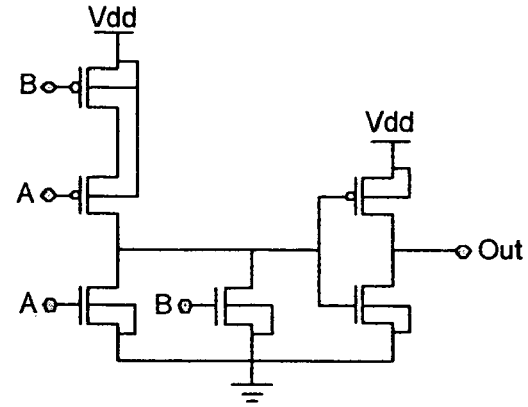
GDI
2 transistors
CMOS - Prior art
6 transistors
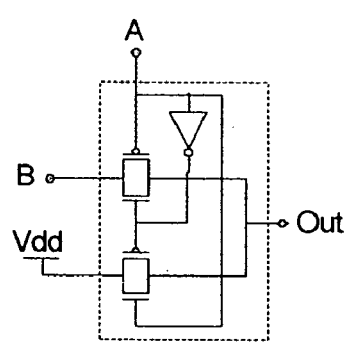
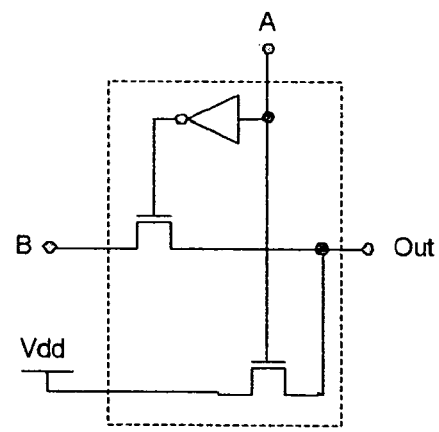
TG - Prior art
6 transistors
N-PG - Prior art
4 transistors
OR gate
Fig. 18c

| Fig. 19a |
| Fig. 19b |
| Fig. 19c |
| Fig. 19d |
| Fig. 19e |
| Fig. 19f |

XOR
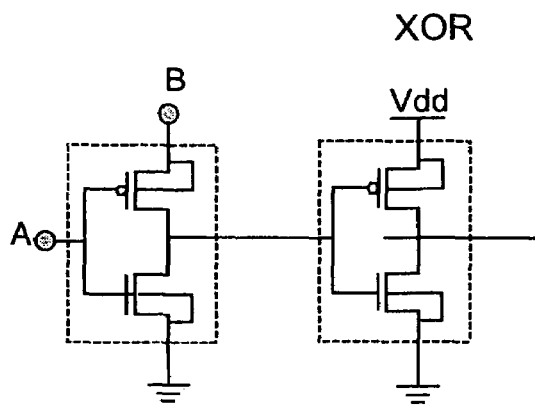
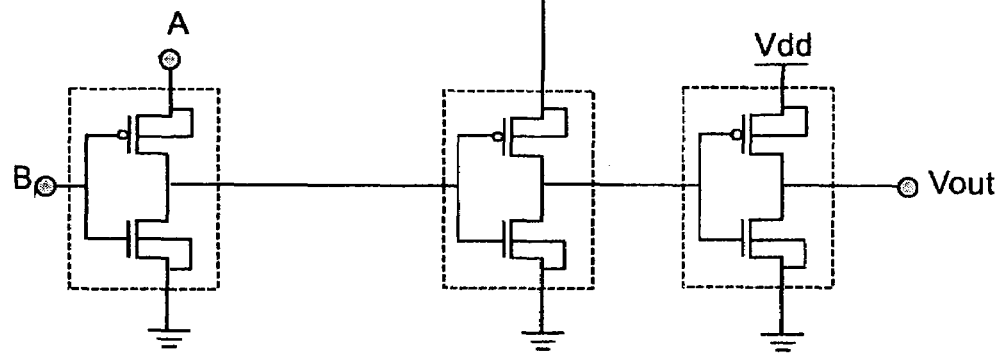
Fig. 20a
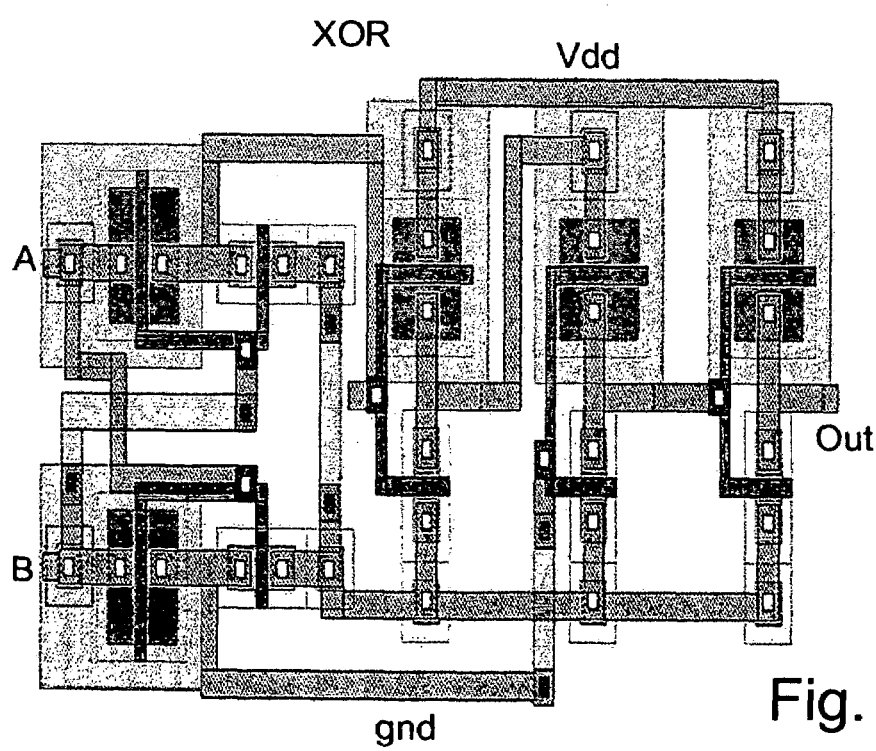
Fig. 20b

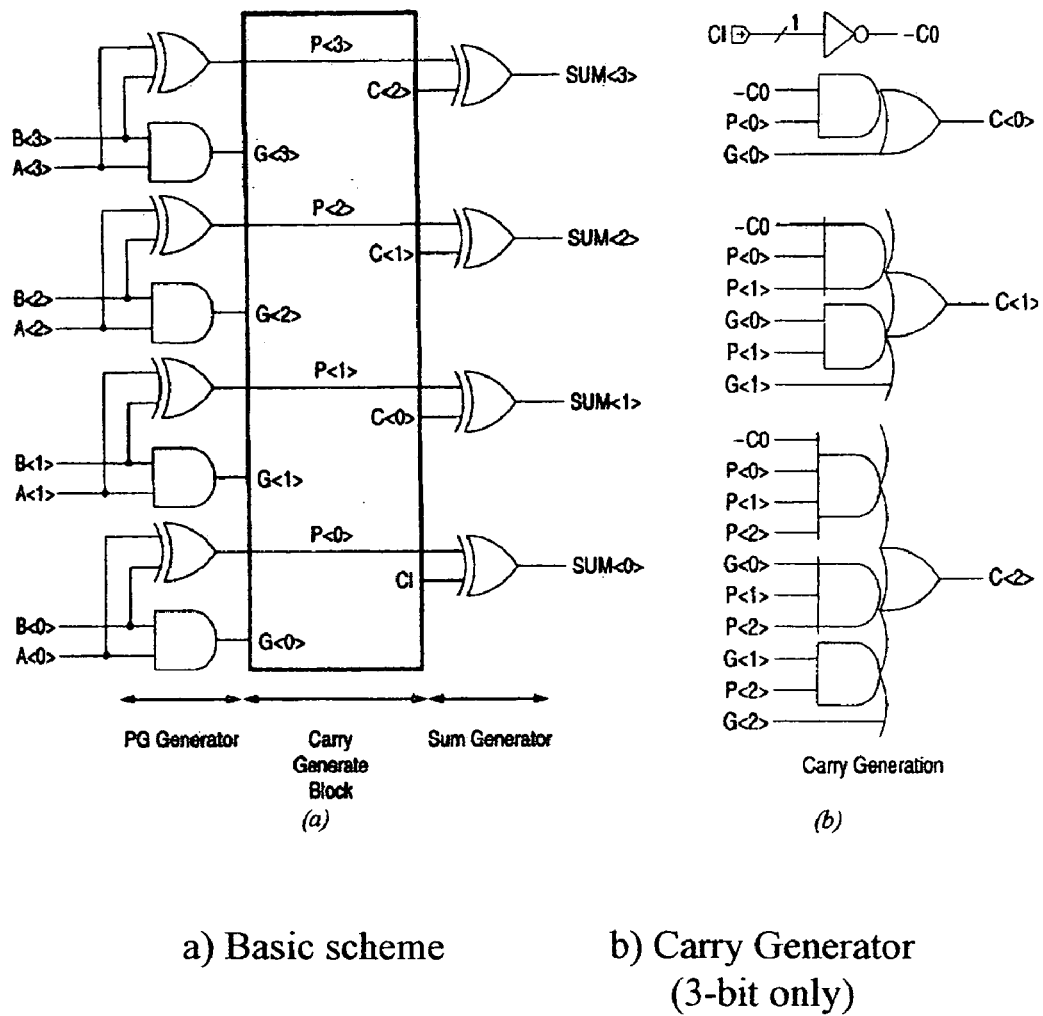
a) Basic scheme   b) Carry Generator (3-bit only)
Fig. 21 – Prior art

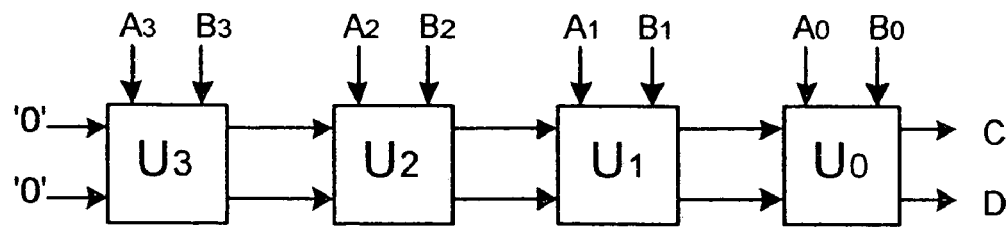
Fig. 22 – Prior art
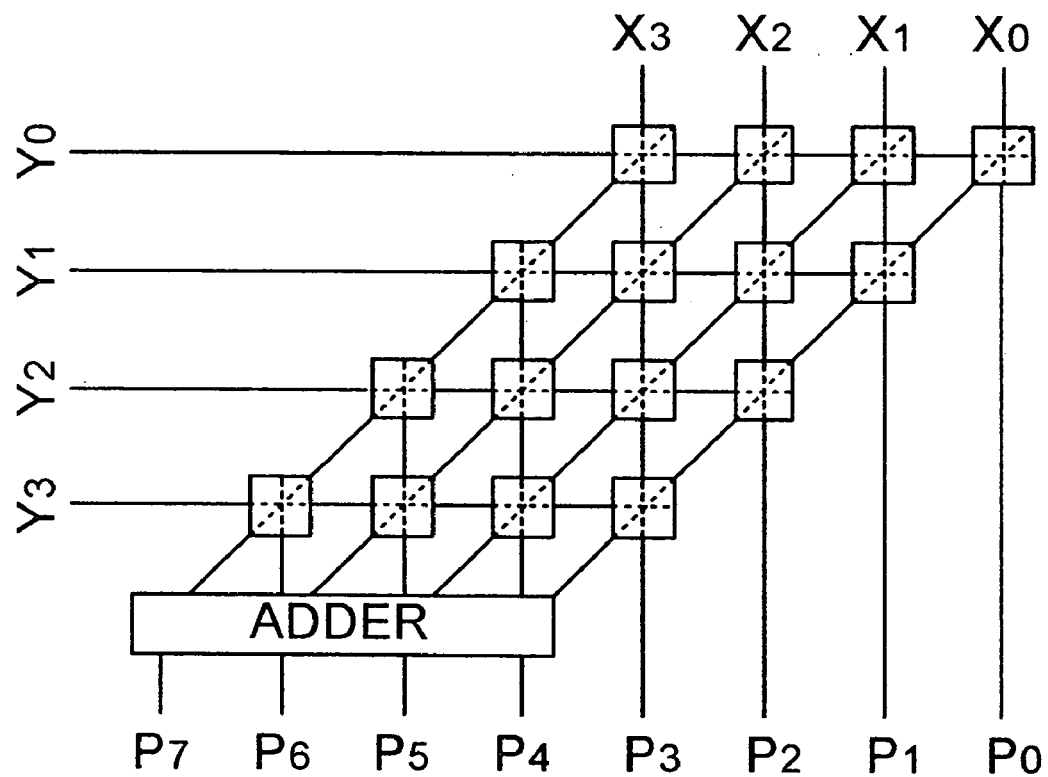
Fig. 23 – Prior art

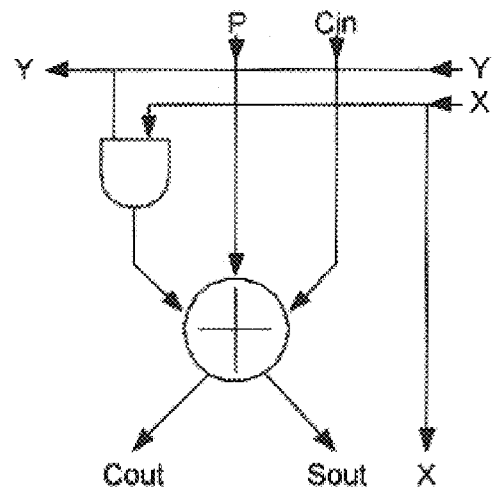
Fig. 24 – Prior art
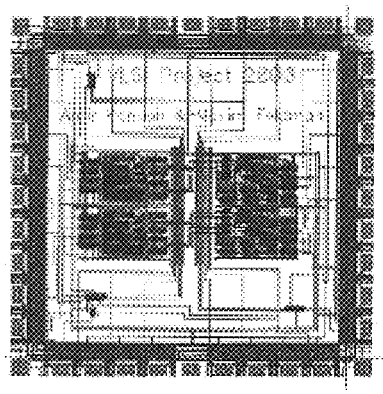 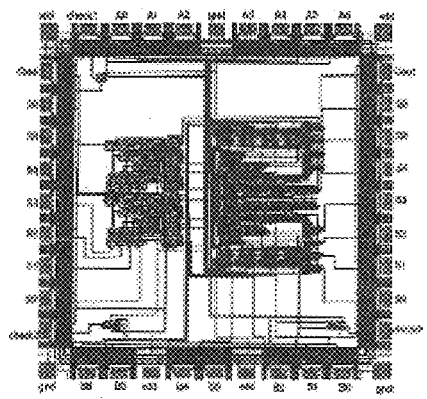
a) GDI and prior art CMOS    b) GDI and prior art TG
Fig. 25

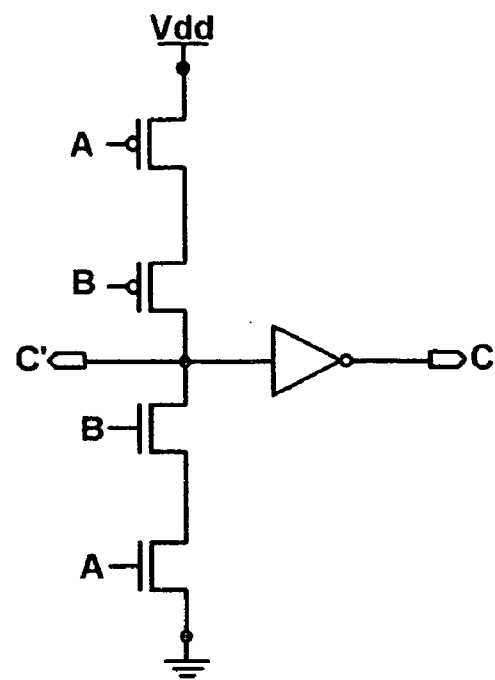
Fig. 33a - Prior art
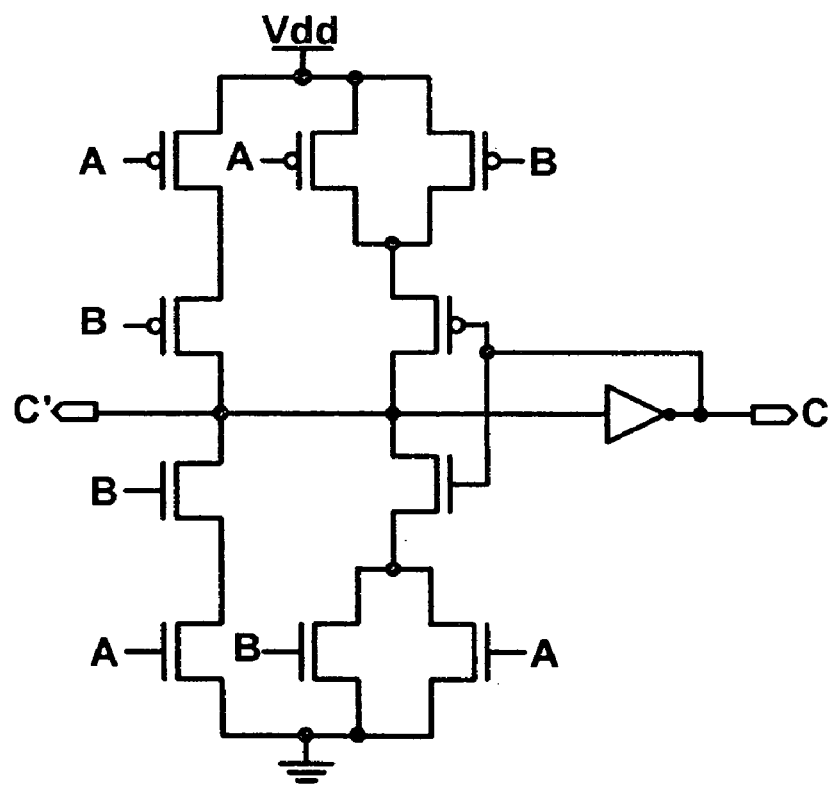
Fig. 33b - Prior art

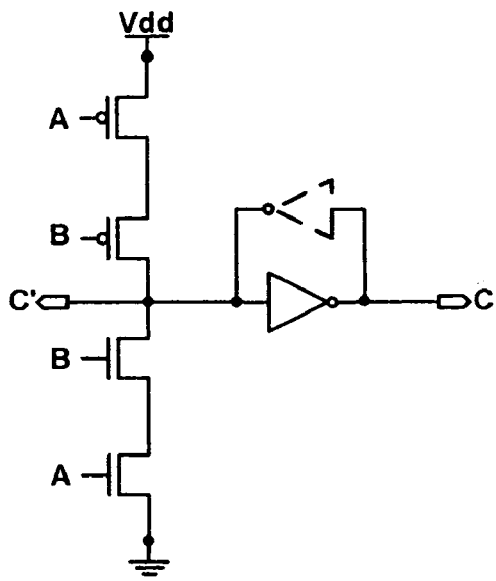
Fig. 33c - Prior art
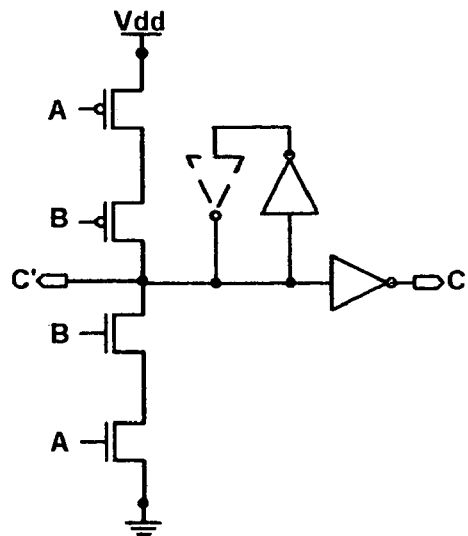
Fig. 33d - Prior art
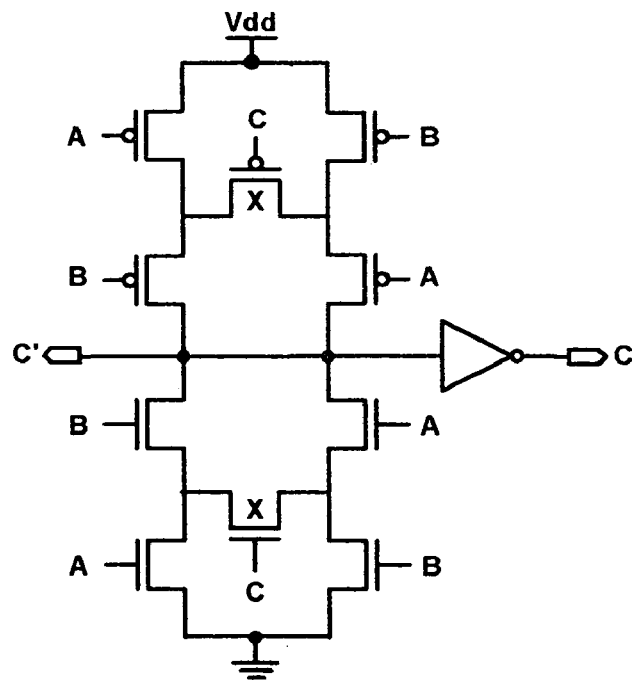
Fig. 33e - Prior art

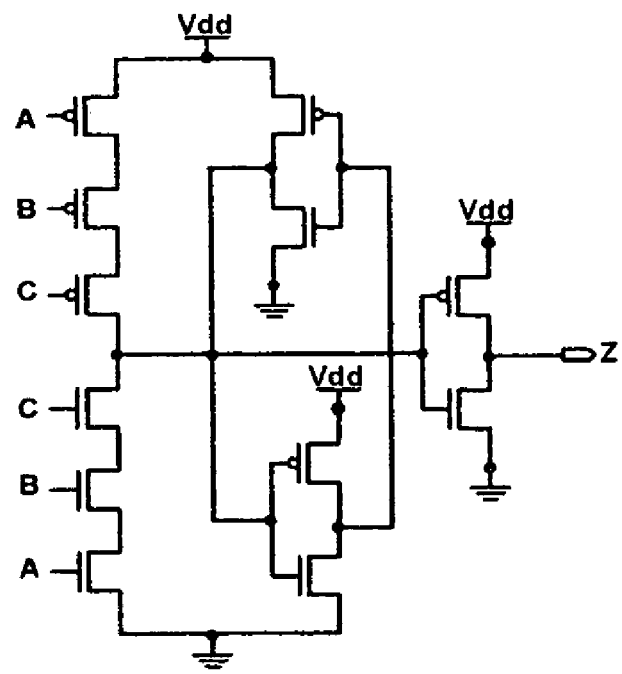
Fig. 35a CMOS – Prior art
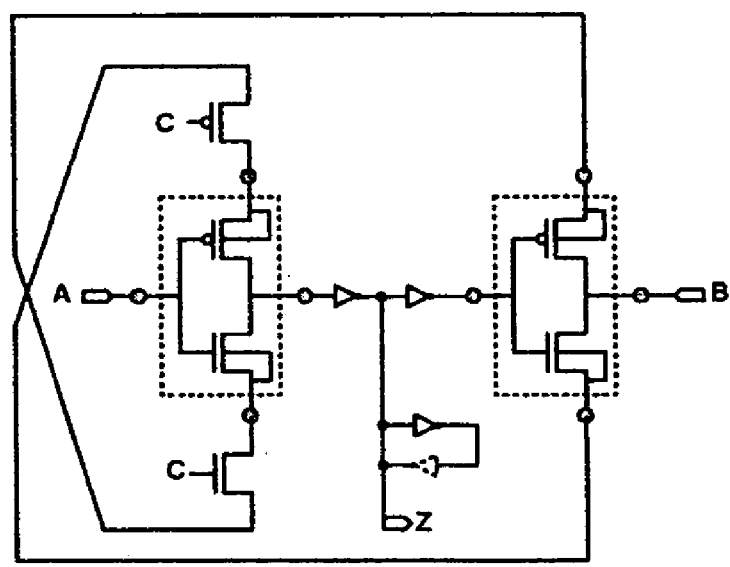
Fig. 35b GDI

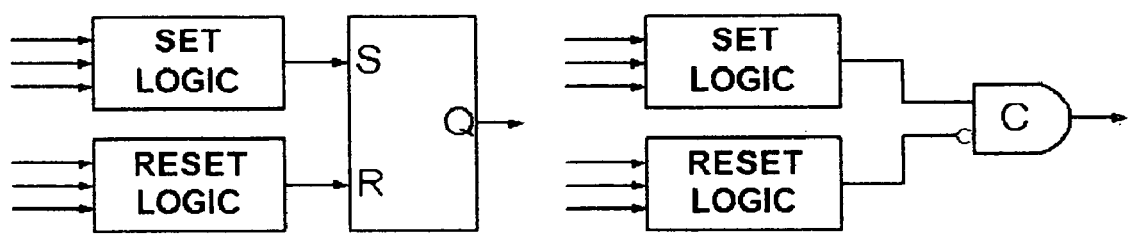
Fig. 36 – Prior art

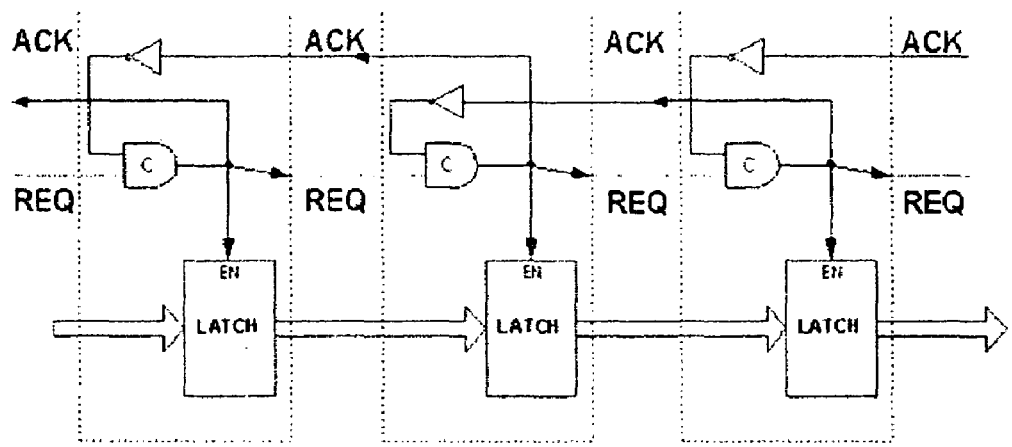
Fig. 38 – Prior art
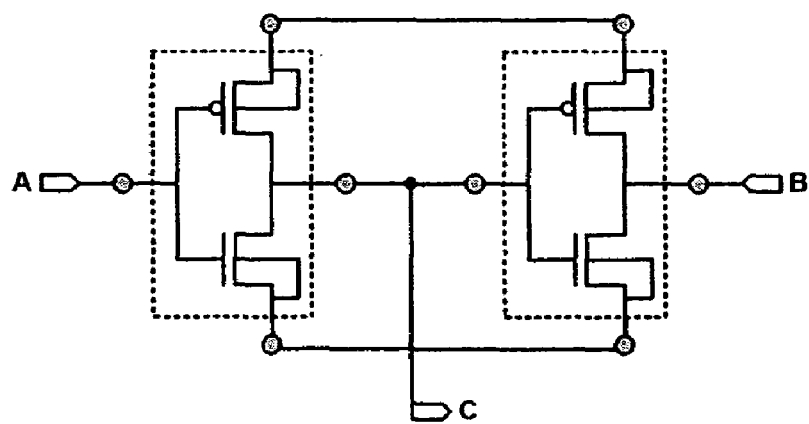
Fig. 39

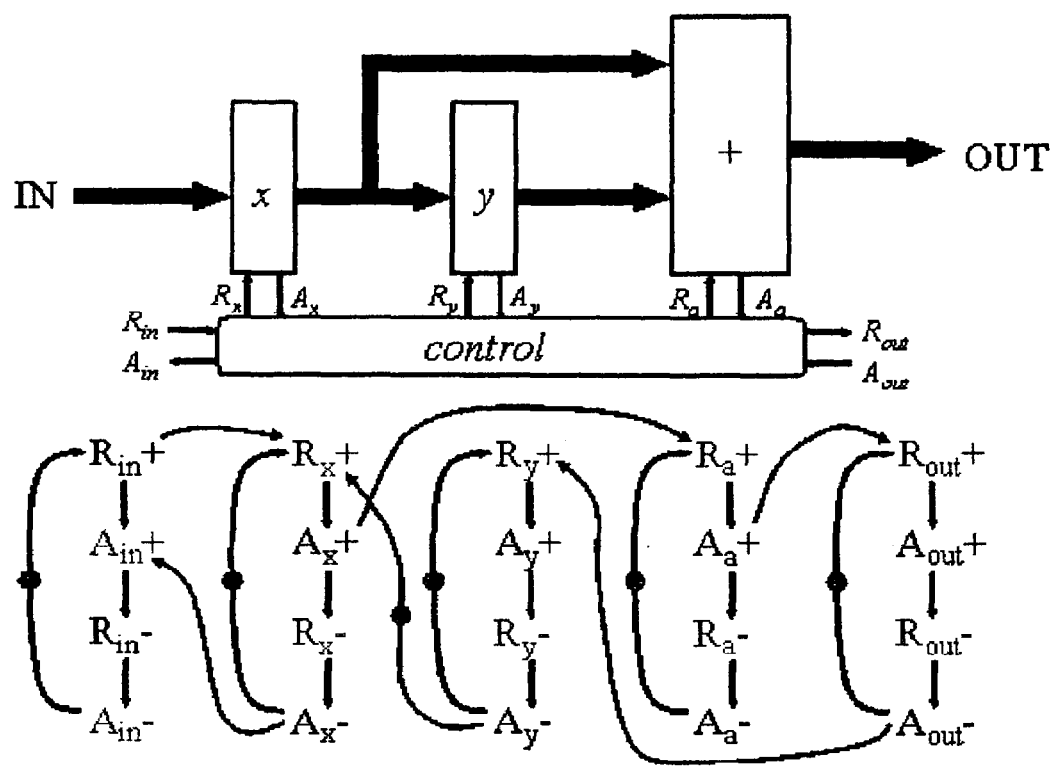
Fig. 42 – Prior art

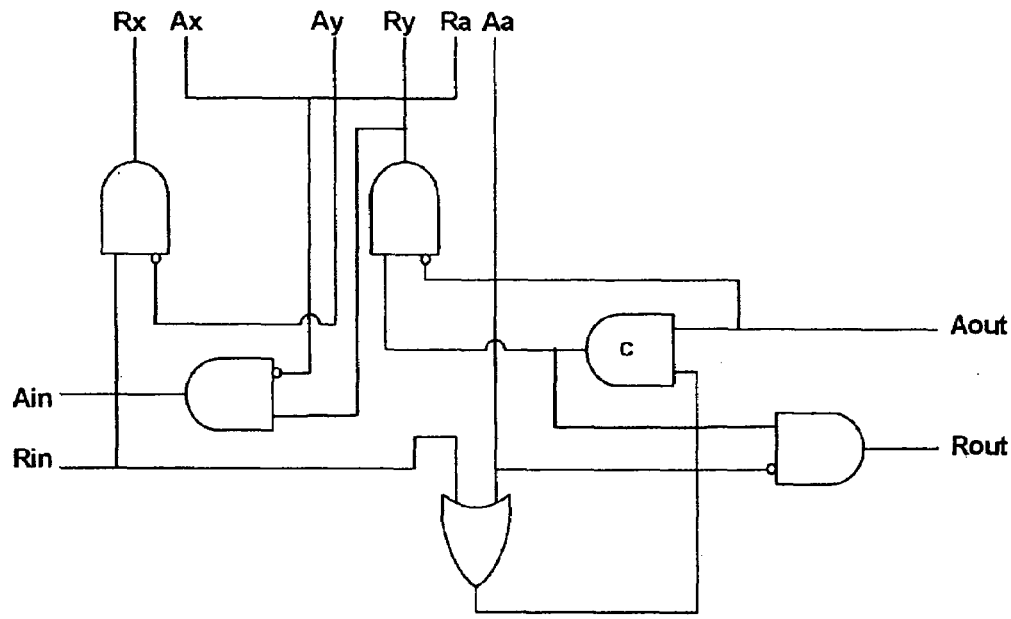
Fig. 43a – Prior art
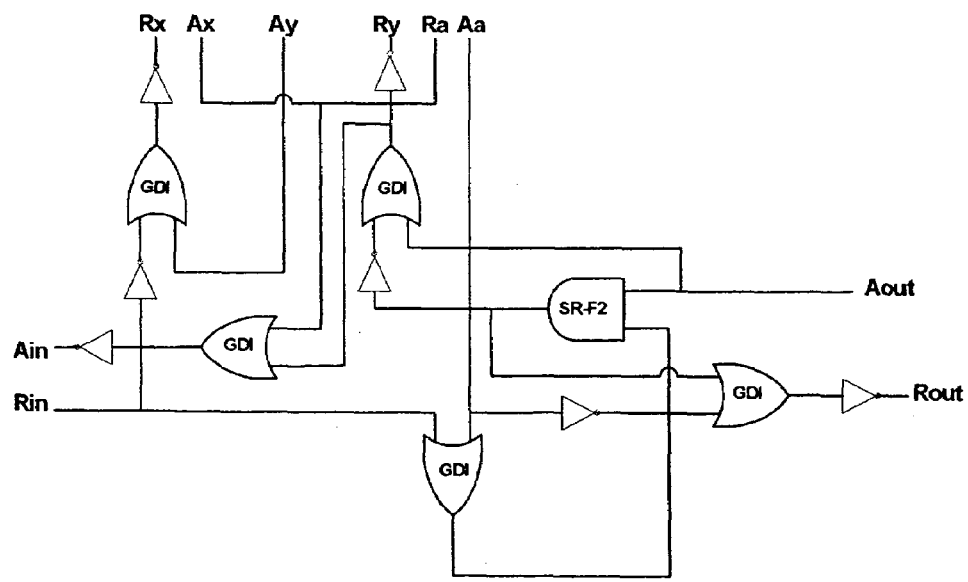
Fig. 43b – Prior art

Fig. 45 – Prior art

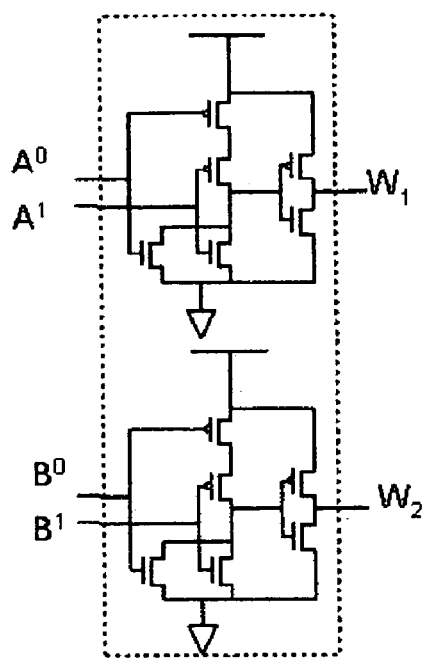 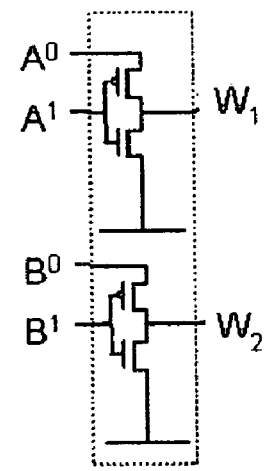
CMOS - Prior art    GDI
Fig. 46

CMOS - Prior art  GDI

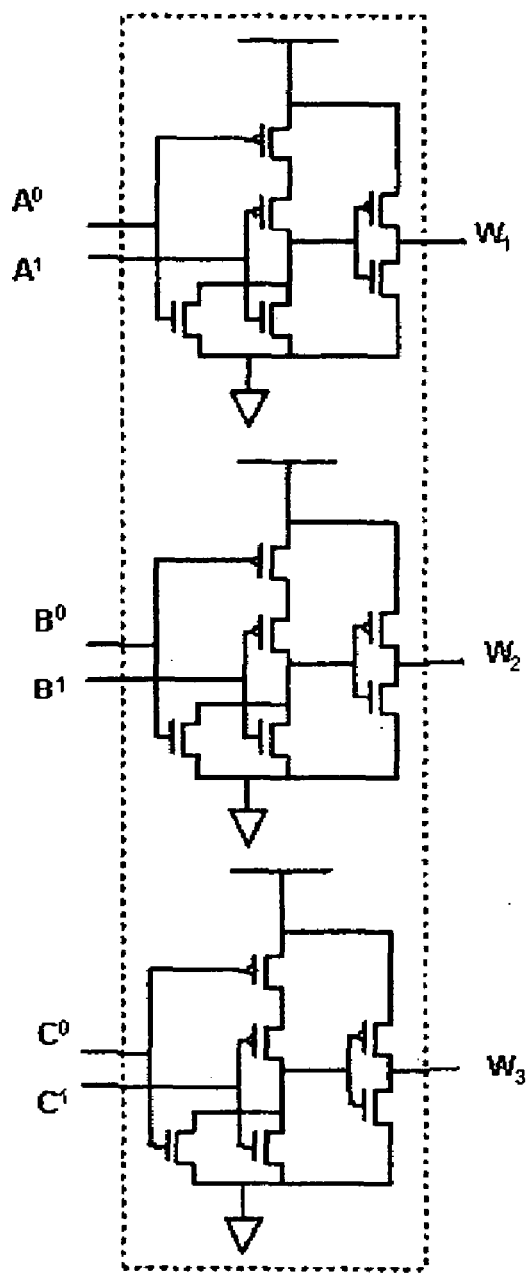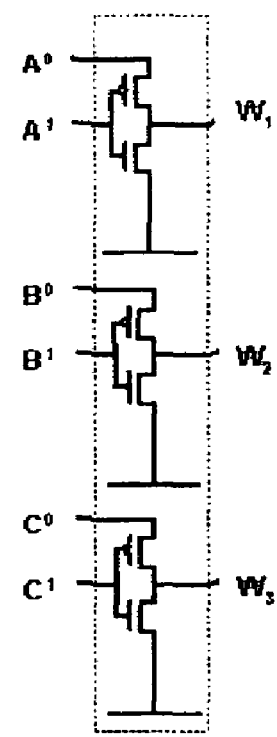
CMOS - Prior art     GDI
Fig. 50

Fig. 51 – Prior art

LOGIC CIRCUIT AND METHOD OF LOGIC CIRCUIT DESIGN

This application claims the benefit of U.S. Provisional Application Ser. No. 60/406,751, filed Aug. 29, 2002, which is herein incorporated by reference for all intents and purposes.

FIELD AND BACKGROUND OF THE INVENTION

The present invention relates to a logic circuit design and, more particularly, to a logic circuit design for combinatorial and asynchronous logic circuits.

A large body of research has been performed to develop and improve traditional Complementary Metal Oxide Semiconductor (CMOS) techniques for the production of integrated circuits (ICs). The object of this research is to develop a faster, lower power, and reduced area alternative to standard CMOS logic circuits (see A. P. Chandrakasan, S. Sheng, R. W. Brodersen, "Low-Power CMOS Digital Design", IEEE Journal of Solid-State Circuits, vol. 27, no. 4, pp. 473-484, April 1992, and in A. P. Chandrakasan, R. W. Brodersen, "Minimizing Power Consumption in Digital CMOS Circuits", Proceedings of the IEEE, vol. 83, no. 4, pp. 498-523, April 1995.) This research has resulted in the development of many logic design techniques during the last two decades. One popular alternative to CMOS is pass-transistor logic (PTL).

Formal methods for deriving pass-transistor logic are known for Negative-channel Metal Oxide Semiconductor (NMOS) transistors. The logic circuits resulting from these known methods yield an NMOS PTL logic circuit having a set of control signals applied to the gates of NMOS transistors, and a set of data signals applied to the sources of the n-transistors. Many PTL circuit implementations have been proposed in the literature (see also W. Al-Assadi, A. P. Jayasumana and Y. K. Malaiya, "Pass-transistor logic design", International Journal of Electronics, 1991, vol. 70, no. 4, pp. 739-749, K. Yano, Y. Sasaki, K. Rikino, K. Seki. "Top-Down Pass-Transistor Logic Design", IEEE Journal of Solid-State Circuits, vol. 31, no. 6, pp. 792-803, June 1996, R. Zimmermann, W. Fichtner, "Low-Power Logic Styles: CMOS Versus Pass-Transistor Logic", IEEE Journal of Solid-State Circuits, vol. 32, no. 7, pp. 1079-1090, June 1997, and K. Bernstein, L. M. Carrig, C. M. Durham and P. A. Hansen, "High Speed CMOS Design Styles", Kluwer Academic Press, 1998, and K. Bernstein, L. M. Carrig, C. M. Durham and P. A. Hansen, "High Speed CMOS Design Styles", Kluwer Academic Press, 1998).

Some of the main advantages of PTL over standard CMOS design are: high speed due to the small node capacitances; low power dissipation as a result of the reduced number of transistors; and lower interconnection effects due to a small area.

Most PTL implementations, however, have two basic problems. First, the threshold drop across the single-channel pass transistors results in reduced current drive and hence slower operation at reduced supply voltages. This drop is particularly important for low power design since it is desirable to operate at the lowest possible voltage level. Second, since the input voltage for a high logic level at the regenerative inverters is not $V_{DD}$, the PMOS device in the inverter is not fully turned off, and hence direct-path static power dissipation can be significant.

There are many PTL techniques that attempt to solve the problems mentioned above. Some of them are: Transmission Gate CMOS (TG), Complementary Pass-transistor Logic (CPL), and Double Pass-transistor Logic (DPL). TG uses transmission gate logic to realize complex logic functions using a small number of complementary transistors. TG solves the problem of low logic level swing by using PMOS as well as NMOS transistors. CPL features complementary inputs/outputs using NMOS pass-transistor logic with CMOS output inverters. CPL's most important feature is the small stack height and the internal node low swing, which contribute to lowering the power consumption. The CPL technique suffers from static power consumption due to the low swing at the gates of the output inverters. To lower the power consumption of CPL circuits, latched complementary pass-transistor logic (LCPL) and swing restored pass-transistor logic (SRPL) circuit styles are used. These styles contain PMOS restoration transistors or cross-coupled inverters respectively. DPL uses complementary transistors to keep full swing operation and reduce the DC power consumption, eliminating the need for restoration circuitry. One disadvantage of DPL is the large area required by the presence of PMOS transistors.

An additional problem of existing PTL is the top-down logic design complexity, which prevents the pass-transistors from capturing a major role in real logic large-scale integration technology (LSI). One of the main reasons for this is that no simple and universal cell library is available for PTL based design. Not all variations of input values to a basic PTL cell produce well-defined logic values. This creates difficulties in the development of automatic design systems for PTL logic, and in the verification of PTL logic circuit performance.

Asynchronous logic design has been established as a competitive alternative to synchronous circuits thanks to the potential for high-speed, low-power, reduced electromagnetic interference, and timing modularity (see J. Sparsø and S. Furber (eds.), Principles of asynchronous circuit design—A systems perspective, Kluwer Academic Publishers, 2001). Asynchronous logic has been developed in the last decade to deal with the challenges posed by the progress of very large-scale integration (VLSI) technologies, together with the increasing number of gates on chip, high density, and GHz operation frequencies. These problems are expected to appear in future high-performance technologies operating at the 10 GHz barrier, due to the increased influence of interconnect on signal delay, uncertainty in the delay of a given gate, and on-chip parameter variations. These factors create difficulties in the design of fast digital systems controlled by a single general clock, due to considerations of delay skew between distant logic blocks, as well as the complexity of design of structures controlled by multiple clocks.

Asynchronous design provides digital systems based on self-timed circuits, which demand no control of a general clock, along with fast communication protocols in which speed depends only on the self delay of the logic gates. The absence of a general clock contributes to low power operation, by eliminating the concentrated power consumption of certain chip areas where numerous transactions occur with arrival of each clock signal.

However, these desirable characteristics usually come at a cost of either silicon area, or speed, or power, and cannot be achieved all at once. Furthermore, asynchronous circuits are typically more complicated than their synchronous counterparts. Although many researchers have sought efficient asynchronous circuit implementations, the disadvantages of current asynchronous logic techniques have not yet been overcome.

There is thus a widely recognized need for, and it would be highly advantageous to have, a digital logic circuit devoid of the above limitations.

SUMMARY OF THE INVENTION

According to a first aspect of the present invention there is provided a complementary logic circuit containing a first logic input, a second logic input, a first dedicated logic terminal, a second dedicated logic terminal, a first logic block, and a second logic block. The first logic block consists of a network of p-type transistors for implementing a predetermined logic function. The p-type transistor network has an outer diffusion connection, a first network gate connection, and an inner diffusion connection. The outer diffusion connection of the p-type transistor network is connected to the first dedicated logic terminal, and the first network gate connection of the p-type transistor network is connected to the first logic input. The second logic block consists of a network of n-type transistors which implements a logic function complementary to the logic function implemented by the first logic block. The n-type transistor network has an outer diffusion connection, a first network gate connection, and an inner diffusion connection. The outer diffusion connection of the n-type transistor network is connected to the second dedicated logic terminal, and the first network gate connection of the n-type transistor network is connected to the second logic input. The inner diffusion connections of the p-type network and of the n-type network are connected together to form a common diffusion logic terminal.

Preferably, the first and second logic inputs are connected to form a first common logic input.

Preferably, each of the logic terminals is separately configurable to serve as a logic input.

Preferably, each of the logic terminals is separately configurable to serve as a logic output.

Preferably, the logic circuit further contains a third logic input connected to a second network gate connection of the p-type transistor network.

Preferably, the logic circuit further contains a fourth logic input connected to a second network gate connection of the n-type transistor network.

Preferably, the third and fourth logic inputs are connected to form a second common logic input.

Preferably, the p-type transistor network comprises a single p-type transistor.

Preferably, the n-type transistor network comprises a single n-type transistor.

Preferably, the network of p-type transistors comprises one of a group of networks comprising: a network of p-type field effect transistors (FET), a network of p-type p-well complementary metal-oxide semiconductor (CMOS) transistors, a network of p-type n-well complementary metal-oxide semiconductor (CMOS) transistors, a network of p-type twin-well complementary metal-oxide semiconductor (CMOS) transistors, a network of p-type silicon on insulator (SOI) transistors, and a network of p-type silicon on sapphire (SOS) transistors.

Preferably, the network of n-type transistors comprises one of a group of networks comprising: a network of n-type FETs, a network of n-type p-well CMOS transistors, a network of n-type n-well CMOS transistors, a network of n-type twin-well CMOS transistors, a network of n-type SOI transistors, and a network of n-type SOS transistors.

Preferably, the logic circuit comprises one of a group of the following logic circuits: an OR gate, an inverted OR (NOR) gate, an AND gate, a multiplexer gate, an inverter gate, and an exclusive OR (XOR) gate.

Preferably, the logic circuit is operable to implement a ((NOT A) OR B) logic operation upon logic inputs A and B.

Preferably, the logic circuit is operable to implement a ((NOT A) AND B) logic operation upon logic inputs A and B.

According to a second aspect of the present invention there is provided a logic circuit consisting of interconnected logic elements. Each of the logic elements contains a first logic input, a second logic input, a first dedicated logic terminal, a second dedicated logic terminal, a p-type transistor having an outer diffusion connection, a gate connection, and an inner diffusion connection, and an n-type transistor having an outer diffusion connection, a gate connection, and an inner diffusion connection. The outer diffusion connection of the p-type transistor is connected to the first dedicated logic terminal, and the gate connection of the p-type transistor is connected to the first logic input. The outer diffusion connection of the n-type transistor is connected to the second dedicated logic terminal, and the gate connection of the n-type transistor network is connected to the second logic input. The inner diffusion connections of the p-type and the n-type transistors are connected together to form a common diffusion logic terminal.

Preferably, for each of logic elements the first and second logic inputs are connected to form a common logic input.

Preferably, for each of logic elements each of the logic terminals is separately configurable to serve as a logic input.

Preferably, for each of logic elements each of the logic terminals is separately configurable to serve as a logic output.

Preferably, the type of the p-type transistors comprises one of a group of transistor types comprising: p-type FET transistors, p-type p-well CMOS transistors, p-type n-well CMOS transistors, p-type twin-well CMOS transistors, p-type SOI transistors, and p-type SOS transistors.

Preferably, the type of n-type transistors comprises one of a group of transistor types comprising: n-type FET transistors, n-type p-well CMOS transistors, n-type n-well CMOS transistors, n-type twin-well CMOS transistors, n-type SOI transistors, and n-type SOS transistors.

Preferably, the logic circuit is one of a group of logic circuits including: an OR gate, an inverted OR (NOR) gate, an AND gate, a multiplexer gate, an inverter gate, and an exclusive OR (XOR) gate.

Preferably, the logic circuit is operable to implement a ((NOT A) OR B) logic operation upon logic inputs A and B.

Preferably, the logic circuit is operable to implement a ((NOT A) AND B) logic operation upon logic inputs A and B.

Preferably, the logic circuit further contains at least one stabilizing buffer element.

Preferably, the logic circuit further contains at least one inverter.

Preferably, the logic circuit comprises a C-element.

Preferably, the logic circuit comprises a latch.

Preferably, the logic circuit is one of a group of logic circuits including: an SR latch, a D latch, a T latch, and a toggle flip-flop (TFF).

Preferably, the logic circuit comprises a bundle data filter controller.

Preferably, the logic circuit comprises a one to two decoder.

Preferably, the logic circuit is one of a group of logic circuits including: a carry-lookahead adder (CLA), a ripple adder, a combined ripple-CLA adder, a ripple comparator, a multiplier, and a counter.

According to a third aspect of the present invention there is provided a logic circuit, consisting of interconnected logic elements. Each of the logic elements contains a first logic input, a second logic input, a first dedicated logic terminal, a second dedicated logic terminal, a first logic block, and a second logic block. The first logic block consists of a network of p-type transistors for implementing a predetermined logic function. The p-type transistor network has an outer diffusion connection, a first network gate connection, and an inner diffusion connection. The outer diffusion connection of the p-type transistor network is connected to the first dedicated logic terminal, and the first network gate connection of the p-type transistor network is connected to the first logic input. The second logic block consists of a network of n-type transistors which implements a logic function complementary to the logic function implemented by the first logic block. The n-type transistor network has an outer diffusion connection, a first network gate connection, and an inner diffusion connection. The outer diffusion connection of the n-type transistor network is connected to the second dedicated logic terminal, and the first network gate connection of the n-type transistor network is connected to the second logic input. The inner diffusion connections of the p-type network and of the n-type network are connected together to form a common diffusion logic terminal.

Preferably, for each of the logic elements the first and second logic inputs are connected to form a first common logic input.

Preferably, for each of the logic elements each of the logic terminals is separately configurable to serve as a logic input.

Preferably, for each of the logic elements each of the logic terminals is separately configurable to serve as a logic output.

Preferably, the logic circuit further contains a third logic input connected to a second network gate connection of the p-type transistor network.

Preferably, the logic circuit further contains a fourth logic input connected to a second network gate connection of the n-type transistor network.

Preferably, the third and fourth logic inputs are connected to form a second common logic input.

Preferably, the p-type transistor network comprises a single p-type transistor.

Preferably, the n-type transistor network comprises a single n-type transistor.

Preferably, the network of p-type transistors comprises one of a group of networks comprising: a network of p-type field effect transistors (FET), a network of p-type p-well complementary metal-oxide semiconductor (CMOS) transistors, a network of p-type n-well complementary metal-oxide semiconductor (CMOS) transistors, a network of p-type twin-well complementary metal-oxide semiconductor (CMOS) transistors, a network of p-type silicon on insulator (SOI) transistors, and a network of p-type silicon on sapphire (SOS) transistors.

Preferably, the network of n-type transistors comprises one of a group of networks comprising: a network of n-type FETs, a network of n-type p-well CMOS transistors, a network of n-type n-well CMOS transistors, a network of n-type twin-well CMOS transistors, a network of n-type SOI transistors, and a network of n-type SOS transistors.

Preferably, the logic circuit further contains at least one buffer element.

Preferably, the logic circuit further contains at least one inverter.

According to a fourth aspect of the present invention there is provided a method for designing a logic circuit for performing a given logic function. The logic circuit to be constructed from interconnected logic elements. Each of the logic elements contains a first logic input, a second logic input, a first dedicated logic terminal, a second dedicated logic terminal, a p-type transistor having an outer diffusion connection, a gate connection, and an inner diffusion connection, and an n-type transistor having an outer diffusion connection, a gate connection, and an inner diffusion connection. The outer diffusion connection of the p-type transistor is connected to the first dedicated logic terminal, and the gate connection of the p-type transistor is connected to the first logic input. The outer diffusion connection of the n-type transistor is connected to the second dedicated logic terminal, and the gate connection of the n-type transistor network is connected to the second logic input. The inner diffusion connections of the p-type and the n-type transistors are connected together to form a common diffusion logic terminal. The method is performed by setting a synthesized function equal to the given logic function, and performing a synthesis recursion cycle. The synthesis recursion cycle consists of the following steps: if the synthesized function comprises a single non-inverted logic variable, providing a logic circuit design comprising an input terminal for the non-inverted logic variable and discontinuing the synthesis recursion cycle; if the synthesized function comprises a high logic signal, providing a logic circuit design comprising a connection to a high logic level, and discontinuing the synthesis recursion cycle; if the synthesized function comprises a low logic signal, providing a logic circuit design comprising a connection to a low logic level, and discontinuing the synthesis recursion cycle; and if the synthesized function comprises either an inverted single variable or a multi-variable function, performing the following sequence of steps. The sequence of steps is: extracting a first logic function, and a second logic function from a Shannon expansion of the synthesized function for a selected logic variable; setting the synthesized function to the first logic function; performing a synthesis recursion cycle to obtain a circuit design for a first sub-circuit; setting the synthesized function to the second logic function; performing a synthesis recursion cycle to obtain a circuit design for a second sub-circuit; providing a logic circuit design comprising a logic element having an input terminal for the selected logic variable at a common terminal of a logic element, an output of the first sub-circuit connected to the first dedicated logic terminal of the logic element, an output of the second sub-circuit connected to the second dedicated logic terminal of the logic element, and a circuit output at the common diffusion logic terminal of the logic element; and discontinuing the synthesis recursion cycle.

Preferably, extracting a first logic function, and a second logic function from a Shannon expansion of the synthesized function for a selected logic variable consists of: extracting the first logic function from the synthesized function by setting the selected variable to a logic high in the synthesized function; and extracting the second logic function from the synthesized function by setting the selected variable to a logic low in the synthesized function.

Preferably, the method contains the further step of adding a buffer to the circuit design to provide stabilization for a logic signal.

Preferably, the method contains the further step of adding an inverter to the circuit design to provide stabilization for a logic signal.

According to a fifth aspect of the present invention there is provided a method for providing a logic circuit. Each of the logic elements contains a first logic input, a second logic input, a first dedicated logic terminal, a second dedicated logic terminal, a p-type transistor having an outer diffusion connection, a gate connection, and an inner diffusion connection, and an n-type transistor having an outer diffusion connection, a gate connection, and an inner diffusion connection. The outer diffusion connection of the p-type transistor is connected to the first dedicated logic terminal, and the gate connection of the p-type transistor is connected to the first logic input. The outer diffusion connection of the n-type transistor is connected to the second dedicated logic terminal, and the gate connection of the n-type transistor network is connected to the second logic input. The inner diffusion connections of the p-type and the n-type transistors are connected together to form a common diffusion logic terminal. First a logic circuit design is obtained by setting a synthesized function equal to the required logic function, and performing a synthesis recursion cycle. The synthesis recursion cycle consists of the following steps: if the synthesized function comprises a single non-inverted logic variable, providing a logic circuit design comprising an input terminal for the non-inverted logic variable and discontinuing the synthesis recursion cycle; if the synthesized function comprises a high logic signal, providing a logic circuit design comprising a connection to a high logic level, and discontinuing the synthesis recursion cycle; if the synthesized function comprises a low logic signal, providing a logic circuit design comprising a connection to a low logic level, and discontinuing the synthesis recursion cycle; and if the synthesized function comprises either an inverted single variable or a multi-variable function, performing the following sequence of steps. The sequence of steps is: extracting a first logic function, and a second logic function from a Shannon expansion of the synthesized function for a selected logic variable; setting the synthesized function to the first logic function; performing a synthesis recursion cycle to obtain a circuit design for a first sub-circuit; setting the synthesized function to the second logic function; performing a synthesis recursion cycle to obtain a circuit design for a second sub-circuit; providing a logic circuit design comprising a logic element having an input terminal for the selected logic variable at a common terminal of a logic element, an output of the first sub-circuit connected to the first dedicated logic terminal of the logic element, an output of the second sub-circuit connected to the second dedicated logic terminal of the logic element, and a circuit output at the common diffusion logic terminal of the logic element; and discontinuing the synthesis recursion cycle. After obtaining the logic circuit design, the logic elements are connected in accordance with the obtained design.

Preferably, extracting a first logic function, and a second logic function from a Shannon expansion of the synthesized function for a selected logic variable consists of: extracting the first logic function from the synthesized function by setting the selected variable to a logic high in the synthesized function; and extracting the second logic function from the synthesized function by setting the selected variable to a logic low in the synthesized function.

Preferably, the method contains the further step of adding a buffer to the circuit design to provide stabilization for a logic signal.

Preferably, the method contains the further step of adding an inverter to the circuit design to provide stabilization for a logic signal.

The present invention successfully addresses the shortcomings of the presently known configurations by providing a fast and versatile logic circuit, with reduced area and power requirements, and capable of implementing a wide variety of logic functions.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The file of this patent contains at least one drawing executed in color photograph. Copies of this patent with color photograph(s) will be provided by the Patent and Trademark Office upon request and payment of necessary fee.

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 1 is a simplified block diagram of a logic circuit, according to a preferred embodiment of the present invention.

FIG. 2 is a simplified circuit diagram of a Gate Diffusion Input (GDI) logic cell, according to a preferred embodiment of the present invention.

FIG. 3 is a GDI circuit diagram and transient response when a step signal is applied to the outer diffusion node of an NMOS transistor, according to a preferred embodiment of the present invention.

FIG. 4 shows Cadence Spectre simulation results for sub-threshold operation of a GDI AND gate designed according to a preferred embodiment of the present invention.

FIG. 5 is a representation of a GDI cascade circuit designed in accordance with the present invention as an RC tree.

FIG. 6 is a circuit diagram of a GDI inverter along with its equivalent digital model, according to a preferred embodiment of the present invention.

FIG. 7 is a circuit diagram of a prior-art CMOS NAND gate, along with its equivalent digital model.

FIG. 8 is a simplified circuit diagram of a logic cell having separate common logic terminals, according to a preferred embodiment of the present invention.

FIG. 9 is a simplified circuit diagram of a latch based upon the GDI* cell, according to a preferred embodiment of the present invention.

FIGS. 10a-10e are simplified circuit diagrams of GDI based latches, according to a preferred embodiment of the present invention.

FIG. 11 is a simplified block diagram of a multi-transistor GDI logic circuit, according to a preferred embodiment of the present invention.

Figure 12:
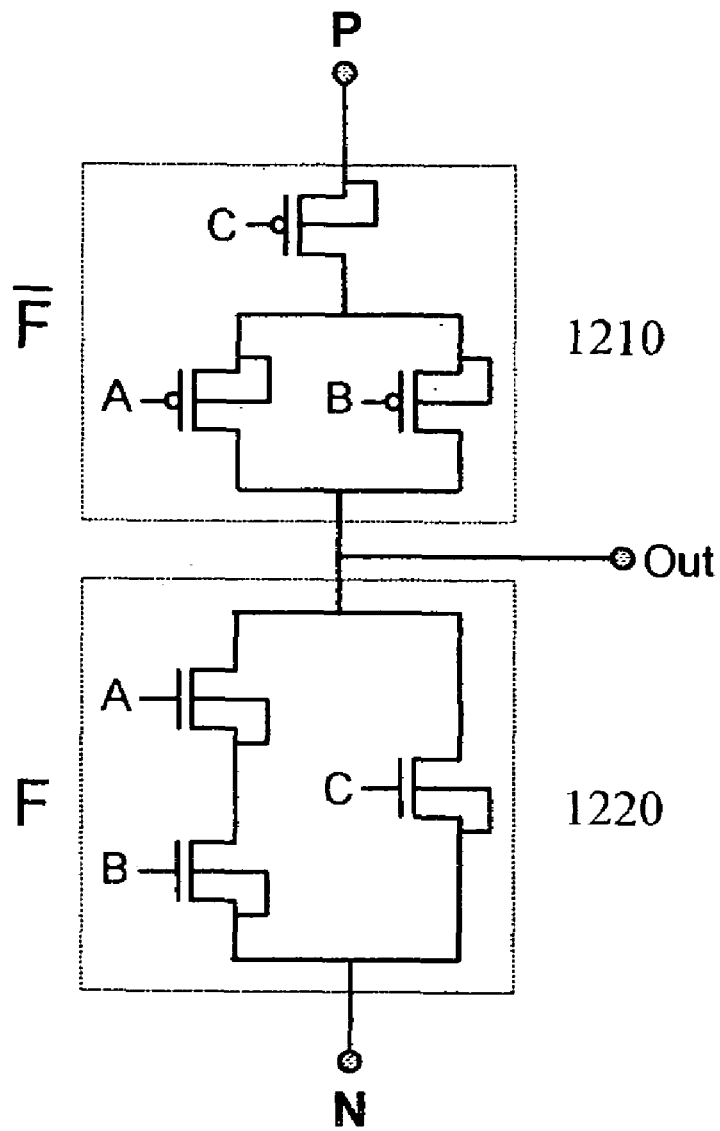

FIG. 12 shows a 3-input CMOS structure and the corresponding 5-input GDI cell.

Figure 13:
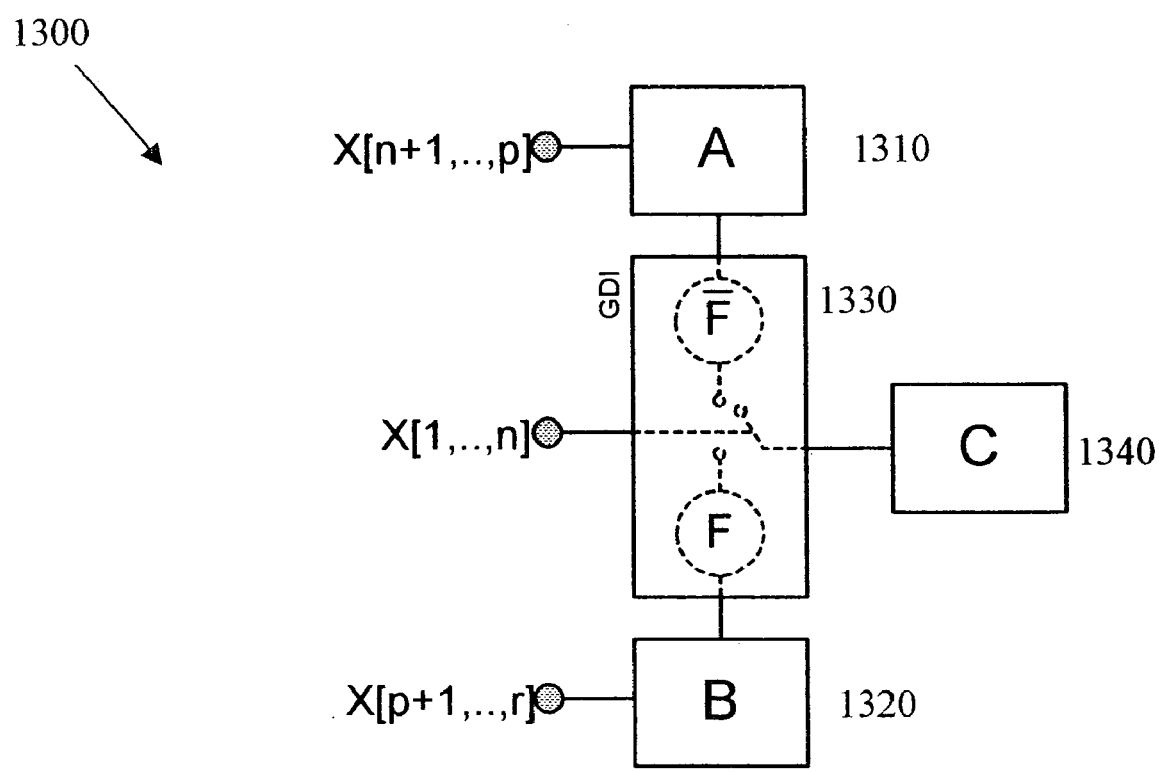

FIG. 13 is a simplified block diagram of an extended GDI cell, according to a preferred embodiment of the present invention.

Figure 14:
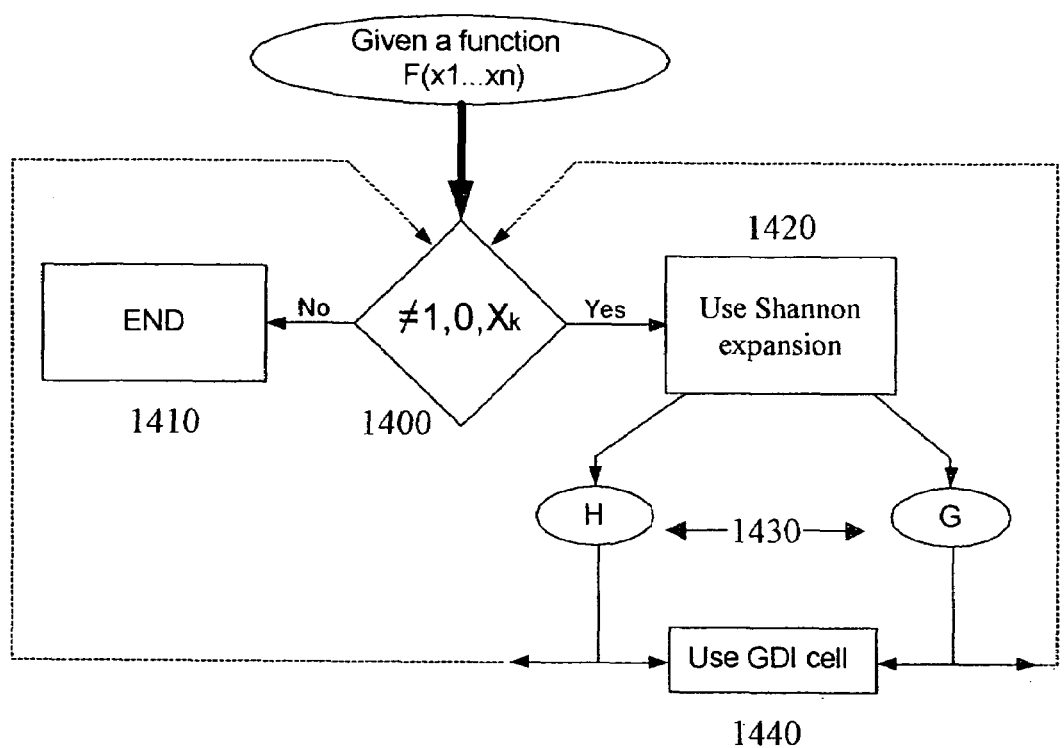

FIG. 14 is a simplified flowchart of a recursive algorithm for implementing any logic function by GDI cells, according to a preferred embodiment of the present invention.

Figure 15:
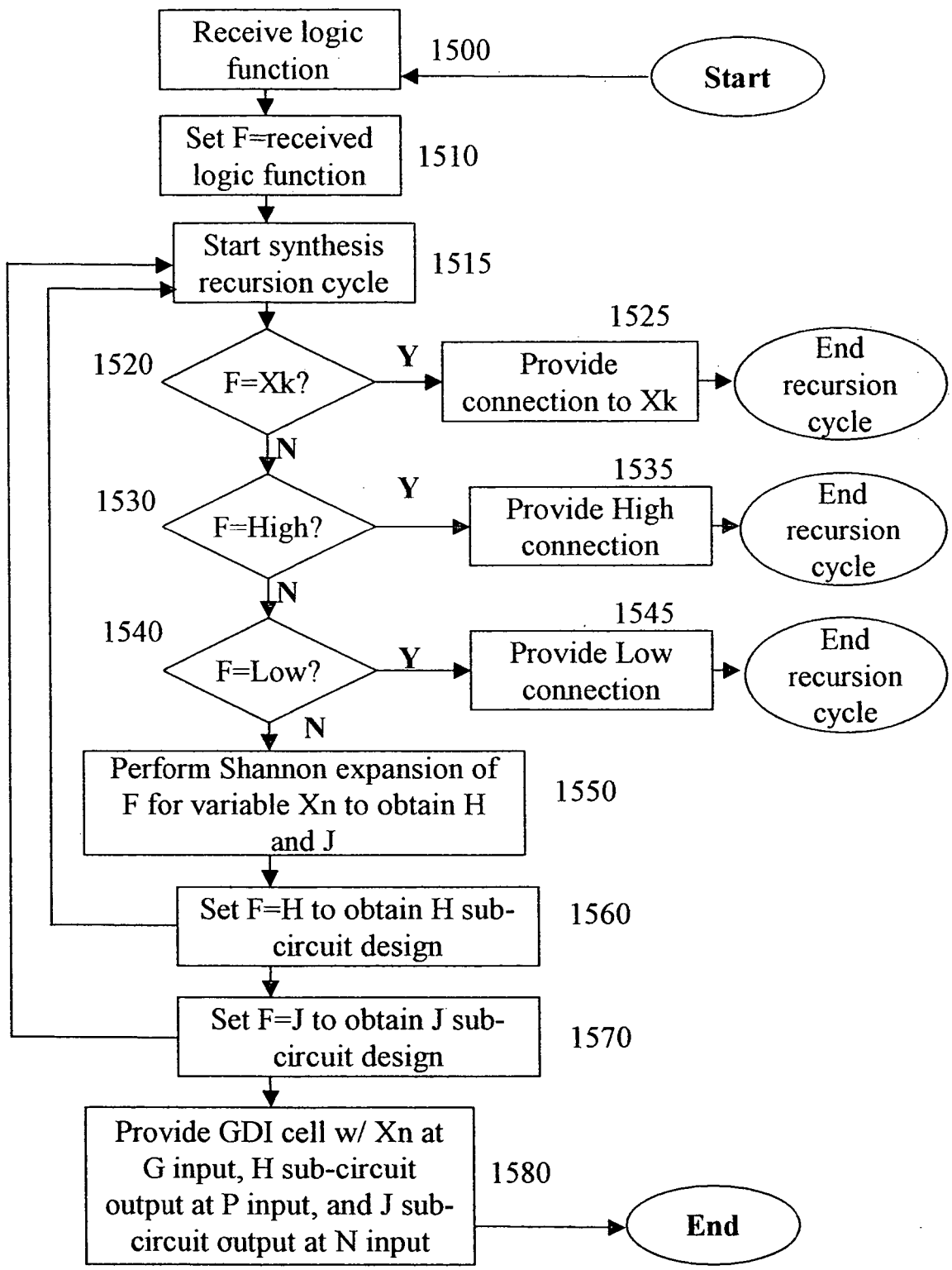

FIG. 15 is a simplified flowchart of a method for designing a logic circuit, according to a preferred embodiment of the present invention.

Figure 16:
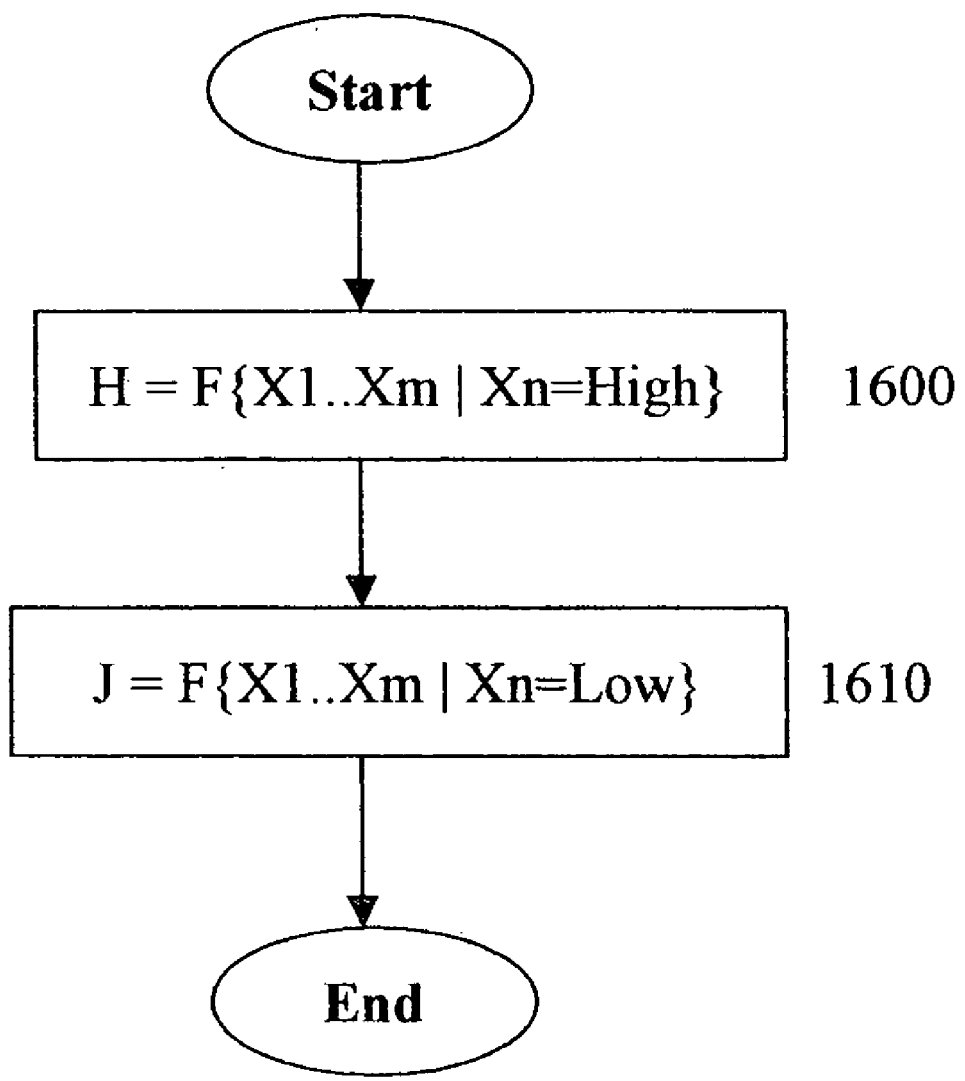

FIG. 16 is a simplified flowchart of a method for extracting the first and second logic functions from a given function, according to a preferred embodiment of the present invention.

Figure 17:
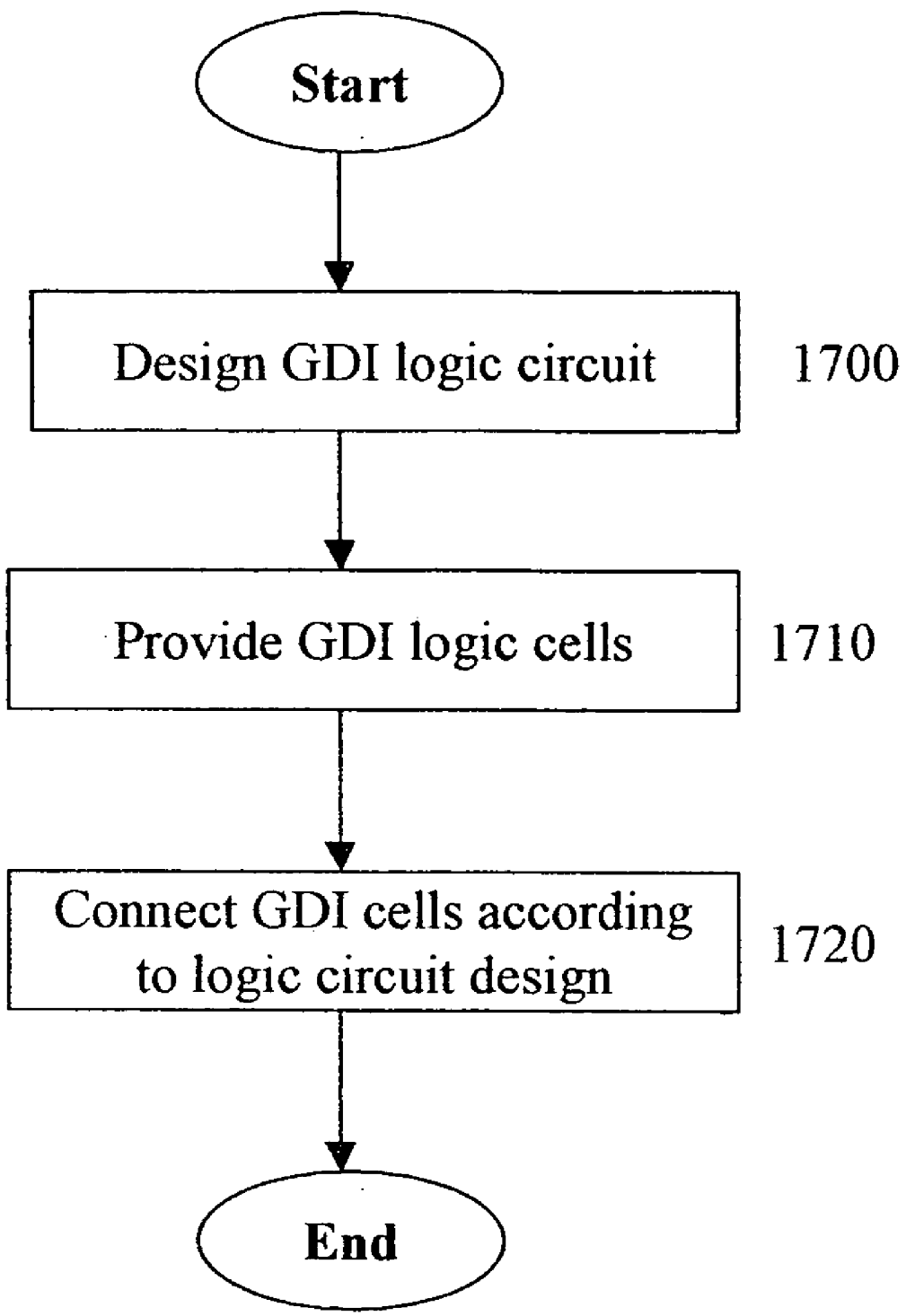

FIG. 17 is a simplified flowchart of a method for providing a GDI logic circuit, according to a preferred embodiment of the present invention.

FIGS. 18a, 18b, and 18c show GDI XOR, AND, and OR gates respectively, according to a preferred embodiment of the present invention, and their prior-art equivalents in CMOS, TG, and NMOS Pass-Gate (N-PG) technologies.

Figures 19, 19A, 19B:
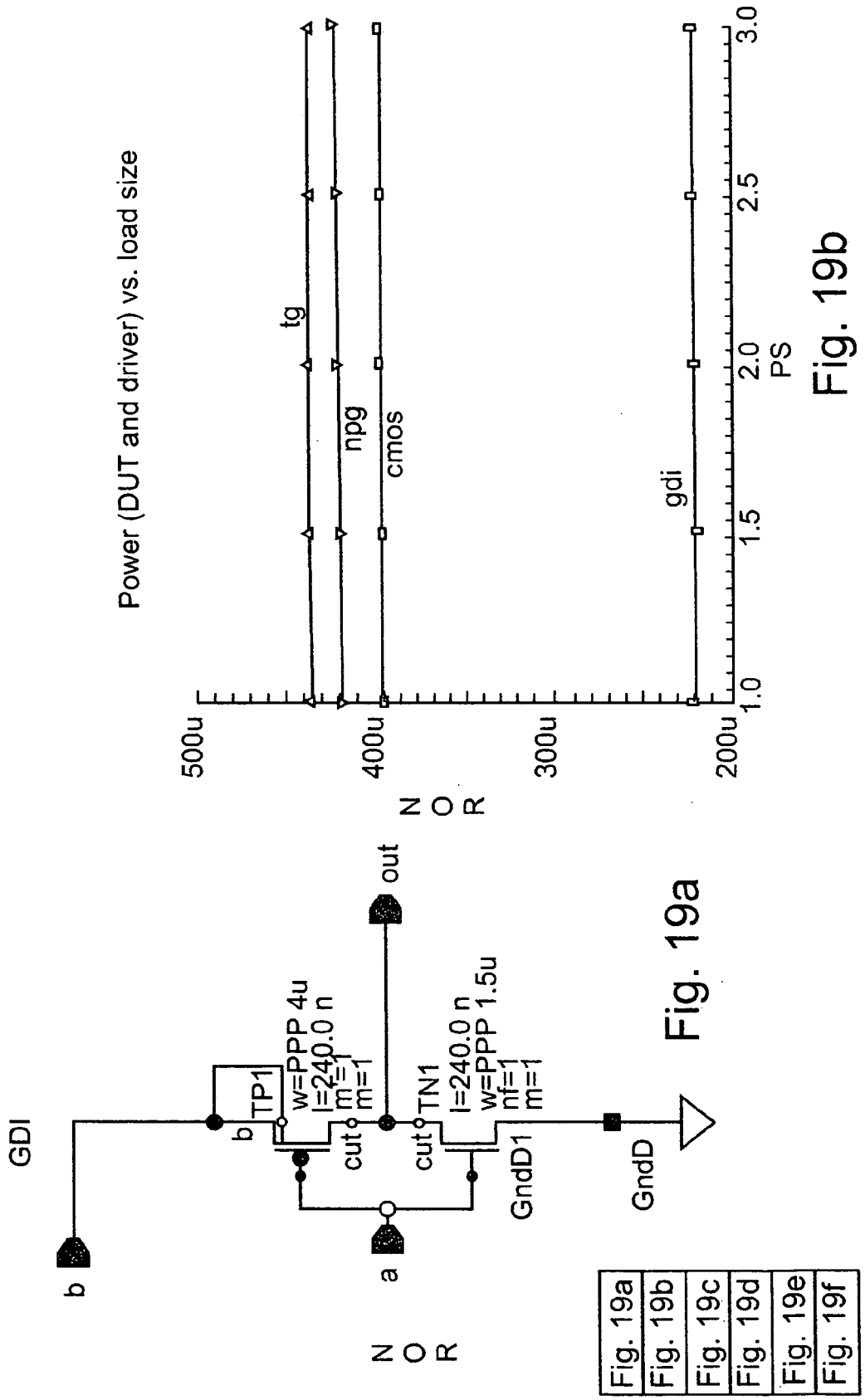
Figure 19C:
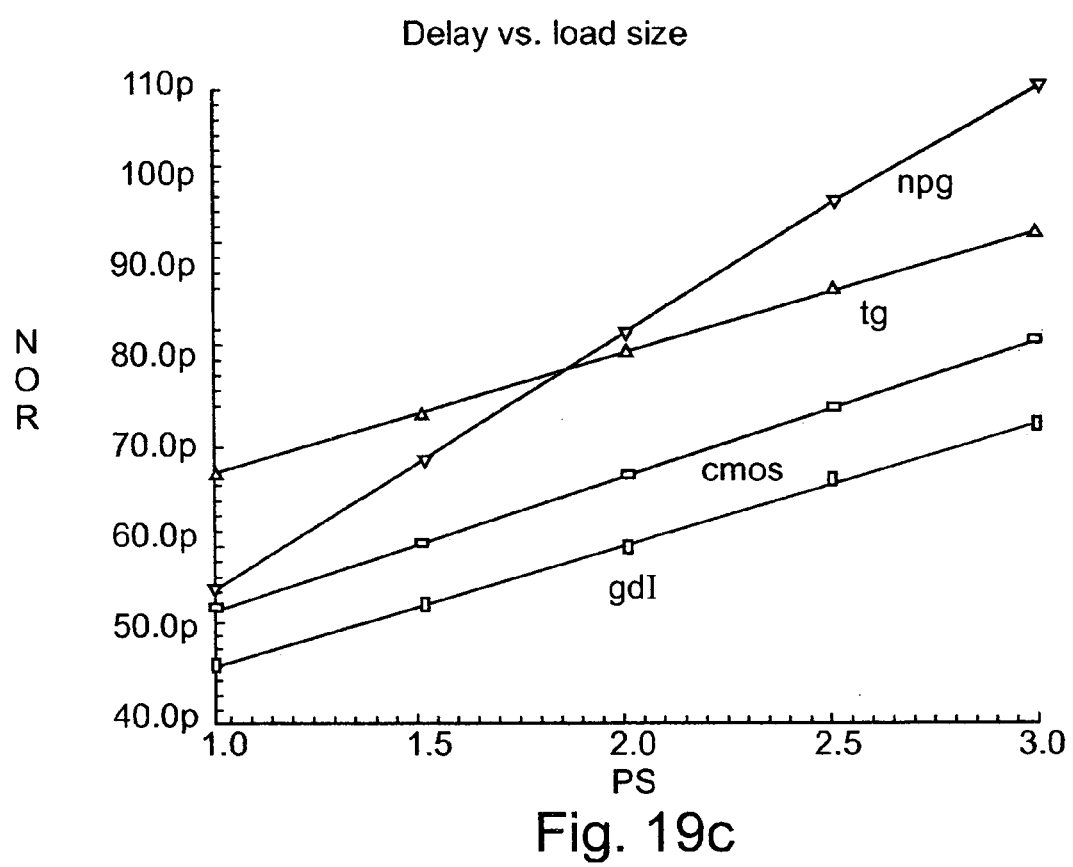
Figure 19D:
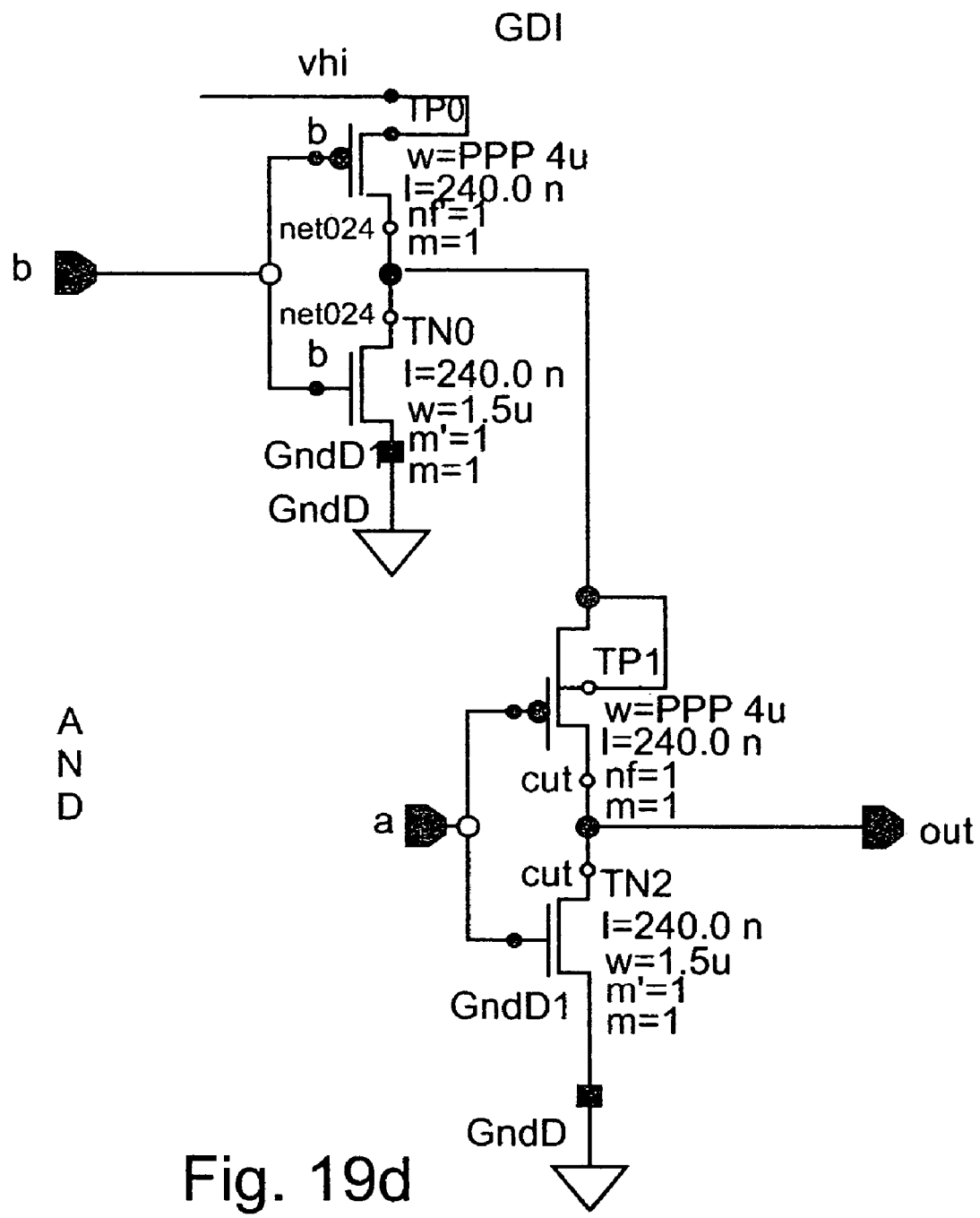
Figure 19E:
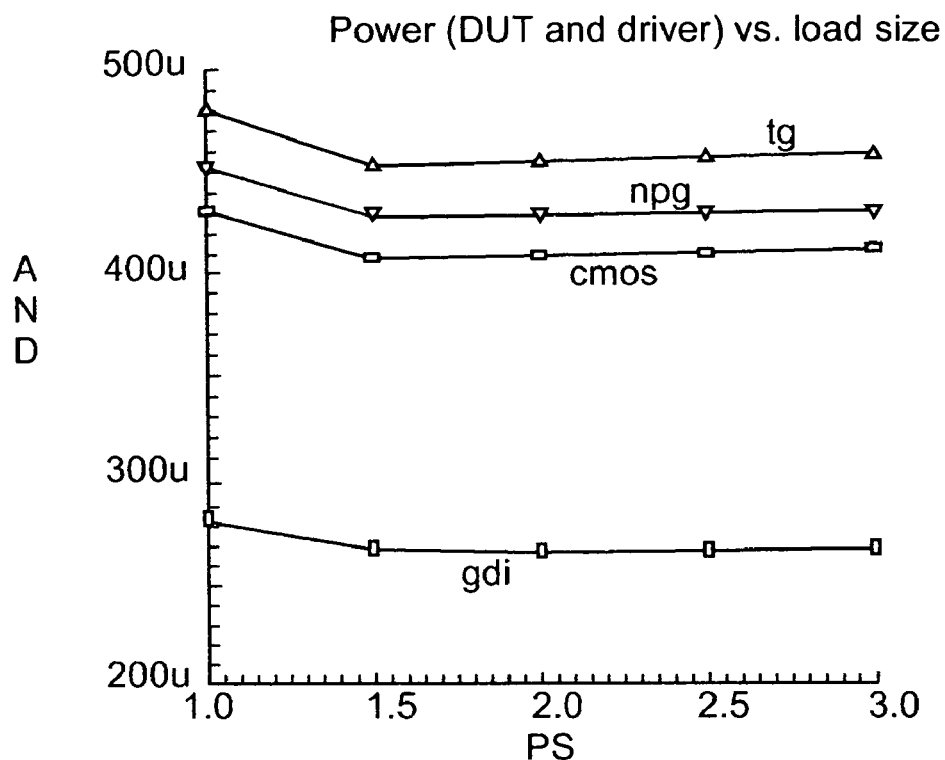
Figure 19F:
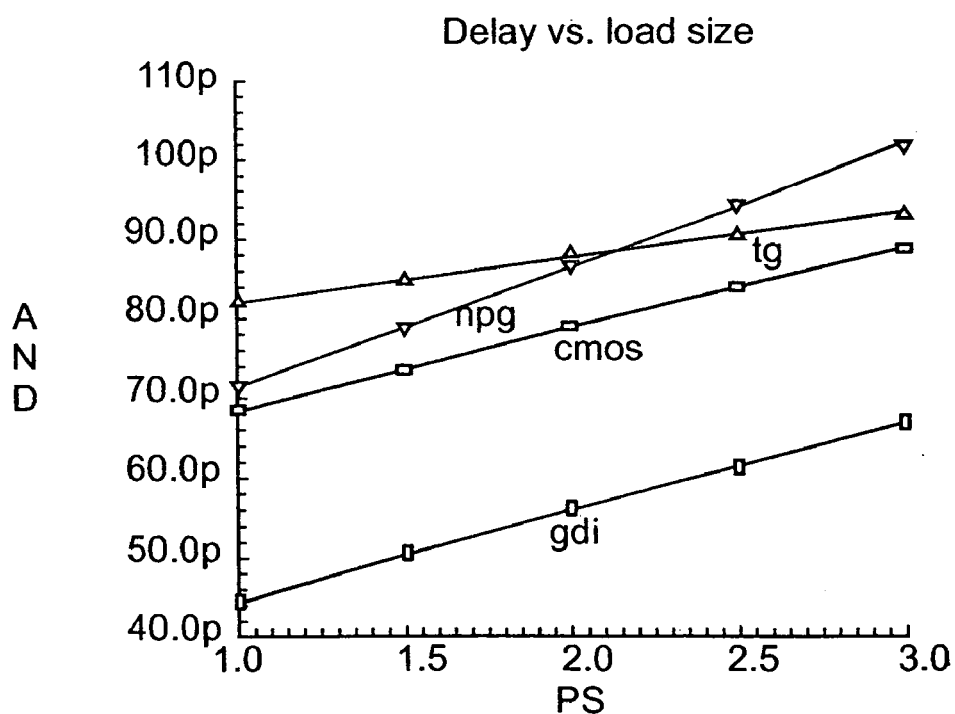
Figure 20C:
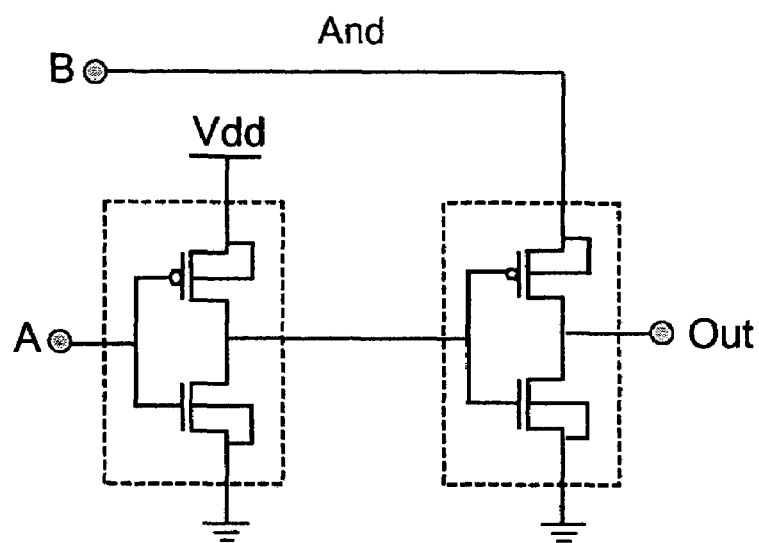
Figure 20D:
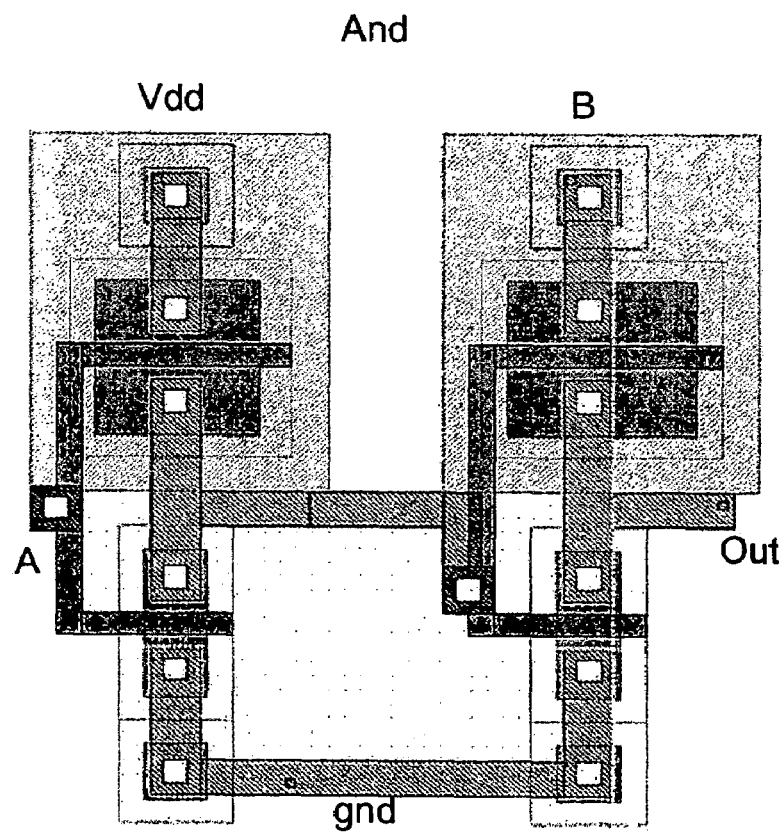
Figure 20E:
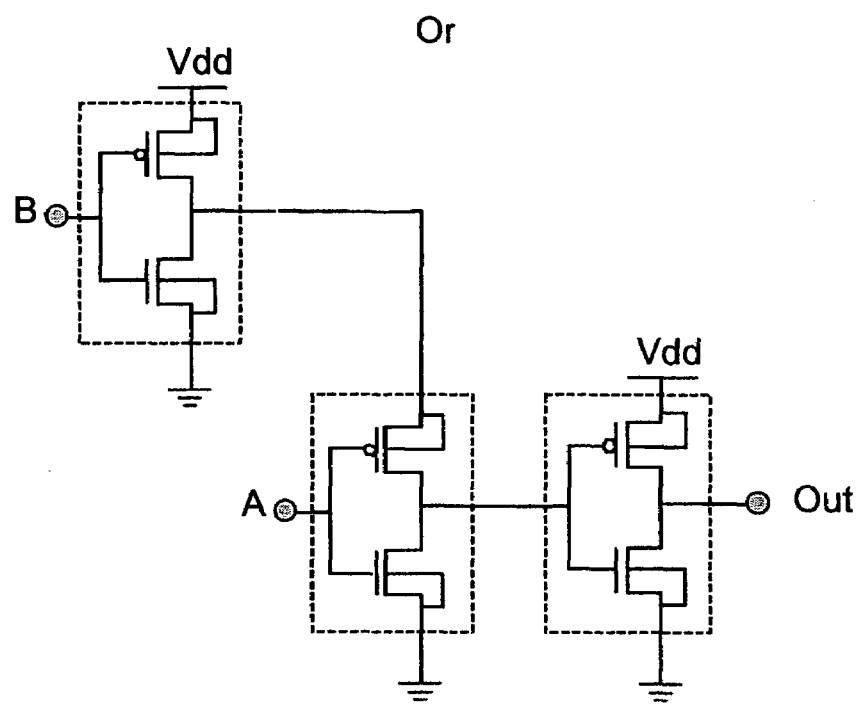
Figure 20F:
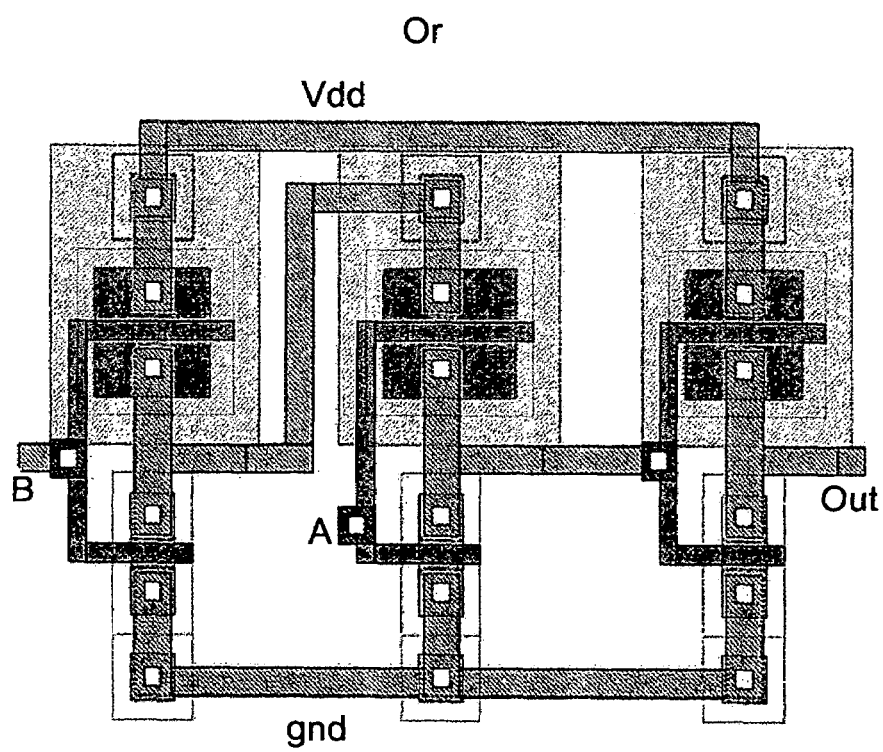

FIG. 19 shows power and delay results for GDI OR and AND gates according to a preferred embodiment of the present invention, and for prior-art CMOS, and PTL gates.

FIG. 20 shows implemented GDI cells and cell layouts for basic functions for a regular p-well process, according to a preferred embodiment of the present invention.

FIG. 21 shows generic prior-art carry-lookahead adders.

FIG. 22 shows a prior-art four-bit ripple comparator consisting of a cascade of 4 identical basic units.

FIG. 23 shows the structure of a prior-art 4-bit multiplier.

FIG. 24 shows a prior-art basic multiplier cell.

FIG. 25 shows layouts for 8-bit CLA adder circuits, according to a preferred embodiment of the present invention, and prior-art TG and CMOS circuits.

Figure 26:
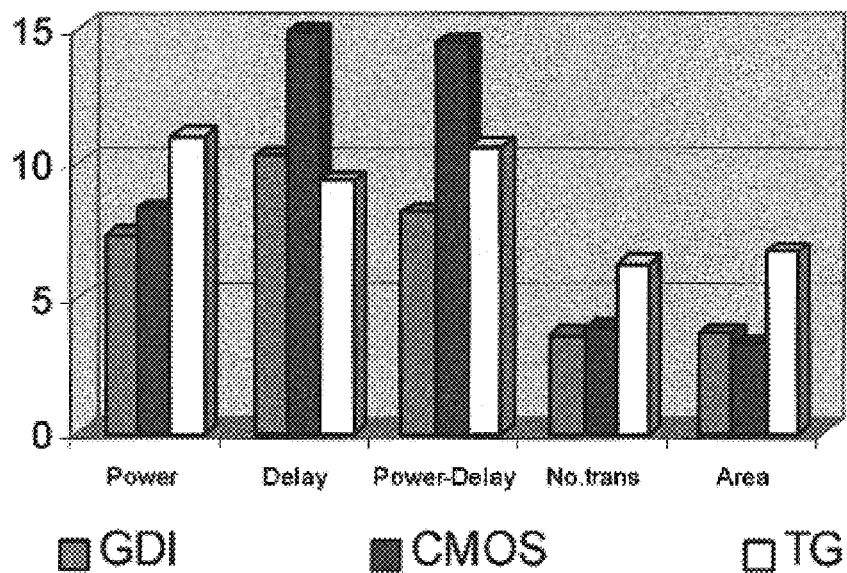

FIG. 26 shows simulation results for a GDI 8-bit adder designed according to a preferred embodiment of the present invention vs. prior-art CMOS and TG.

Figure 27:
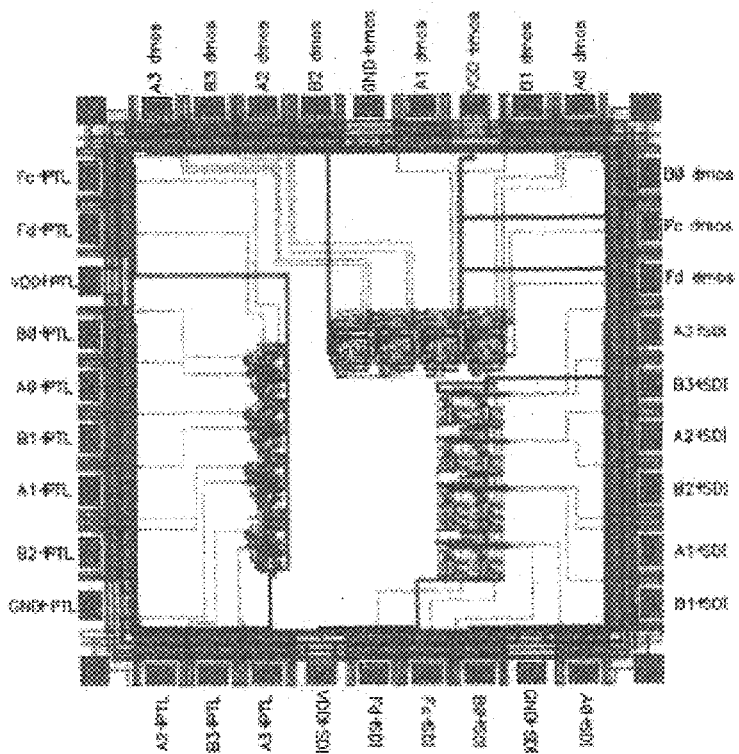

FIG. 27 shows a layout of an 8-bit comparator chip designed according to the present invention.

Figure 28:
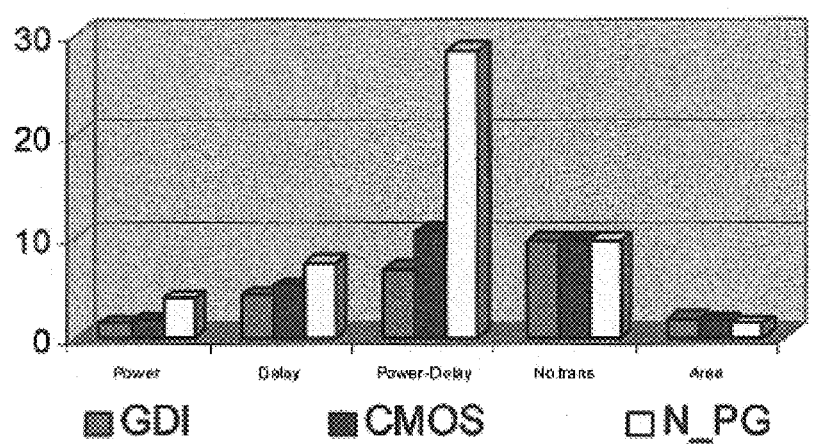

FIG. 28 shows simulation results for an 8-bit comparator, designed according to a preferred embodiment of the present invention.

Figure 29:
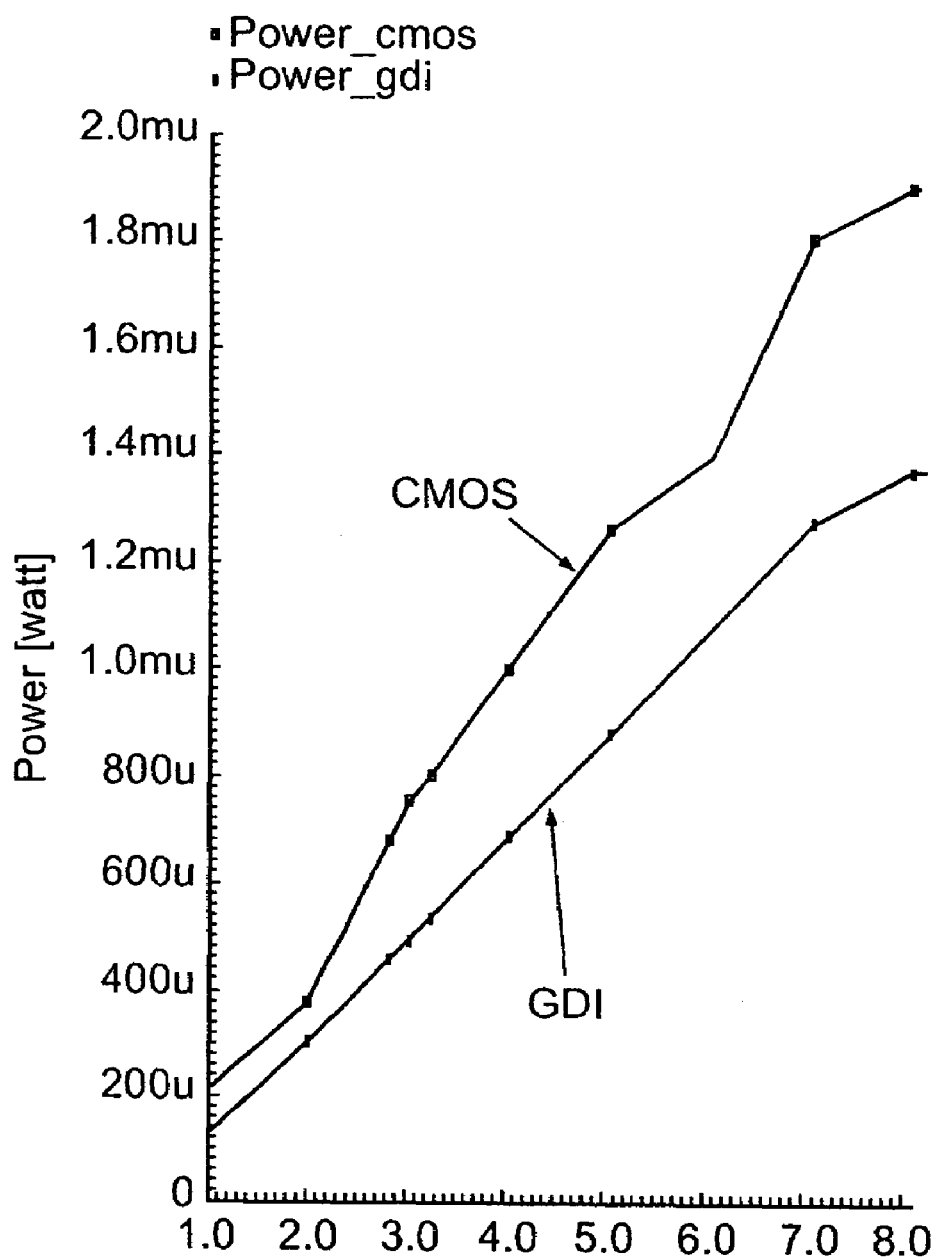

FIG. 29 shows power, results as function of $\alpha$ for a 4-bit comparator, designed according to a preferred embodiment of the present invention.

Figure 30:
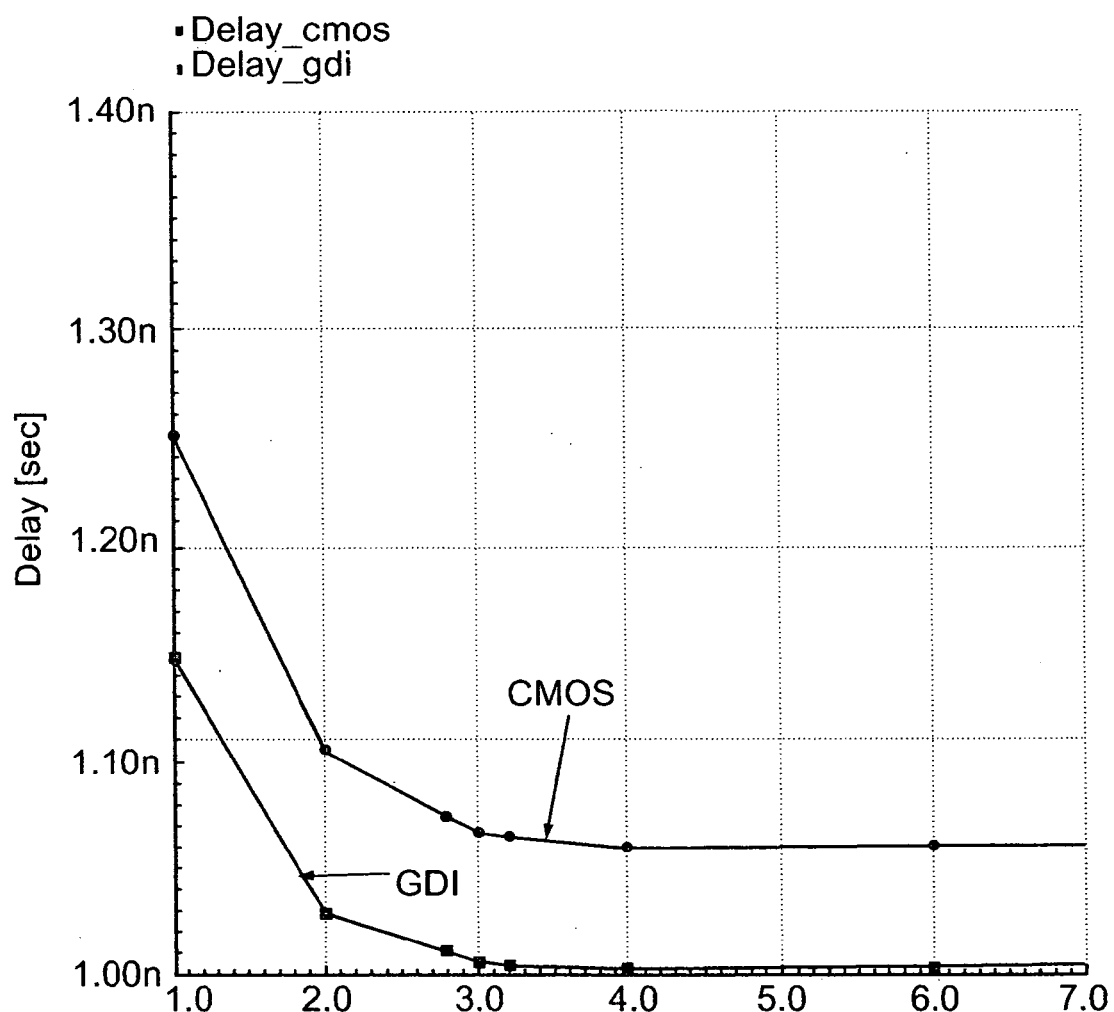

FIG. 30 shows delay results as function of $\alpha$ for a 4-bit comparator, designed according to a preferred embodiment of the present invention.

Figure 31:
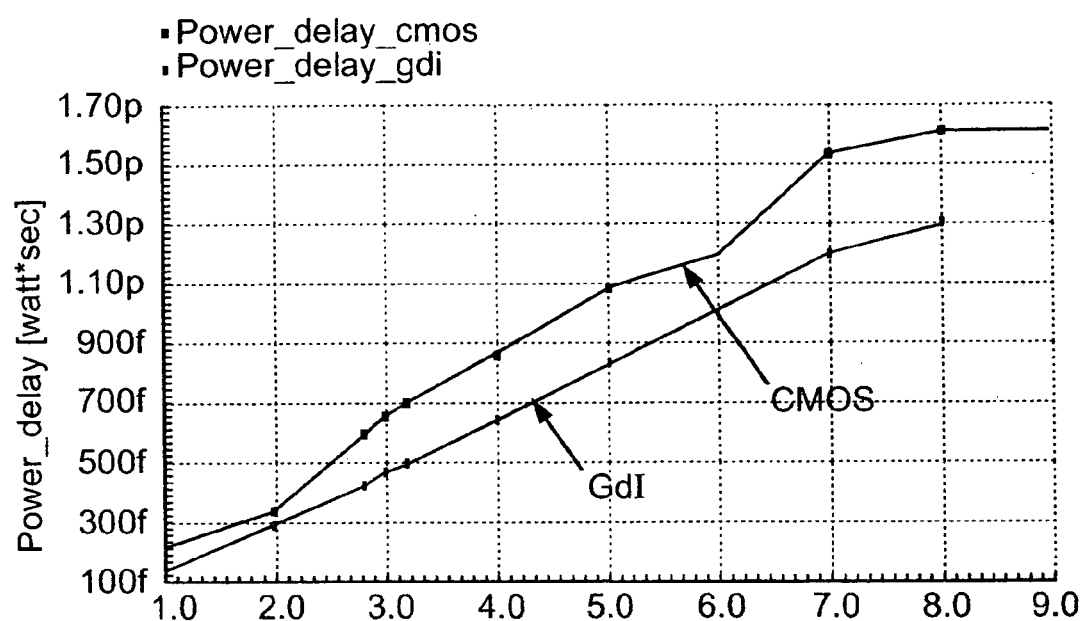

FIG. 31 shows power-delay results as function of $\alpha$ for a 4-bit comparator, designed according to a preferred embodiment of the present invention.

Figure 32:
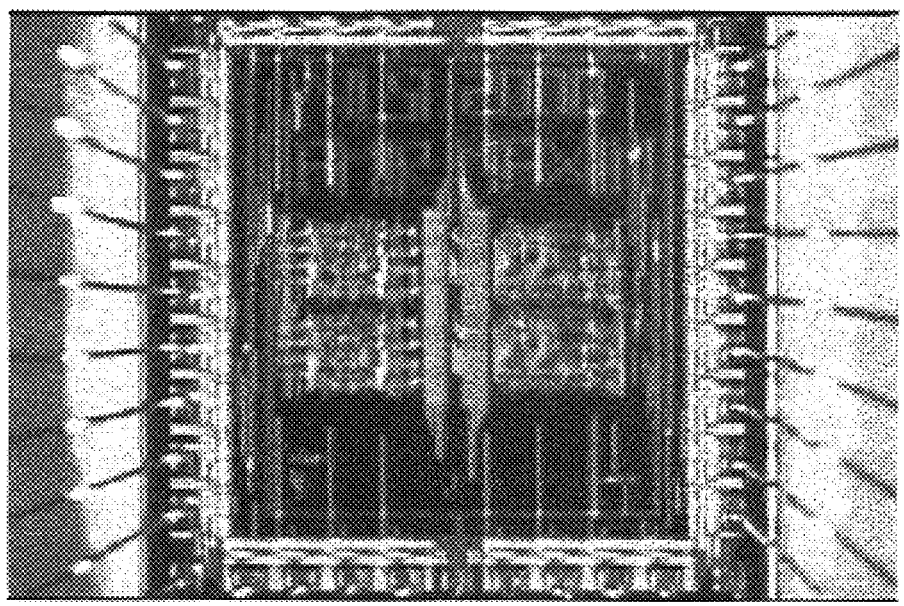

FIG. 32 is a photograph of a test chip constructed in accordance with the present invention.

FIGS. 33a-33e shows five prior-art CMOS C-element circuits.

Figure 34A:
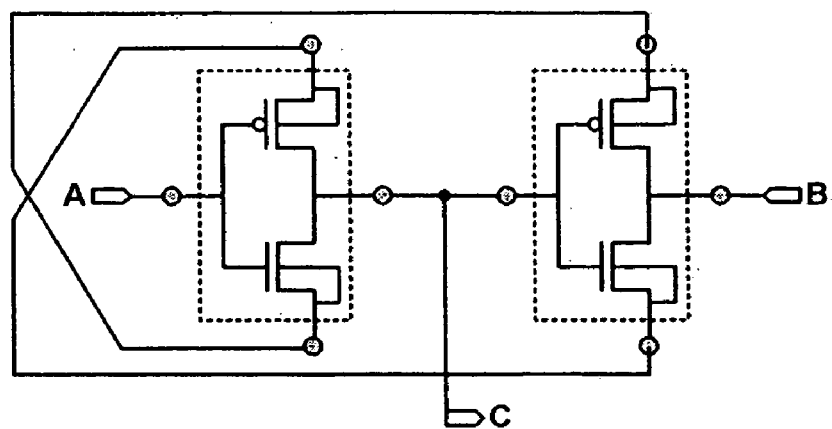
Figure 34B:
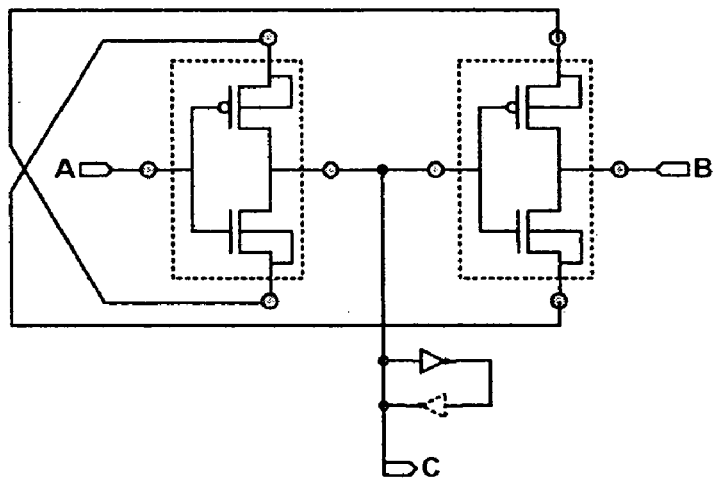
Figure 34C:
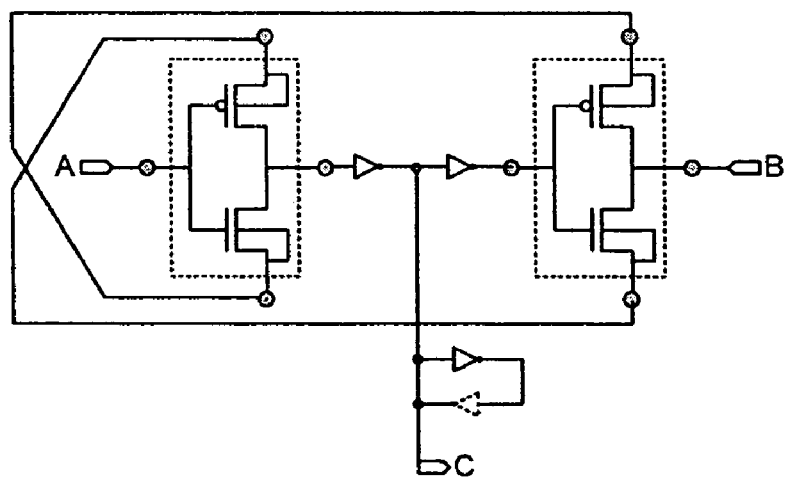

FIGS. 34a-34c shows three GDI implementations of the C-element, according to a preferred embodiment of the present invention.

FIGS. 35a and 35b show implementations of a three-input C-element for prior-art CMOS and GDI architectures respectively, according to a preferred embodiment of the present invention.

FIG. 36 shows a prior-art representation of a C-element by an SR-latch.

Figure 37A:
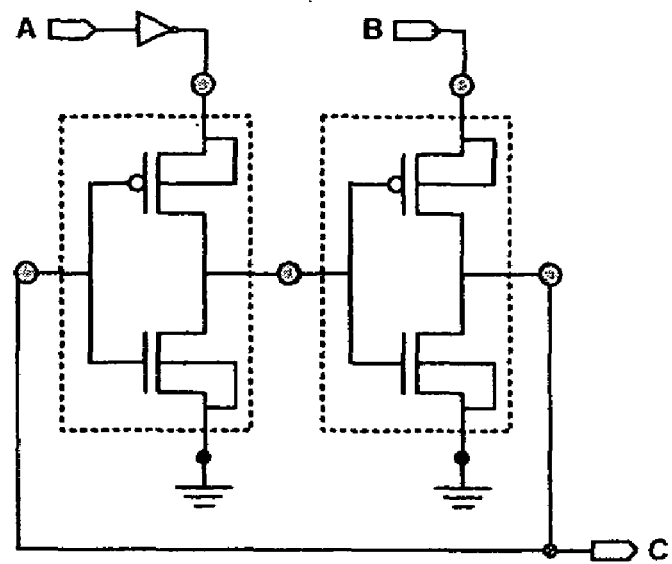
Figure 37B:
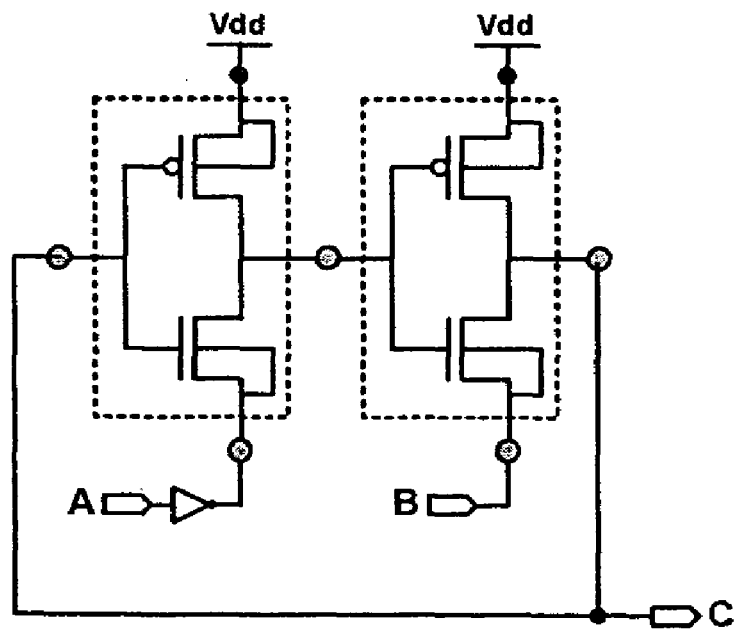

FIGS. 37a and 37b show GDI SR-latch circuits, according to preferred embodiments of the present invention.

FIG. 38 shows the prior-art Muller pipeline structure.

FIG. 39 shows a GDI implementation of a dynamic C-element with inverted input, according to a preferred embodiment of the present invention.

Figure 40:
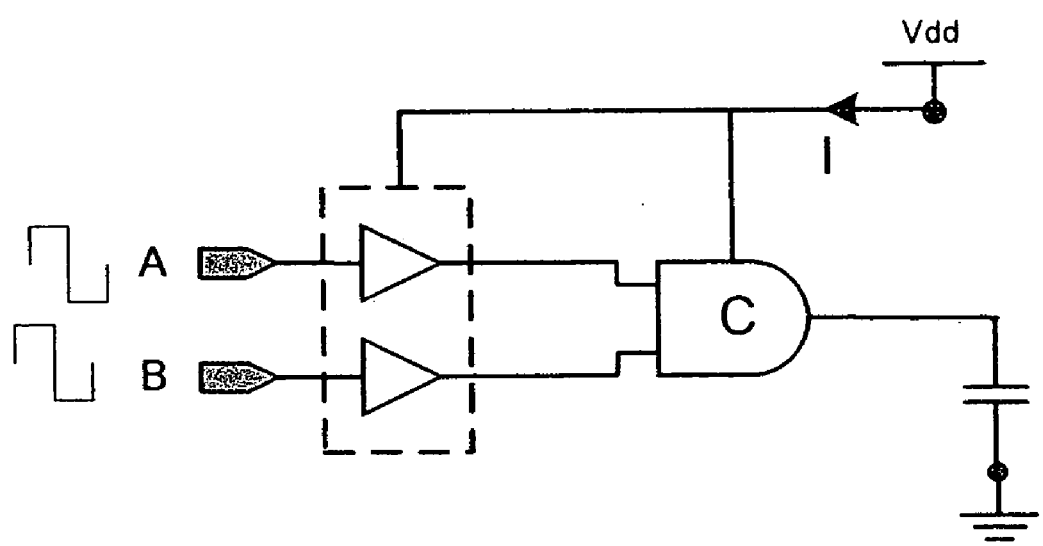

FIG. 40 shows the simulation environment for a C-element, designed according to a preferred embodiment of the present invention.

Figure 41:
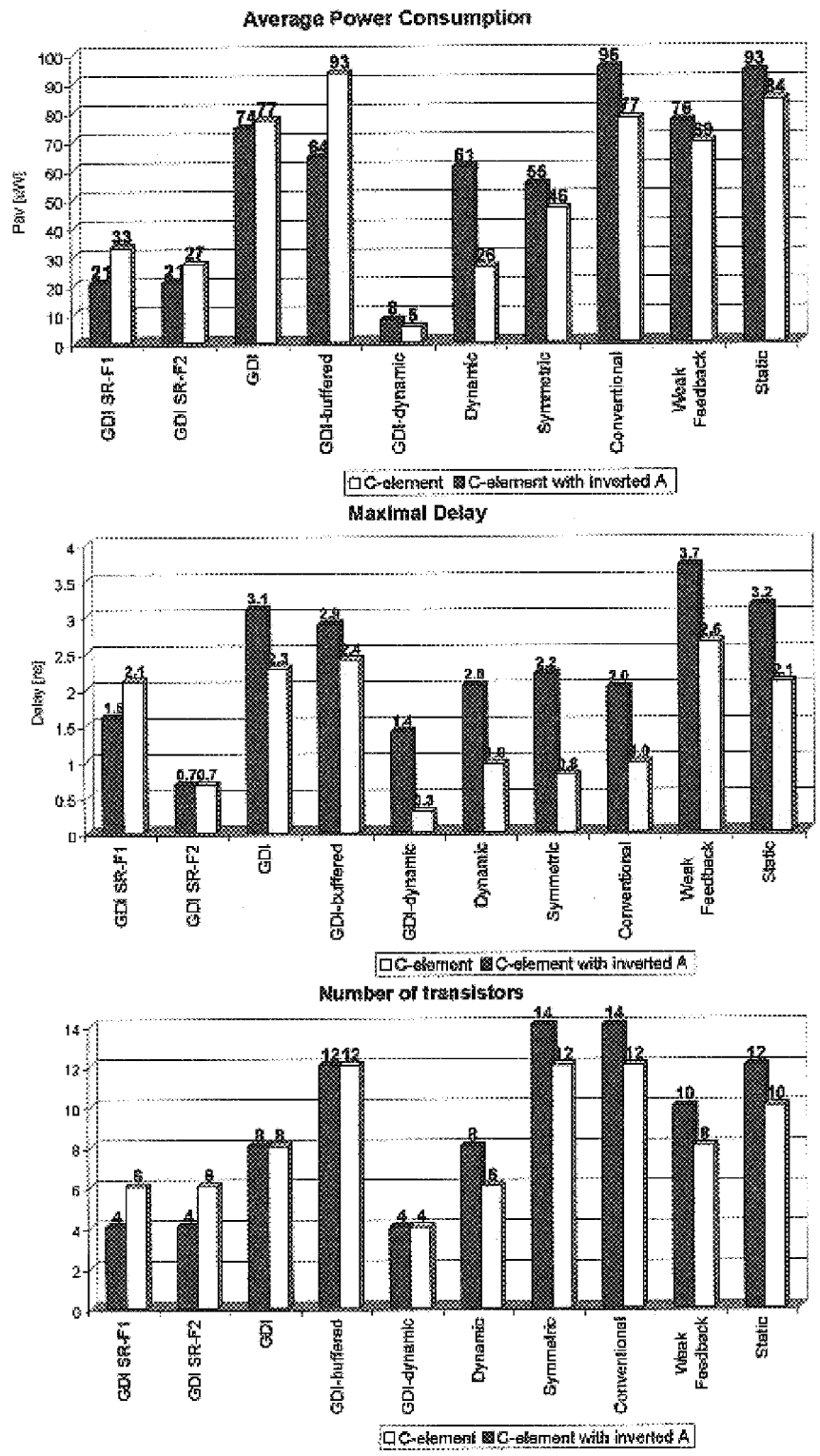

FIG. 41 shows the simulation results for prior-art and GDI C-elements, according to preferred embodiments of the present invention.

FIG. 42 shows prior-art filter structure and the STG flow for a Bundled-Data Filter Controller.

FIGS. 43a and 43b show prior-art implementations of a Bundled-Data Filter Controller.

Figure 44:
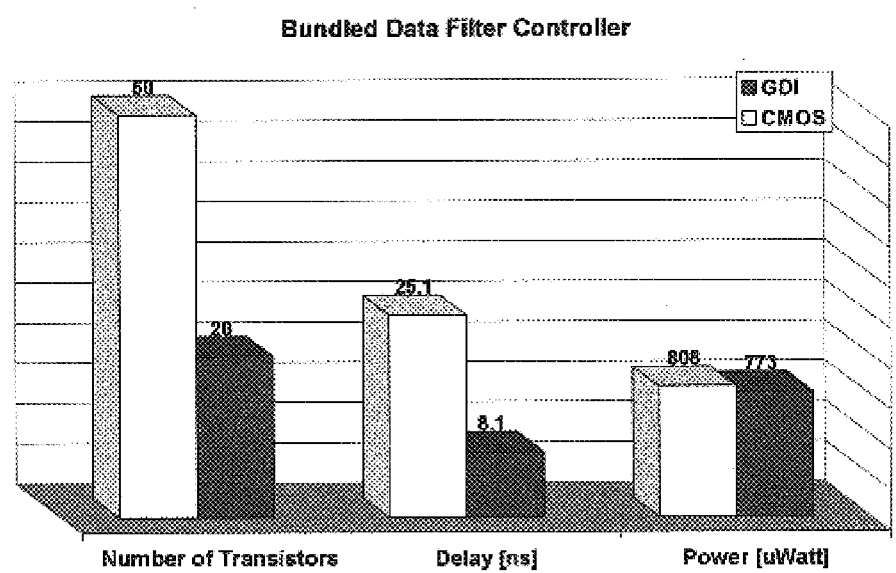

FIG. 44 shows simulation results for GDI and CMOS Bundled-Data Filter Controller, designed according to a preferred embodiment of the present invention.

Figure 45:
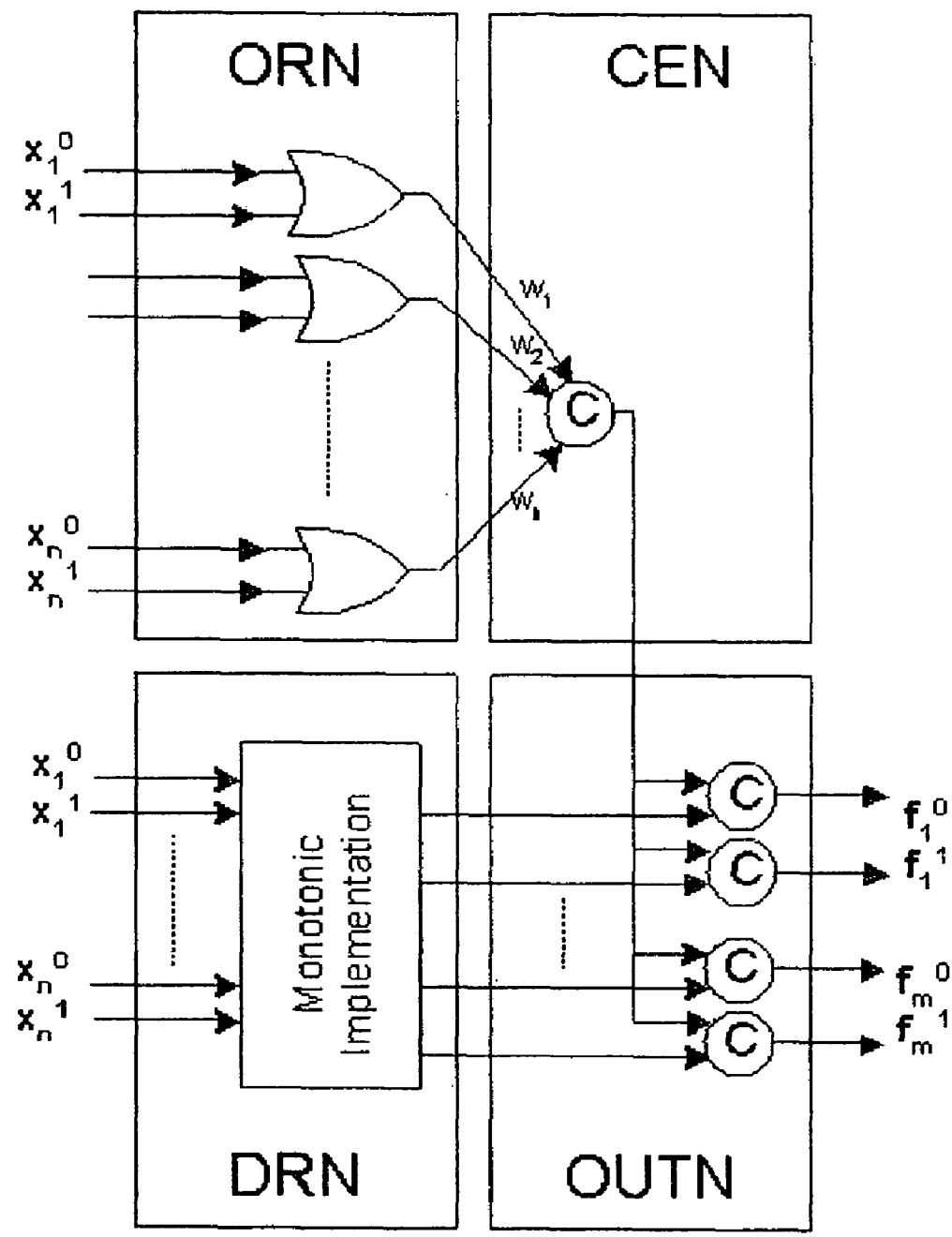

FIG. 45 shows the general structure of a prior-art DR-ST implementation of a qDI combinational logic circuit.

FIG. 46 shows prior-art CMOS and GDI implementations of the ORN subnet, designed according to a preferred embodiment of the present invention.

Figure 47:
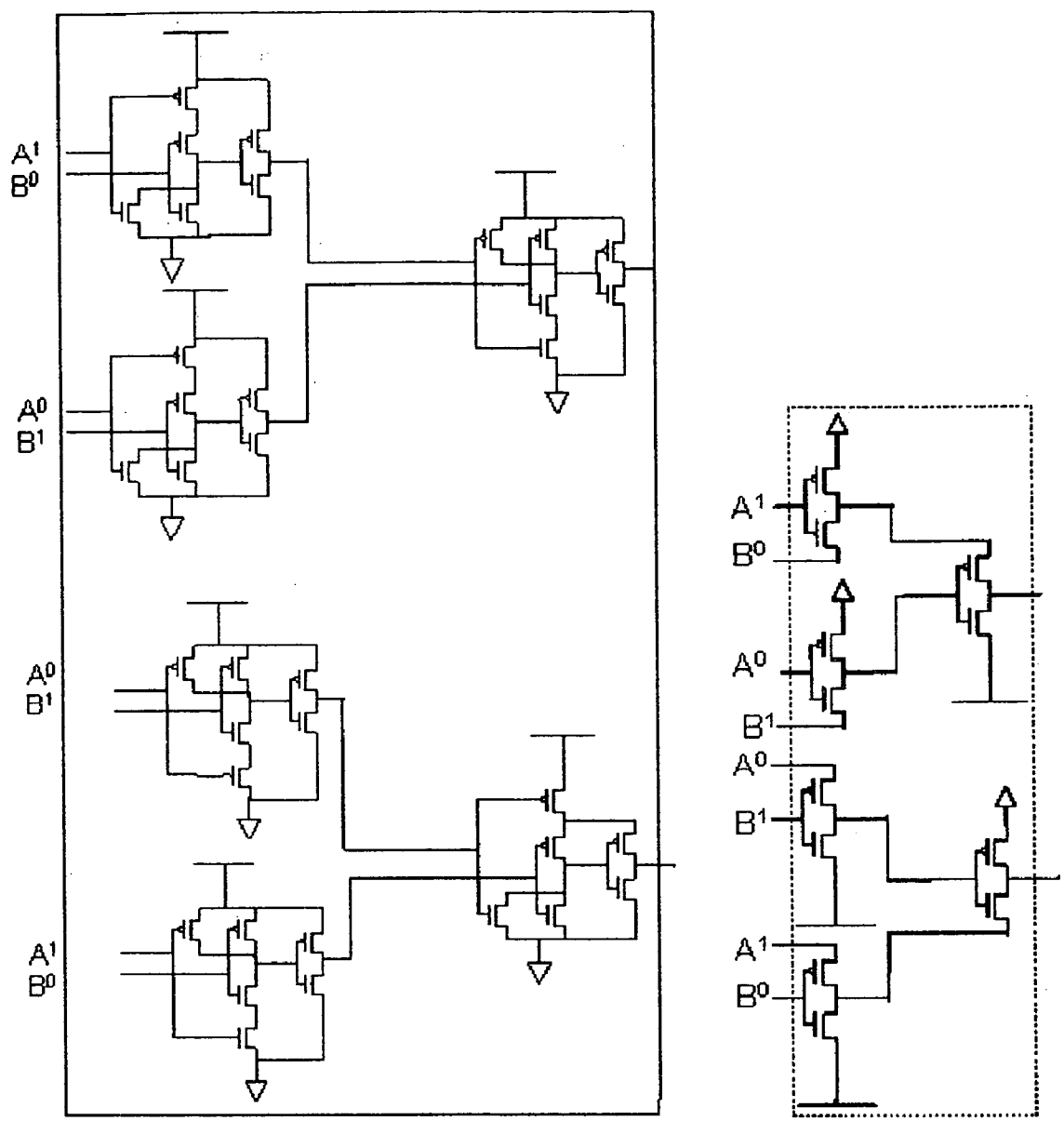

FIG. 47 shows prior-art CMOS and GDI implementations of the XOR DRN subnet, designed according to a preferred embodiment of the present invention.

Figure 48A:
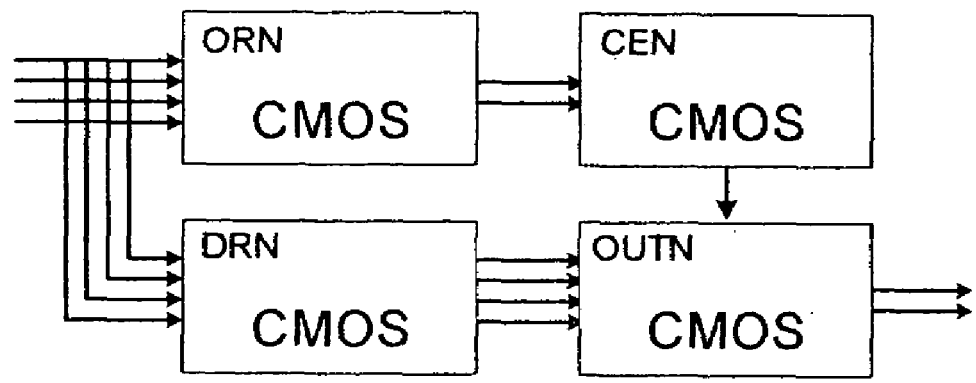
Figure 48B:
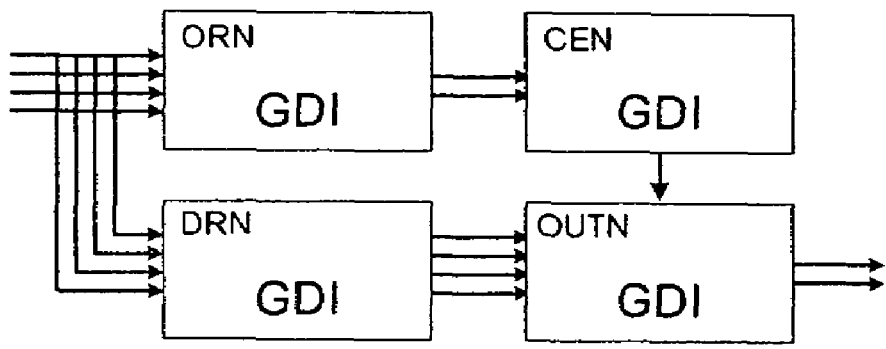
Figure 48C:
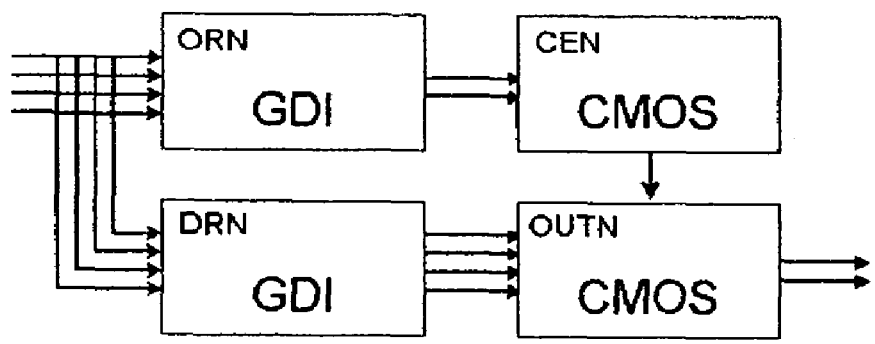

FIGS. 48a, 48b and 48c show three simulated circuits based on different combinations of ORN and DRN subnets, designed according to a preferred embodiment of the present invention.

Figure 49:
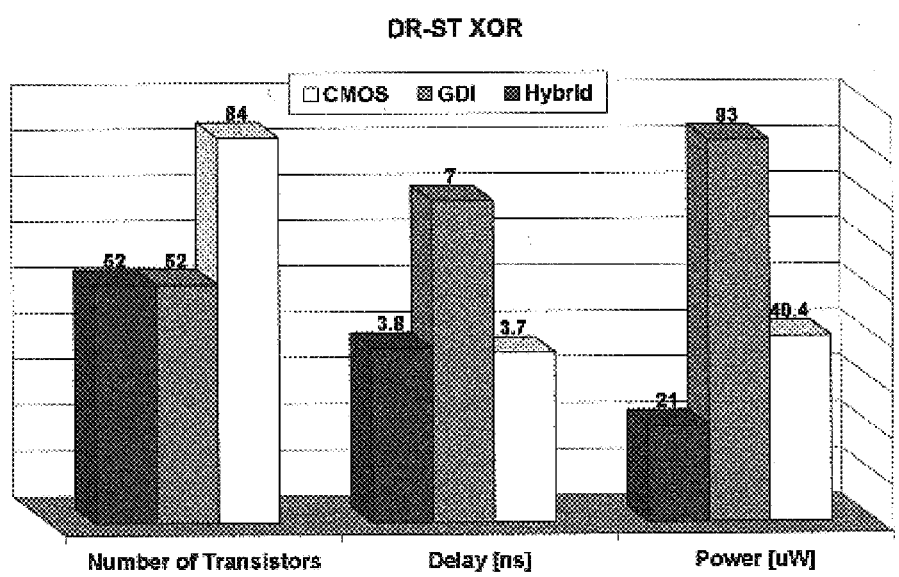

FIG. 49 shows simulation results for DR-ST XOR circuits designed according to a preferred embodiment of the present invention.

FIG. 50 shows circuit diagrams for ORN subnet Full Adders, designed according to a preferred embodiment of the present invention.

Figure 51:
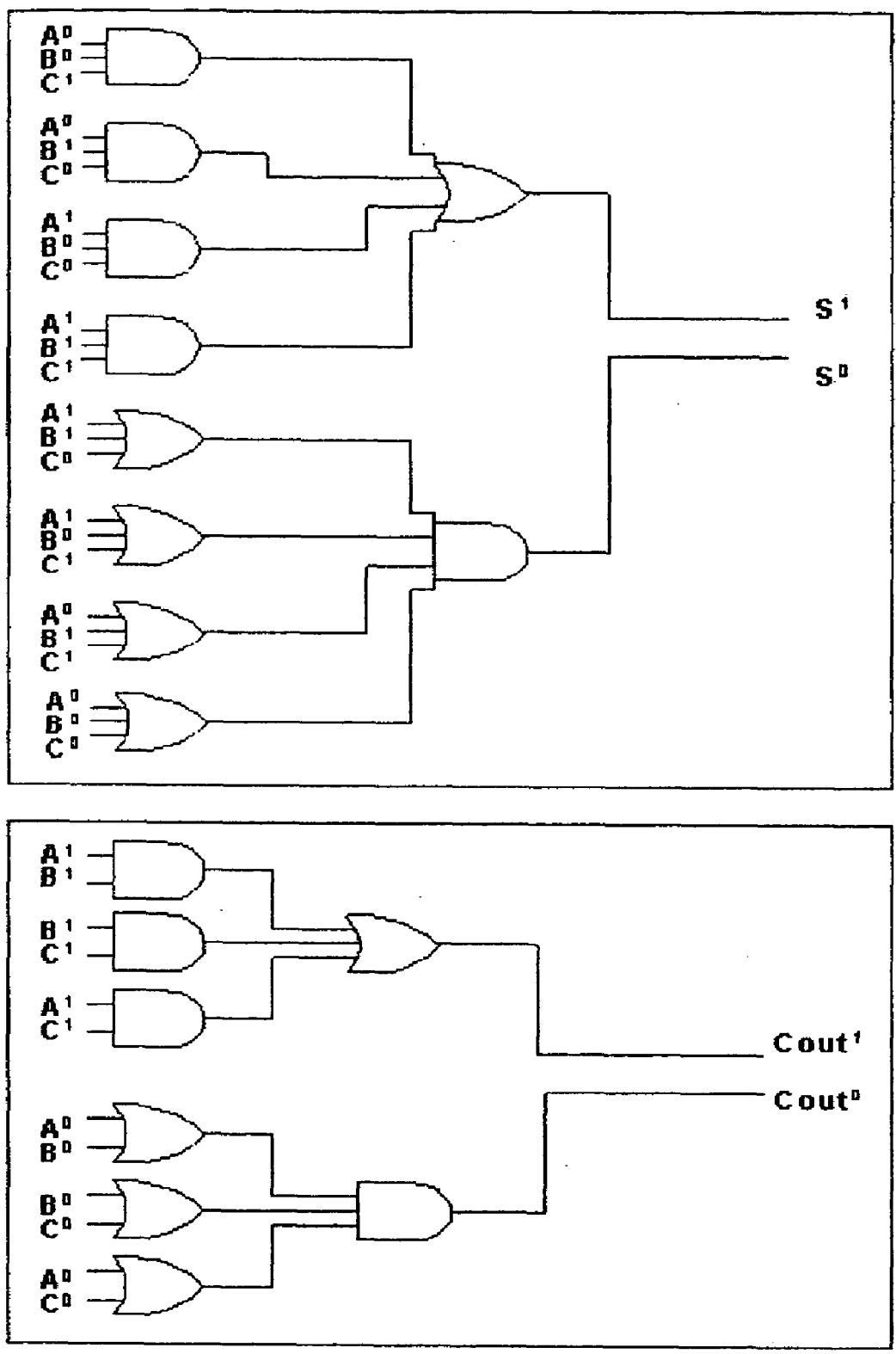

FIG. 51 shows prior-art logic diagrams for DRN subnet Full Adders.

Figure 52:
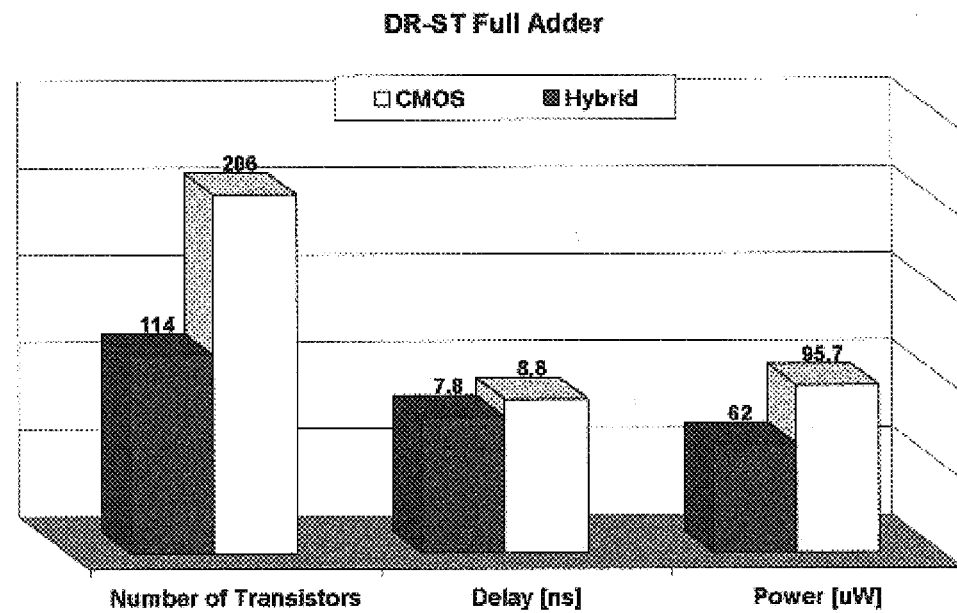

FIG. 52 shows performance results for DR-ST Full Adders, designed according to a preferred embodiment of the present invention.

Figure 53:
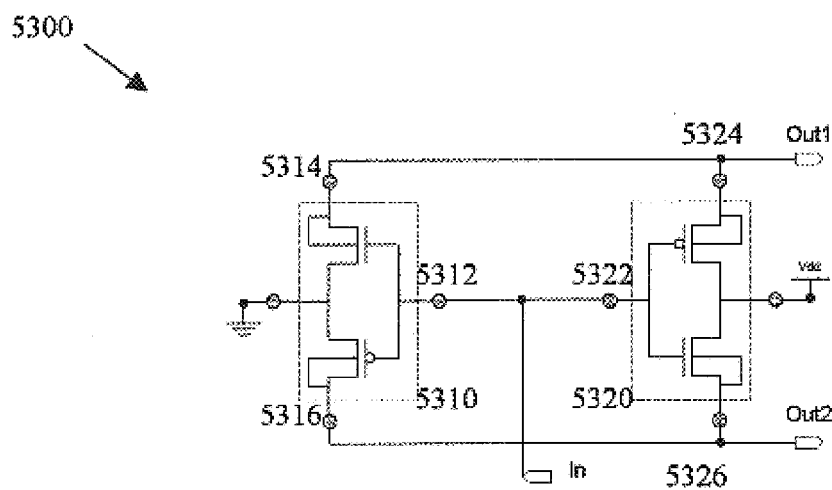

FIG. 53 is a circuit diagram of a GDI 1-to-2 Decoder, according to a preferred embodiment of the present invention.

DESCRIPTION OF THE PREFERRED EMBODIMENTS

The rapid development of digital applications has created a demand for faster logic circuits, having compact implementation and low power dissipation. Traditional CMOS methods, and other technologies, such as PTL, have been unable to satisfy this demand. The present invention is of a low area, power-efficient logic circuit design, referred to below as gate-diffusion input (GDI), which can be used to implement a wide variety of logic functions.

The principles and operation of a logic circuit according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Figure 1:
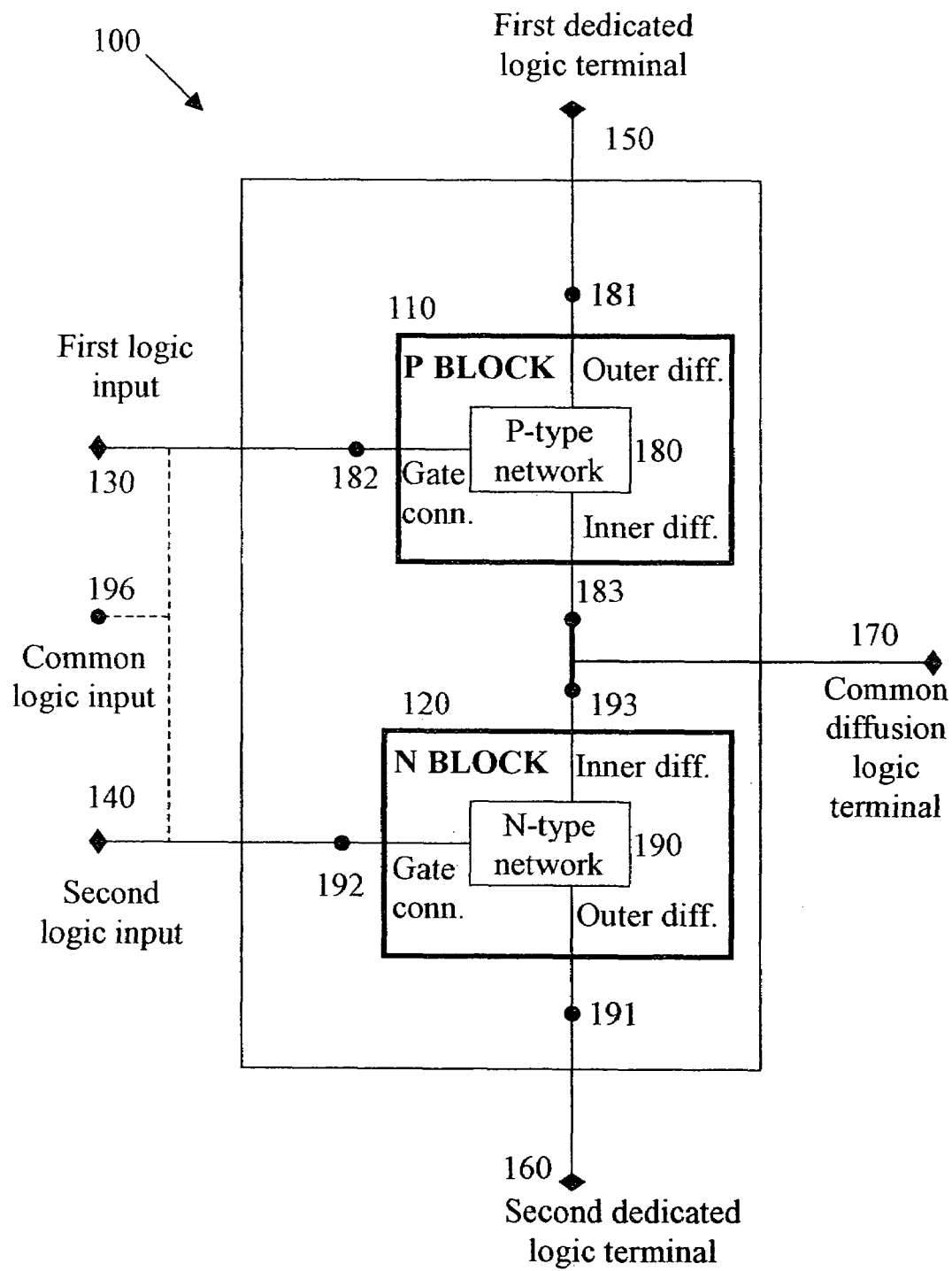

Reference is now made to FIG. 1, which is a simplified block diagram of a logic circuit according to a preferred embodiment of the present invention. The logic circuit, which uses a GDI design, is based upon two complementary transistor networks, which connect to the GDI circuit logic inputs and outputs, and implement the desired logic function. The relationship between the structures of the two transistor networks and the overall function of the GDI circuit is discussed below, for the general case and for specific transistor network configurations.

Logic circuit 100 contains P logic block 110, N logic block 120, first and second logic inputs, 130 and 140, and three logic terminals: first and second dedicated logic terminals, 150 and 160, and common diffusion logic terminal 170. The first and second dedicated logic terminals, 150 and 160, and the common diffusion logic terminal 170 can each serve as either a logic signal input terminal or a logic signal output terminal, depending upon the specific logic circuit implementation. The preferred embodiments and examples given below illustrate several logic circuit terminal configurations.

The P logic block 110 contains a network of p-type transistors 180 which are interconnected to implement a given logic function. The P logic block 110 has three logic connections: an outer diffusion connection 181 (at an outer diffusion node of one of the p-type transistors), a gate connection 182 (at the gate of one of the p-type transistors), and an inner diffusion connection 183 (at the second inner diffusion node of one of the p-type transistors). Outer diffusion connection 181 connects to the first dedicated logic terminal 150, and gate terminal 182 connects to the first logic input 130. The N logic block 120 contains a network of n-type transistors 190 which implement the complementary logic function, and is structured similarly to the P logic block 110. The inner diffusion nodes of the P and N logic blocks, 183 and 193, are connected together to form the common diffusion logic terminal 170.

The p-type and n-type transistors may be field effect transistors (FET), CMOS transistors (p-well, n-well, or twin-well), SOI transistors, SOS transistors, or the like. Note that the customary distinction between the source and drain of the transistor can not be made with the GDI structure, since for any given transistor the relative voltages between the transistor diffusion nodes changes depending upon the logic input and output voltages. This is in contrast with the standard complementary CMOS structure in which the source or drain is tied to a constant voltage. Thus, for GDI logic circuits one of the two transistor diffusion nodes (not the gate) is arbitrarily selected to serve for the inner diffusion connection, and the other to serve for the outer diffusion connection. Not all GDI cell topologies can be implemented in standard p-well or n-well CMOS technology, due to interference of bulk effects under certain input/output conditions. GDI logic circuits are therefore preferably implemented in either twin-well CMOS or silicon-on-insulator/silicon-on-sapphire (SOI/SOS) technologies, which do not suffer from these limitations.

In the preferred embodiment of the GDI logic circuit, the common logic terminals are connected together to form a common logic input 196. Thus a logic signal at the common logic input 196 is applied to both the P and N logic blocks, 110 and 120. In one configuration known as a double-gate-input GDI circuit (GDI*), the logic input terminals, 130 and 140, are not connected, and each logic block has an independent logic input. The GDI* circuit is discussed in greater detail below (see FIG. 8).

Figure 2:
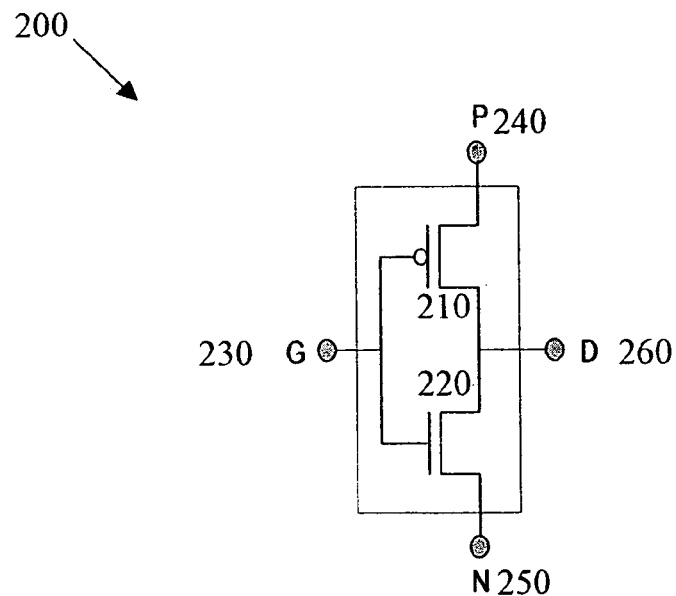

A dual-transistor embodiment of the GDI logic circuit is designated herein as the GDI logic cell. Reference is now made to FIG. 2, which is a simplified circuit diagram of a standard GDI logic cell, according to a preferred embodiment of the present invention. In the standard GDI logic cell 200, the p-type and n-type transistor networks each contain a single transistor, 210 and 220 respectively. The GDI cell has a common input terminal (G) 230 connected to the gates of both the NMOS and PMOS transistors, a first dedicated logic terminal (P) 240 at the outer diffusion node of the PMOS transistor, and a second dedicated logic terminal (N) 250 at the outer diffusion node of the NMOS transistor 220. The common diffusion logic terminal (D) 260 is connected to the inner diffusion nodes of both transistors. The first and second dedicated logic terminals, 240 and 250, and the common diffusion logic terminal 260 may be used as either input or output ports, depending on the circuit structure. FIG. 2 omits bulk connections, although such connections may be required for some transistor technologies, including CMOS. The circuit diagrams for the GDI logic circuits presented below have transistor bulk connections, and are therefore appropriate for technologies with four-terminal transistors (i.e. transistors having gate, drain, source and bulk terminals), such as twin-well CMOS and SOI. Bulk connections may not be needed for some transistor technologies, such as floating bulk SOI.

Table 1 shows six logic functions which can be implemented with a single GDI logic cell. The most general case is the multiplexer (MUX), where logic signal A is applied to the common input 230. Signal A selects one of the dedicated logic terminals, 240 or 250, and the logic cell outputs the selected logic signal at the common diffusion logic terminal 260. Other configurations listed in the table implement OR, AND, and inverter logic gates. The logic cell also implements the F1 function () and the F2 function (+). Both the F1 and F2 functions are complete logic families, which can be used to realize any possible logic function.

TABLE 1

| N (1st dedicat.) | P (2nd dedicat.) | G (Cmn.) | D | Function |
|---|---|---|---|---|
| Low | | | − | F1 |
| | High | | ⁻+ | F2 |
| High | | | + | OR |
| | Low | | | AND |
| C | | | $\overline{A}AB + AC$ | MUX |
| Low | High | | ⁻ | NOT |

Many of the logic circuits presented below are based on the F1 and F2 functions. The reasons for this are as follows. First, as mentioned, both F1 and F2 are complete logic families. Additionally, F1 is the only GDI function that can be used for higher level circuit design that can be realized in a standard n-well CMOS process. In the F1 function implementation, the bulks of all NMOS transistors are constantly and equally biased, since the N terminal (first dedicated logic terminal) is tied low for all logic input levels. In the other configurations listed in Table 1 the N terminal is either tied high (OR gate), or varies according to the logic input levels (F2, AND, and MUX). Similarly, F2 can be realized in p-well CMOS. Finally, when the N input is driven at a high logic level and the P input is at low logic level, the diodes between NMOS and PMOS bulks to the logic circuit output are directly polarized, and the two dedicated logic terminals are shorted together. Being driven in such a way causes static power dissipation and an output voltage Vout~$0.5V_{DD}$. Utilizing the OR, AND and MUX implementations, in standard CMOS with $V_{BS}=0$ configuration, as building blocks for more complex logic circuits is therefore problematic. The polarization effect can be reduced if the design is performed in floating-bulk SOI technologies, in which case floating-bulk effects have to be considered.

The GDI cell 200 differs significantly from the standard CMOS inverter, which it resembles structurally. Dedicated logic inputs 240 and 250 serve as logic signal inputs, not for applying pull-up and pull-down voltages as in the CMOS case. By extending the complementary structure to a three input structure, a much more versatile logic cell is obtained. A simple change of the input configuration of the GDI cell 200 corresponds to different Boolean functions. Most of these functions are complex (6-12 transistors) in CMOS, as well as in standard PTL implementations, but require only 2 transistors as a GDI logic circuit. Additionally, the bulks of transistors 210 and 220 may be connected to dedicated logic terminals 240 and 250 respectively, so that the transistors 210 and 220 can be arbitrarily biased. This is in contrast with a CMOS inverter, which cannot be biased.

The GDI cell structure provides advantages over both CMOS and PTL logic circuits in design complexity, transistor count and power dissipation. An operational analysis of the GDI logic cell is now presented, in which GDI circuit transient behavior, swing restoration, and switching characteristics are analyzed.

One of the common problems of PTL design methods is the low swing of output signals because of the threshold drop across the single-channel pass transistors. In existing PTL techniques additional buffering circuitry is used to overcome this problem. The following analysis of the low swing performance of the GDI cell is based on the F1 function, and can be easily extended for other GDI functions. Table 2 presents a full set of logic states and the related functionality modes for the F1 function.

TABLE 2

| G | P | Functionality | D |
|---|---|---|---|
| 0 | 0 | PMOS Trans Gate | $V_{Tp}$ |
| 0 | 1 | CMOS Inverter | 1 |
| 1 | 0 | NMOS Trans Gate | 0 |
| 1 | 1 | CMOS Inverter | 0 |

As can be seen from Table 2, G=0, P=0 is the only state where low swing occurs in the output value. In this case the voltage level of F1 is $V_{Tp}$ (instead of the expected 0V), because of the poor high-to-low transition characteristics of PMOS pass-transistors (see W. Al-Assadi, A. P. Jayasumana and Y. K. Malaiya, "Pass-transistor logic design", International Journal of Electronics, 1991, vol. 70, no. 4, pp. 739-749, contents of which are hereby incorporated by reference). The only case (from amongst all the possible transitions) where the effect occurs is the transition from G=0, P=$V_{DD}$ to G=0, P=0.

Note that in approximately half of the cases (for P=1) the GDI cell operates as a regular CMOS inverter, which is widely used as a digital buffer for logic level restoration. In some of these cases, when $V_{DD}$ is high and there is no swing drop from the previous stages, the GDI cell functions as an inverter buffer and recovers the voltage swing. Although this creates a self swing-restoration effect in certain cases, the GDI logic circuit embodiments shown below assume worst-case swing effects, and contain additional circuitry for swing restoration.

The exact transient analysis for basic GDI cell, in most cases, is similar to a standard CMOS inverter. CMOS transient analysis is widely presented in the literature. The classic analysis is based on the Shockley model, where the drain current $I_D$ is expressed as follows:

$$I_D = \begin{cases} I_{D0}\left(\frac{W}{L}\right)A^{\left(\frac{qV_{GS}}{kT}\right)}(V_{GS} \leq V_{TH}: \text{sub-threshold region}) \\ K\{(V_{GS} - V_{TH})V_{DS} - 0.5V_{DS}^2\}(V_{DS} < V_{GS} - V_{TH}: \text{linear region}) \\ 0.5K(V_{GS} - V_{TH})^2(V_{DS} \geq V_{GS} - V_{TH}: \text{saturation region}) \end{cases} \quad (1)$$

where K is a drivability factor, $V_{TH}$ is a threshold voltage, W is a channel width and L is a channel length.

In contrast with the CMOS inverter analysis (see V. Adler, E. G. Friedman, "Delay and Power Expressions for a CMOS Inverter Driving a Resistive-Capacitive Load", Analog Integrated Circuits and Signal Processing, 14, 1997, pp. 29-39, contents of which are hereby incorporated by reference), where $V_{GS}$ is used as an input voltage, in most GDI circuits the voltage input variable to the Shockley model is $V_{DS}$, the drain-source voltage. The following analysis presents the aspects in which GDI differs from CMOS.

Figure 3:
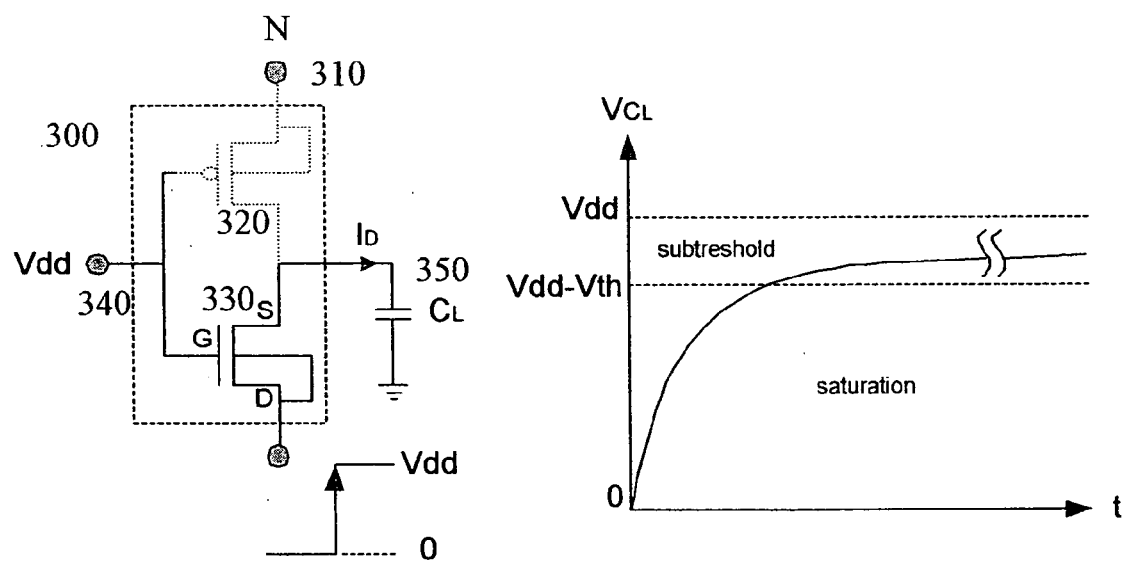

Reference is now made to FIG. 3, which shows the GDI circuit diagram and transient response when a step signal is supplied to the first dedicated logic terminal 310 of the GDI cell 300. The applied step signal causes a response, during which the NMOS transistor 330 passes from the saturation to the sub-threshold region, and a swing drop in output occurs. The transient analysis assumes a fast input transition, so that the linear region is ignored. Analytical expressions that describe the transient response can be derived from (1), for a capacitive load, $C_L$ 350, at the output. The capacitive current is:

$$I_C = C\frac{dV_s}{dt} = I_D \quad (2)$$

where C is the output capacitance, $V_S$ is the voltage across the capacitance $C_L$. $I_C$ is the current charging the capacitor, which is equal to $I_D$, the drain current through the N-channel device.

The expression for $V_S$ as a function of time is:
In the saturation region:

$$C\frac{dV_s}{dt} = 0.5k(V_{GS} - V_T)^2 = 0.5k(V_{DD} - V_T - V_S)^2 \quad (3)$$

where, in the case of GDI cells linked through diffusion inputs, the capacitance C includes both diffusion and well capacitances of the driven cell.

The integral form of (3) is:

$$\int \frac{dV_S}{0.5k(V_{DD} - V_T - V_S)^2} = \int \frac{dt}{C} \quad (4)$$

The same expression can be written as:

$$\int \frac{dV_S}{aV_S^2 + bV_S + c} = \int dt \quad (5)$$

where $$a = \frac{0.5k}{C}, b = \frac{-k(V_{DD} - V_T)}{C}, c = \frac{0.5k(V_{dd} - V_T)^2}{C} \quad (6)$$

a, b and c in (6) are constants of the process or the given circuit. The final expression for the transient response in the saturation region is:

$$t + k_1 = \frac{1}{\sqrt{b^2 - 4ac}} \ln\left(\frac{2aV_s + b - \sqrt{b^2 4ac}}{2aV_s + b + \sqrt{b^2 4ac}}\right) \quad (7)$$

where t is time in saturation region, and $k_1$ is a constant of integration and is calculated for initial conditions (t=0, $V_S$=0). The solution of (7) is obtained numerically (e.g. in MATLAB) for specific values of a, b, and c.

After entering the sub-threshold region, $V_S$ continues rising while the output capacitance is charged by $I_D$ according to (1):
In the sub-threshold region:

$$C\frac{dV_s}{dt} = I_{D0}\left(\frac{W}{L}\right)l^{\left(\frac{qV_{GS}}{kT}\right)} = I_{D0}\left(\frac{W}{L}\right)\frac{l^{\left(\frac{qV_{DD}}{kT}\right)}}{\left(\frac{qV_S}{kT}\right)} \quad (8)$$

-continued $$\int dV_S l^{\left(\frac{qV_S}{kT}\right)} \cdot A = \int dt \quad (9)$$

where T is the temperature in degrees Kelvin, k is Boltzmann's constant, q is the charge of an electron, and A is a constant:

$$A = \frac{C}{I_{D0}\left(\frac{W}{L}\right)l^{\left(\frac{qV_{DD}}{kT}\right)}} \quad (10)$$

The expression for the response in the sub-threshold region is:

$$t + k_2 = \frac{l^{\left(\frac{qV_S}{kT}\right)}}{q/kT} \cdot A \quad (11)$$

$$k_2 = \frac{l^{\left(\frac{q(V_{DD} - V_T)}{kT}\right)}}{q/kT} \cdot A \quad (12)$$

where $k_2$ is a constant of integration defined by the initial conditions, A is calculated in (10), and $V_T$ is the threshold voltage.

The analysis of propagation delay of a basic GDI cell given by equations (2-7) can be refined by taking into account the effect of the diode between the NMOS source and body. This diode is forward biased during the transient (see FIG. 2). By conducting an additional current, the diode contributes to charging the output capacitance $C_L$. The diode's current contribution can be calculated as:

$$I_{BS} = I_0(l^{q[V_{DD} - V_S]/nkT} - 1) \quad (13)$$

where $I_{BS}$ is the diode current, $I_0$ is the reverse current, and n is a factor between 1 and 2. The $I_{BS}$ current should be added to equation (2) to derive an improved propagation delay, indicating a faster transient operation of GDI cell.

The swing restoration performance of GDI circuits is calculated taking into account the area (power) and circuit frequency (delay) constraints. The simplest method of swing restoration is to add a buffer stage after every GDI cell. The addition of a buffer stage prevents the voltage drop, but requires greater GDI circuit area and increases circuit delay and power dissipation, making such a simplified method highly inefficient. Various buffering techniques are presented in the literature.

Given a clocked logic circuit with known $T_{cycle}$ and $T_{setup}$, buffering of cascaded GDI cells is optimal if the following effects are taken into consideration:

1. Successive Swing Restoration—When cascading GDI cells, each cell contributes a voltage drop in the output, that is equal to $V_{drop}$. Assuming 0.3 $V_{DD}$ as a maximal allowed voltage drop of the whole cascade, the number of linked GDI cells between two buffers is limited by:

$$N_1 = \frac{0.3 V_{DD}}{V_{drop}} \quad (14)$$

As shown in FIG. 3, after exiting the saturation area, the value of $V_{drop}$ is equal to $V_{TH}$, and decreases with time as follows, using (9):

$$V_{drop} = V_{DD} - V_S = V_{DD} - \frac{\ln\left(\frac{(t+k_2)\cdot q/kT}{A}\right)}{q/kT} \quad (15)$$

Equation (15) applies to the sub-threshold region only, namely for $V_S < V_{DD}$.

Figure 4:
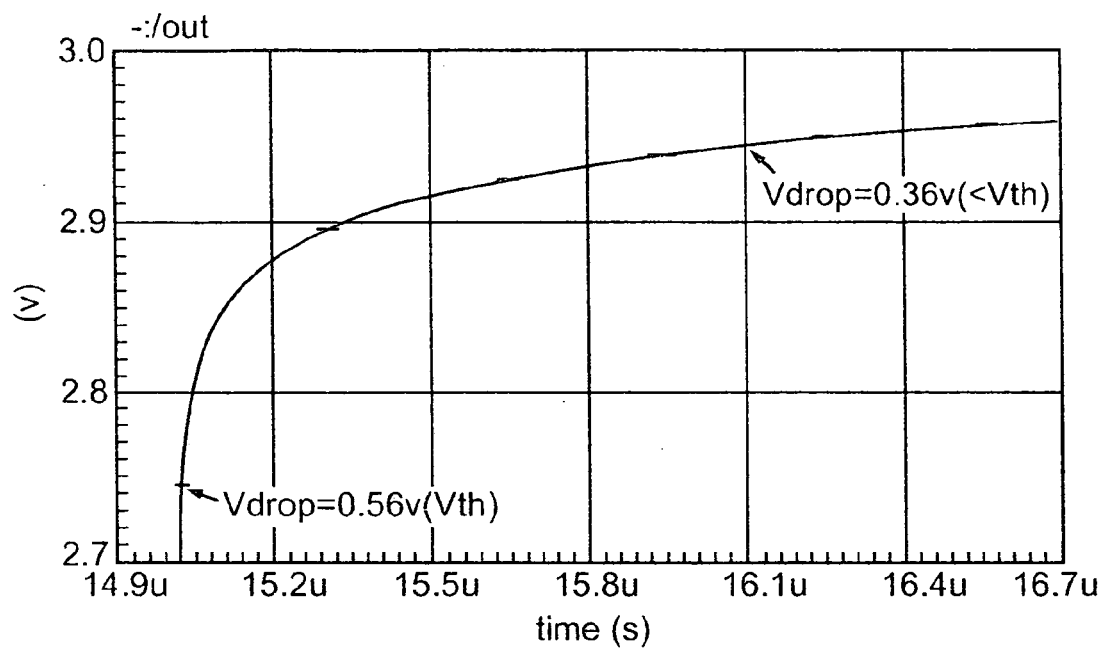

According to (15), remaining in the sub-threshold region for $(t+k_2)$ assures a significant decrease of $V_{drop}$, and as a result an increase in the number of linked cells, $N_1$. Successive swing restoration can thus be achieved with fewer buffers. FIG. 4 presents Cadence Spectre simulation results of the response of a GDI AND gate to a 0-3.3 V step input, for a gate operating in the sub-threshold region with a $V_{DD}$ of 3.3 V.

Interconnection effects can cause a drop in signal potential level, particularly over long interconnects. Where maintaining signal levels is essential, expression (15) may be extended to take into account the interconnection drop IR (where R is the interconnect resistance and I is the current through the interconnect).

Accordingly, suppose the $V_{DD}$ voltage is applied to the drain input of the NMOS transistor through a long wire. For a wire with given width, W, and length, L, the resistance of the interconnect wire is given by:

$$R = \rho_{square} \cdot \frac{L_{wire}}{W_{wire}} \quad (16)$$

where $\rho_{square}$ is a metal sheet resistance per square.

The current flowing through the wire $I_{wire}$ and causing the voltage drop is given by:

$$I_{wire} = \frac{V_{DD} - V_{drain}}{R} \quad (17)$$

$V_{drain}$ is determined by the equalization between the wire and NMOS transistor currents as follows:

$$\frac{V_{DD} - V_{drain}}{R} = I_D(V_{drain}) \quad (18)$$

where $I_D(V_{drain})$ is found from (1) according to the operation region of the transistor. Equation (18) can be solved numerically, and its contribution to the final voltage drop expression is given by:

$$V'_{drop} = V_{drop} + (V_{DD} - V_{drain}) \quad (19)$$

where $V_{drop}$ is given by (15).

Operation in the sub-threshold region increases delay. The above method is therefore primarily suitable for low-frequency design.

Scaling, namely $V_{DD}$ reduction and threshold non-scalability, influences the number of required buffers for GDI circuit architecture according to (14). As a result, in order to remain with the same technology and $V_T$ when operating with lower supply voltages additional buffers may be required. The direct impact of adding buffers is primarily on circuit area and the number of gates.

Finally, the following points are noted concerning the buffer insertion topology in GDI. Buffer insertion need be considered only when linking GDI cells through diffusion inputs. No buffers are needed before gate inputs of GDI cells. Due to this feature, the "mixed path" topology can be used as an efficient method for buffer insertion. The number of buffers may be reduced by alternately involving diffusion and gate inputs in a given signal path. The circuit designer can trade off between buffer insertion, and delay, area and power consumption, to achieve efficient swing restoration.

2. Impacts of process variation on swing restoration—In every VLSI process there are variations in parameters such as threshold tracking, and $I_{D0}$. The process dependence of $V_{TH}$ and $I_{D0}$ influences the value of $V_{drop}$ and the swing restoration in GDI. This effect can be best described by defining a sensitivity of $V_{drop}$ to the mentioned parameter variations as follows:

$$\text{Current sensitivity of } V_{drop} = \frac{\partial V'_{drop}}{\partial I_{D0}} \quad (20)$$

$$\text{Threshold sensitivity of } V_{drop} = \frac{\partial V'_{drop}}{\partial V_{TH}} \quad (21)$$

where $V'_{drop}$ is given by (19).

Figure 5:
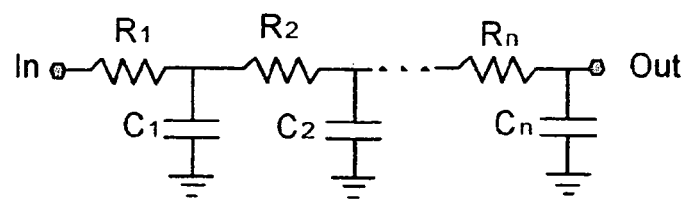

3. Maximal cascade delay constraint—The signal path in a cascade of GDI cells can be represented by a single-branch RC tree. FIG. 5 shows a GDI cascade represented as an RC tree, where $R_i$ are the effective resistances of the conducting transistors, and $C_i$ are the capacitive loads caused by following devices.

A resistance $R_{jj}$ is defined as the resistance of the path between the input and the output (for an RC tree without side branches). $R_{kk}$ is the resistance between the input and node k. $C_k$ is the capacitance at node k.

The following times are defined in order to derive bounds for the delay of the RC tree:

$$T_D = \sum_k R_{kk} C \quad (22)$$

$$T_R = \left(\sum_k R_{kk}^2 C_k\right) / R_{ii} \quad (23)$$

The maximal delay of the RC tree can be derived numerically from the bounds on the time of equations (22) and (23), and is given by the following equation:

$$t \leq T_D - T_R - T_D \ln[1 - v_i(t)] \quad (24)$$

The number of stages $N_2$ in a GDI cascade can be found for a maximal total delay time $T_{delay}$, while using the condition:

$$T_{cycle} - T_{setup} \geq T_{delay} \quad (25)$$

Notice that (25) can be checked only after a value for $N_2$ has been assumed and a suitable RC tree has been built.

In order to obtain satisfactory performance the number of stages between buffers should be limited to satisfy both the successive swing restoration and the maximal delay requirements. The maximal number of stages in cascade between two buffers is therefore the minimal value between N1 (given by (14)) and N2.

A comparison was also made between the switching characteristics of GDI vs. CMOS. Due to the complexity of logic functions that can be implemented in GDI cell by using only two transistors, the GDI cell's switching characteristics were compared to a CMOS gate whose logic function is of the same order of complexity. While the GDI cell's structural characteristics are close to a standard CMOS inverter, the gate with equivalent functional complexity in CMOS is a NAND gate. A comparison of switching characteristics was therefore performed between the GDI cell and a CMOS NAND gate. The switching behavior of the inverter can be generalized by examining the parasitic capacitances and resistances associated with the inverter. This comparison can be used as a base for delay estimation in early stages of circuit design.

Figure 6:
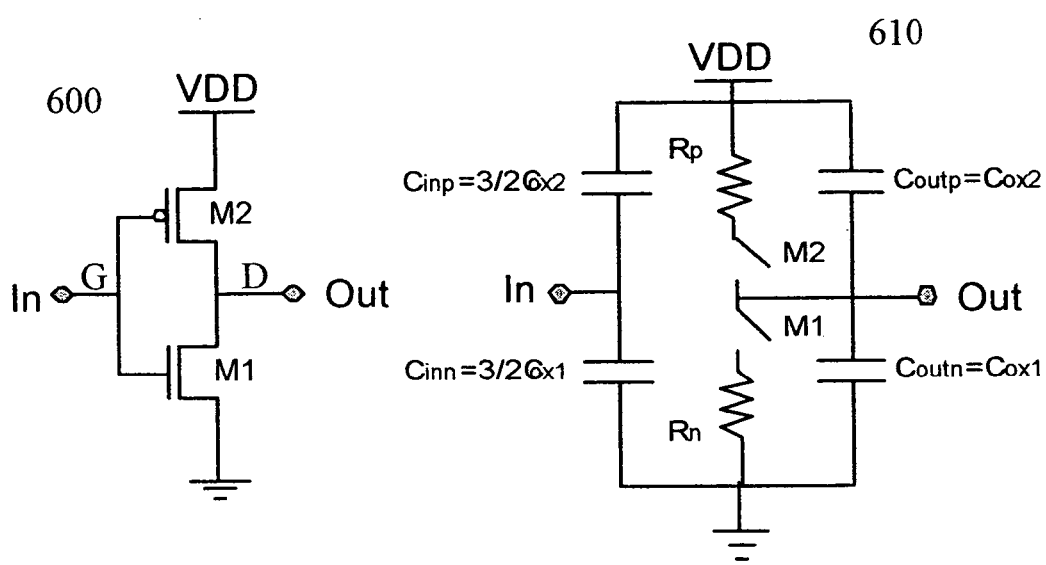

Reference is now made to FIG. 6, which shows the structure of a GDI (or prior-art CMOS) inverter 600, along with its equivalent digital model 610. The digital model of the GDI inverter consists of three parallel branches between $V_{DD}$ and ground. Two of the branches each consist of two capacitors in series ($C_{inn}$ and $C_{inp}$ for the first branch, and $C_{outn}$ and $C_{outp}$ for the second branch), with an inverter input between $C_{inn}$ and $C_{inp}$. The third branch consists of two resistors ($R_n$ and $R_p$) in series, with the inverter output between the two resistors. The propagation delay for an inverter driving a capacitive load is:

$$t_{PHL} = R_n \cdot C_{tot} = R_n \cdot (C_{out} + C_{load}) \quad (26)$$

where $C_{tot}$ is the total capacitance on the output of the inverter, that is the sum of the output capacitance of the inverter, any capacitance of interconnecting lines, and the input capacitance of the following gate(s).

Figure 7:
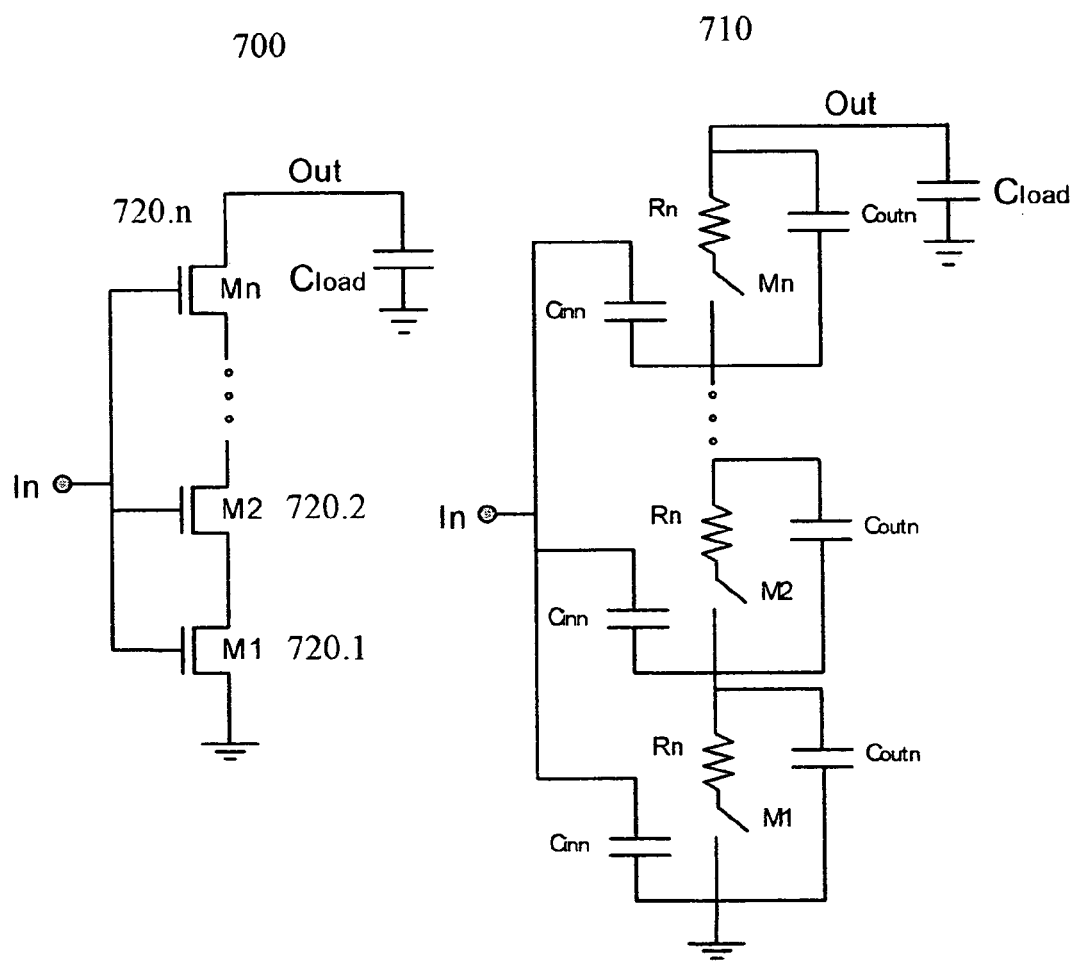

Reference is now made to FIG. 7 which shows a circuit diagram of a CMOS NAND gate 700, along with its equivalent digital model 710. The NAND gate consists of identical n-channel metal-oxide-semiconductor FETs (MOSFETs), 720.1 to 720.n, connected in series. As shown in R. J. Baker, H. W. Li and D. E. Boyce, "CMOS Circuit Design, Layout, and Simulation", IEEE Press Series on Microelectronic Systems, pp. 205-242, contents of which are hereby incorporated by reference, the intrinsic switching time of series-connected MOSFETs with an external load capacitance may be estimated by:

$$t_{PHL} = N \cdot R_n \cdot \left(\frac{C_{out}}{N} + C_{load}\right) + 0.35 \cdot R_n \cdot C_{inn}(N-1)^2 \quad (27)$$

The first term in (27) represents the intrinsic switching time of the series connection of N MOSFETs, while the second term represents the RC delay caused by $R_n$ charging $C_{inn}$.

For $C_{inn}$ equal to $\frac{3}{2} \cdot Co$, and assuming two serial n-MOS transistors, the propagation delay of the NAND gate is:

$$t_{PHL} = 1.52 \cdot R_n \cdot C_{out} + 2 \cdot R_n \cdot C_{load} \quad (28)$$

The ratio of the delay of a CMOS NAND to the delay of a GDI cell is $$\frac{t_{PHL(CMOS)}}{t_{PHL(GDI)}},$$

and is approximated by:

$$1.52 \le \frac{t_{PHL(CMOS)}}{t_{PHL(GDI)}} \le 2 \quad (29)$$

The delay ratio is bounded above by 2 for a high load, and is bounded below at 1.52 for a low load.

Note, that this ratio improves if the effect of the body-source diode in GDI cell is considered (14), and if the delay formula in (7) is refined by including a bulk-source conduction current in (13).

For the analysis of fan-out bounds, the dual-transistor GDI cell is compared to CMOS gates with equivalent functional complexity. This approach allows definition of fan-out bounds using the logic-effort concept of I. Sutherland, B. Sproull and D. Harris, "Logical Effort—Designing Fast CMOS Circuits", Morgan Kaufmann Publishers, p. 7, contents of which are hereby incorporated by reference. The relationship between the logic effort, fan-out, and effort delay of a logic gate is given by:

$$f = g \cdot h \quad (30)$$

where f is the effort delay, g is the logic effort, and h represents the fan-out of the gate. For a desired delay, reducing the logic effort results in an improved fan-out by the same ratio.

Values of logic effort are given by Sutherland for the inputs of various static CMOS gates normalized relative to the logic effort of an inverter. While a GDI cell's logic effort is close to a standard inverter, the equivalent logic functions in CMOS are NAND, NOR or MUX, depending upon the GDI cell input configuration (see Table 1). Using Sutherland's logic effort values, the fan-out improvement factor for a GDI cell over CMOS are as follows: 4/3 for F1 and F2 vs. CMOS NAND; 5/3 for F1 and F2 vs. CMOS NOR; 2 for GDI MUX vs. CMOS MUX.

The above fan-out improvement values are correct for the gate input of a GDI cell, for which the GDI cell characteristics are similar to those of the CMOS inverter. If the diffusion input is considered, an additional factor is applied to represent the capacitance ratio between the gate and diffusion inputs, and the factors given above are multiplied by $C_{Gate}/C_{Diff}$. Both capacitance parameters are defined by the design technology.

GDI cell fan-in analysis is based on the structural similarity of GDI and complementary CMOS logic gates. As shown below, an (n+2)-input GDI cell can be implemented by the extension of any n-input CMOS structure. While the stack of serial MOSFET devices and in CMOS gate fan-in are limited by body-effect considerations, the addition of the diffusion inputs (i.e. the dedicated logic terminals) for a GDI gate with the same structure results in improved fan-in, given by:

$$\text{Fan-in}_{GDI} = \text{Fan-in}_{CMOS} + 2 \quad (31)$$

Note that for the F1 and F2 functions, where only one additional dedicated diffusion input is used, the fan-in increases by 1 relative to CMOS.

In summary, the GDI logic cell shows improvement over comparable CMOS logic in terms of delay, number of transistors, area, and power consumption. GDI logic circuits, however, have certain drawbacks, which are primarily related to input connections to MOSFET wells. Firstly, GDI logic circuits may experience a threshold drop, and, in some cases, an increased diffusion input capacitance. Both effects exist in PTL techniques as well, and were considered in the simulations and analysis presented herein. Secondly, there is a relative increase of circuit area due to separated MOSFET wells (comparisons based on actual logic gate layouts are presented below). However, these drawbacks are compensated for by the advantages of GDI circuits.

Figure 8:
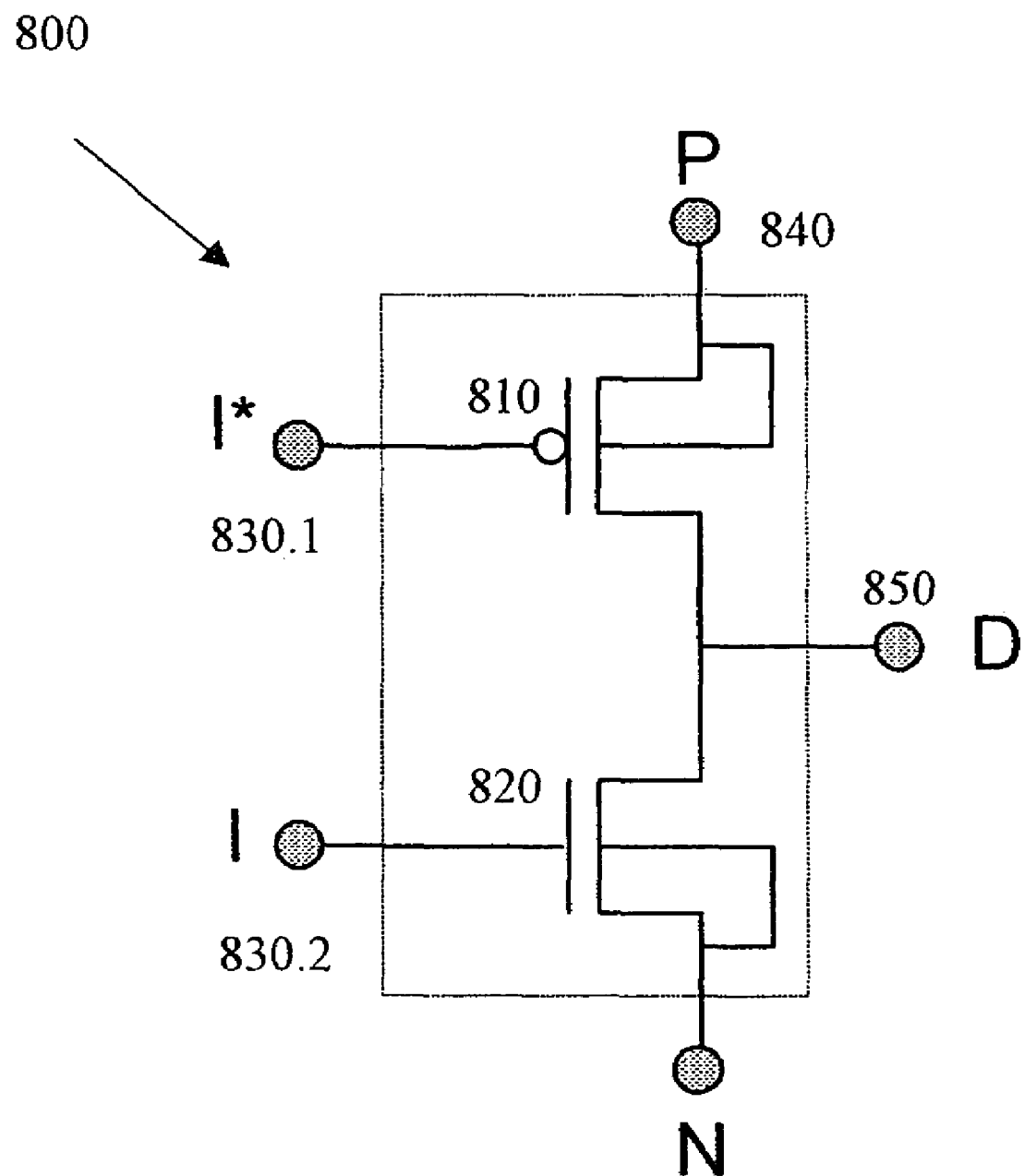

The GDI cell shown in FIG. 2 has a connection between the two common logic terminals connection. Reference is now made to FIG. 8, which is a circuit diagram of a logic circuit having separate common logic terminals, according to a preferred embodiment of the present invention. The logic cell of FIG. 8 is designated herein as a double-gate-input GDI cell (GDI*). The GDI* logic cell 800 has two transistor networks, p-type networks 810 and n-type transistor network 820, which each contain a single transistor. The GDI* cell has two logic input terminals, I (830.1) and I* (830.2), which are connected to the gates of the PMOS and NMOS transistors respectively, a first dedicated logic terminal (P) 840 at the outer diffusion node of the PMOS transistor, and a second dedicated logic terminal (N) 850 at the outer diffusion node of the NMOS transistor 820. The common diffusion logic terminal (D) 850 is connected to the drains of both transistors. As shown in FIG. 8, in the GDI* logic cell there is a separate input to each gate, I and I', instead of a common input to the gates of both p-type and n-type transistors as in FIG. 2. For proper operation, the common logic inputs, I and I', are provided with mutually exclusive signals. Ensuring that the input signals are mutually exclusive can be achieved by an appropriate circuit environment, as in GDI-latch, or by applying an inverter to one of the inputs.

Figure 9:
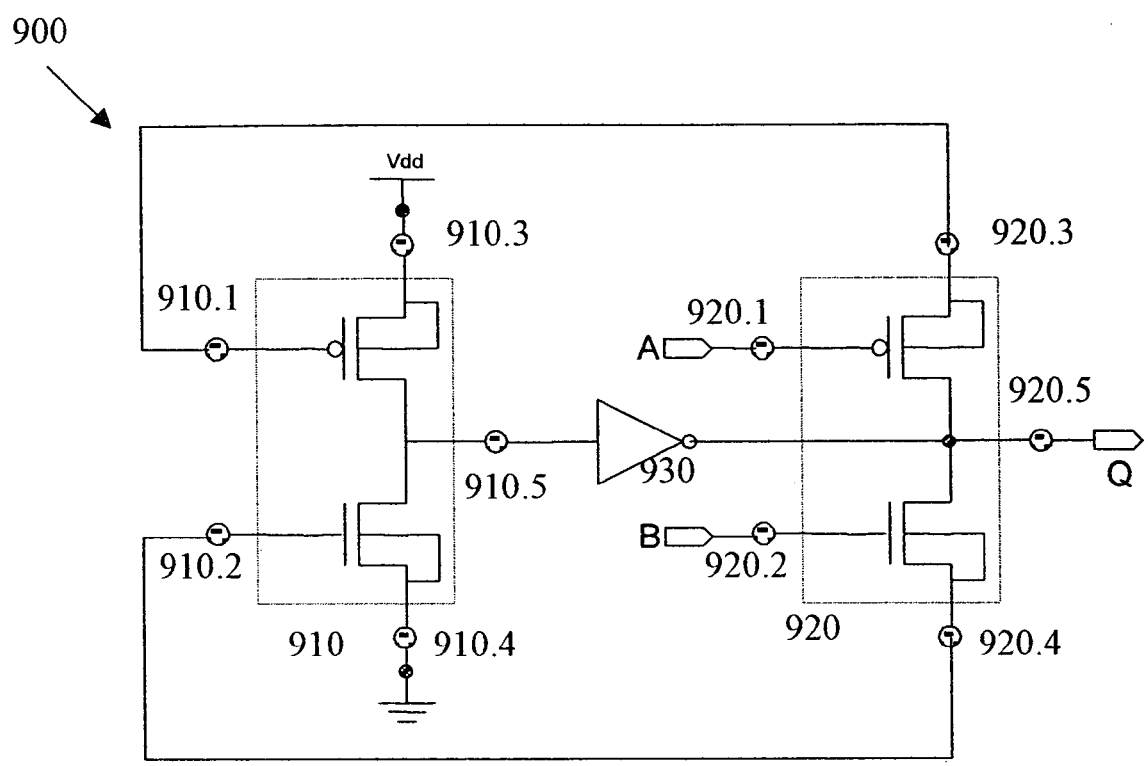

Reference is now made to FIG. 9, which shows the structure of a preferred embodiment of a latch based upon the GDI* cell of FIG. 8. The latch consists of two GDI* cells, 910 and 920, and inverter 930, with logic inputs at logic terminals 920.1 and 920.2 respectively. The logic output is at the common diffusion terminal 920.5 of GDI* cell 920. The two cells are connected by inverter 930, through which the common diffusion outputs, 910.5 and 920.5, of the two cells are connected. The two dedicated logic terminals, 920.3 and 920.4, of GDI* cell 920 are respectively connected to logic inputs 910.1 and 910.2 of the GDI* cell 910. Dedicated logic terminals, 910.3 and 910.4, of GDI* cell 910 are tied to $V_{DD}$ and ground respectively.

In the GDI* latch an inverter is used to obtain in-circuit swing restoration. Table 3 shows the performance of the GDI* latch.

TABLE 3

| A | B | Q |
|---|---|---|
| 0 | 0 | no change |
| 0 | 1 | Q' |
| 1 | 0 | no change |
| 1 | 1 | no change |

Figure 10A:
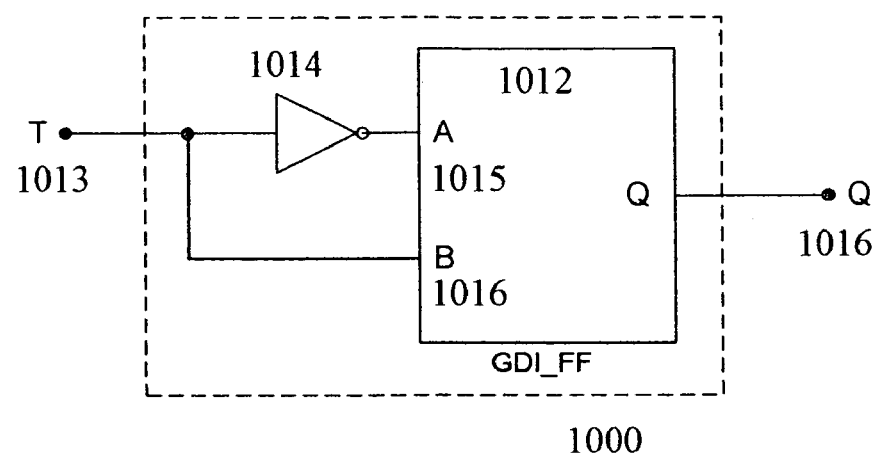

Reference is now made to FIGS. 10a-10e, which are simplified diagrams of GDI latches, according to preferred embodiments the present invention. FIG. 10a shows a T-latch based upon the GDI* latch of FIG. 9. T-Latch 1000 consists of a GDI flip-flop 1012 and inverter 1014. The logic signal is input at terminal T 1013, and is fed through inverter 1014 to input A 1015 of TFF 1000, and directly to input B 1016 of flip-flop 1012. The inputs of the T-Latch are connected through inverter 1014, so that an efficient 8-transistors implementation is achieved.

Figure 10B:
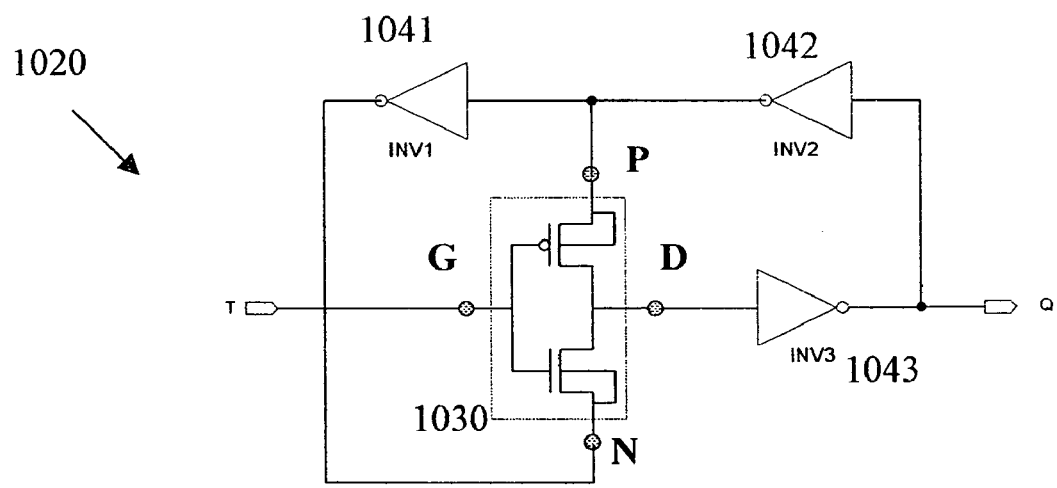

Reference is now made to FIG. 10b, which shows a preferred embodiment of a T-latch 1020 based on the standard GDI cell. FIG. 10b is a circuit diagram of a GDI T-latch, according to a preferred embodiment of the present invention. T-latch 1020 consists of GDI cell 1030, and three inverters 1041 to 1043. The logic signal is input to the common logic input (G) of GDI cell 1030. The output at the common diffusion terminal (D) of GDI cell 1030 is connected to the T-Latch output Q via inverter 1043. Inverters 1041 and 1042 feed back the output signal to the dedicated logic terminals (P and N) of GDI cell 1030. Note that in FIG. 10b inverters INV2 1042 and INV3 1043 are added for swing restoration and can be eliminated in zero-$V_{TH}$ technologies. In any case the implementation is effective, and more compact than CMOS alternatives. The presented circuit can be extended to TFF by adding an edge detector circuit containing two GDI cells (NOT and AND).

Figure 10C:
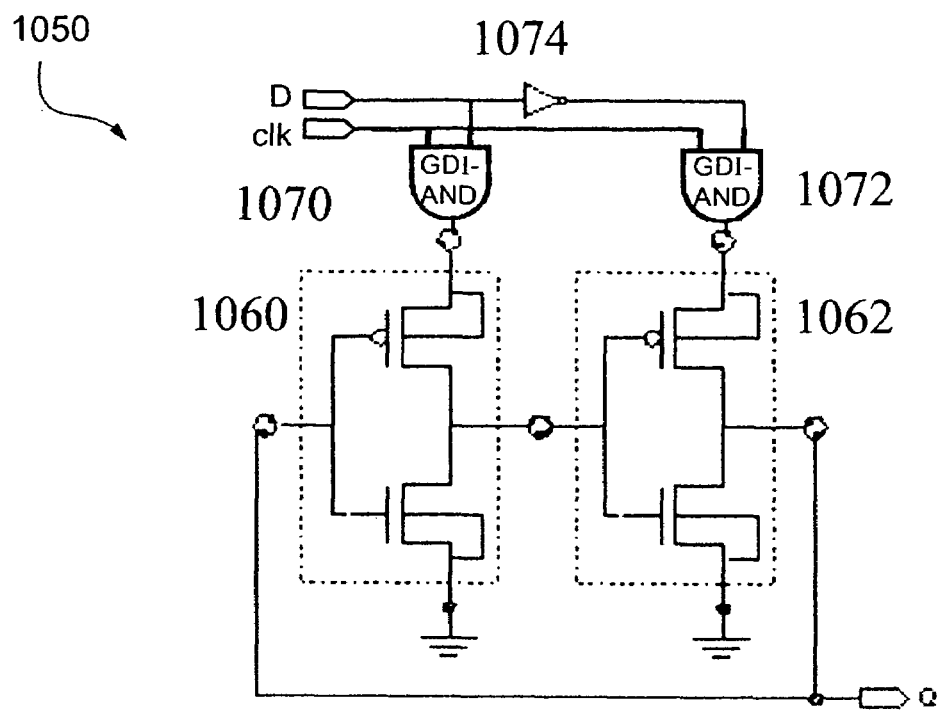
Figure 10D:
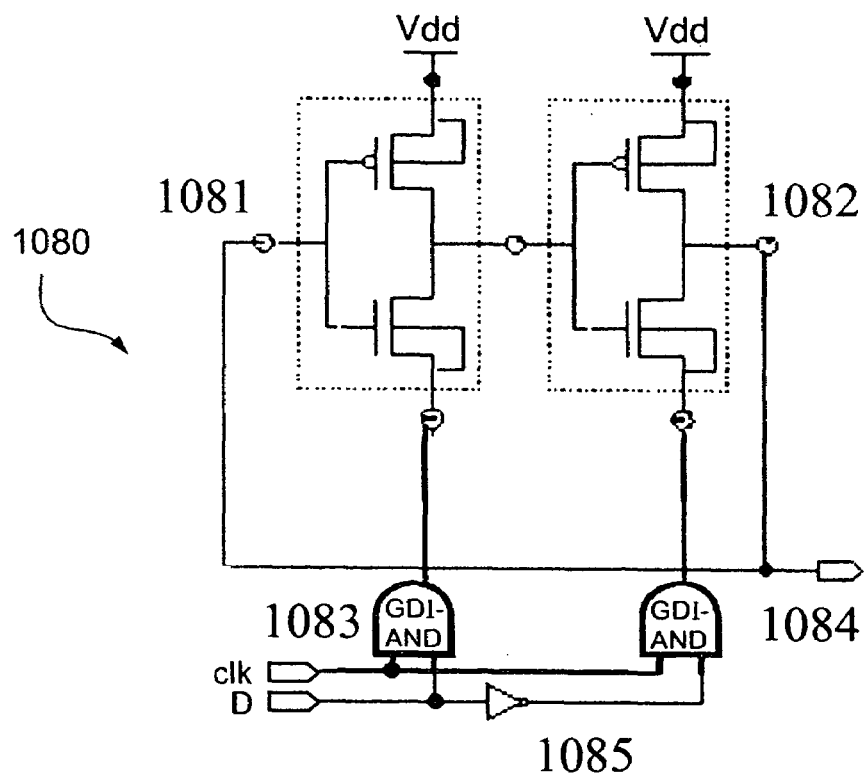
Figure 10E:
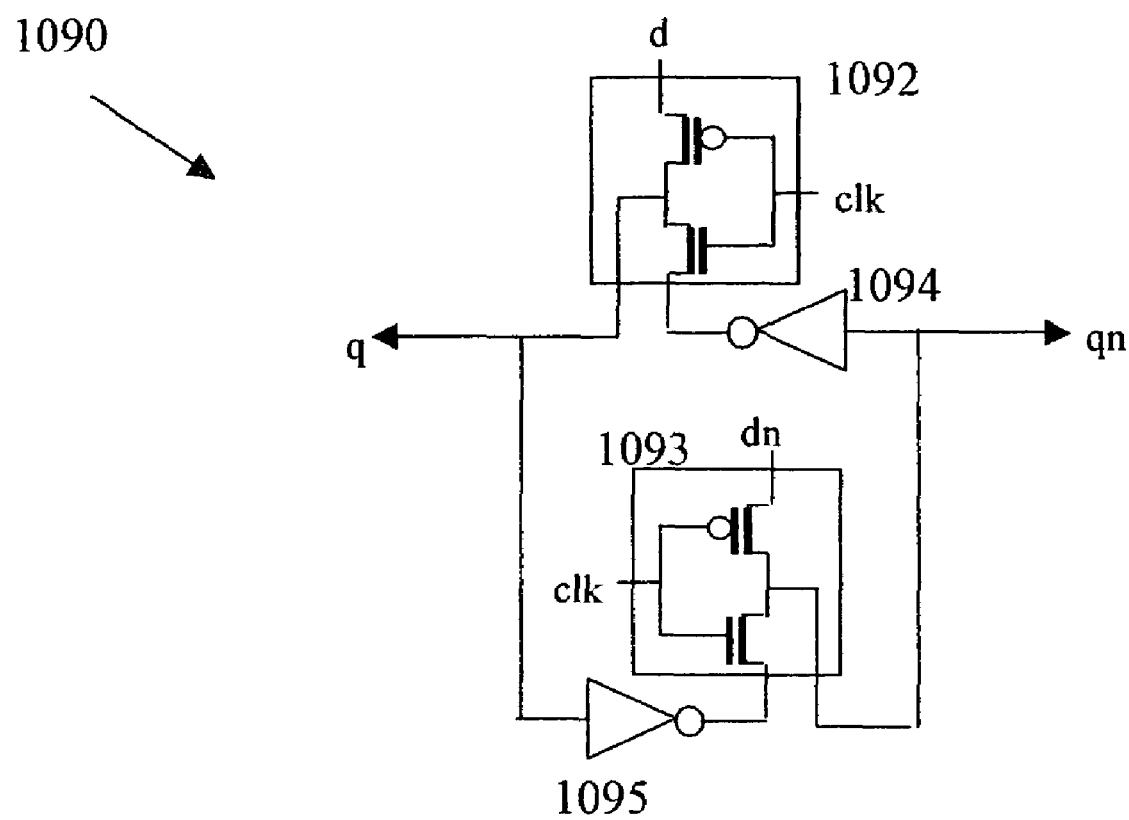

Three GDI D latches are shown FIGS. 10c, 10d, and 10e. Reference is now made to FIG. 10c which shows the structure of a GDI F1-based D-latch 1050, according to a preferred embodiment of the present invention. This circuit is compatible for implementation in standard CMOS technology. D-latch 1050 consists of two GDI cells, 1060 and 1062, AND gates, 1070 and 1072, and inverter 1074. The common diffusion terminal of GDI cell 1060 is connected to the common logic input of GDI cell 1062. The D and CLK latch inputs are connected via AND gates 1070 and 1072, and inverter 1074 to the first dedicated logic terminals of the GDI cells, 1060 and 1062. The second dedicated logic terminals of the GDI cells, 1060 and 1062, are tied to ground.

Reference is now made to FIG. 10d which shows the structure of a GDI F2-based D-latch 1070, according to a preferred embodiment of the present invention. D-latch 1070 is structured similarly to D-latch 1050 of FIG. 10c, but has the AND gate outputs connected to the second dedicated logic terminals of the two GDI cells, and the first dedicated logic terminals tied high.

Reference is now made to FIG. 10e which shows the structure of a GDI D-Latch based on general GDI cells, according to a preferred embodiment of the present invention. D-latch 1090 consists of two GDI cells, 1092 and 1093, and inverters, 1094 and 1095. Inverter 1094 is connected between the common diffusion output of GDI cell 1093 and the second dedicated logic terminal of GDI cell 1092. Inverter 1095 is connected between the common diffusion terminal of GDI cell 1092 and the second dedicated logic terminal of GDI cell 1093. The D-latch inputs and outputs are at the first dedicated logic terminals of the two GDI cells, 1092 and 1093, and the inverter inputs. Note that D-latch 1050 and D-latch 1080 latch on the falling edge of the clock, and that D-latch 1090 latches on the rising edge of the clock. The edge used to latch the data is selected by the circuit designer by providing the proper logic at the clock input.

The preferred embodiments of FIGS. 2-10 are based on a dual-transistor GDI (or GDI*) logic cell, which has a single transistor in each of the two logic blocks. In the preferred embodiment, the multi-transistor GDI logic circuit, each logic block contains a transistor network composed of multiple transistors. The logic blocks may have more than one common logic input, where each additional common logic terminal is connected to the gates of complementary transistors in both of the transistor networks.

Table 1 lists the various logic functions which can be provided by a single GDI cell. The GDI cell is an extension of a single-input CMOS inverter structure a triple-input logic structure. The two additional inputs of the GDI cell are provided by the first and second dedicated logic terminals, which in the CMOS cell do not serve as logic terminals but instead are tied to a fixed voltage.

Figure 11:
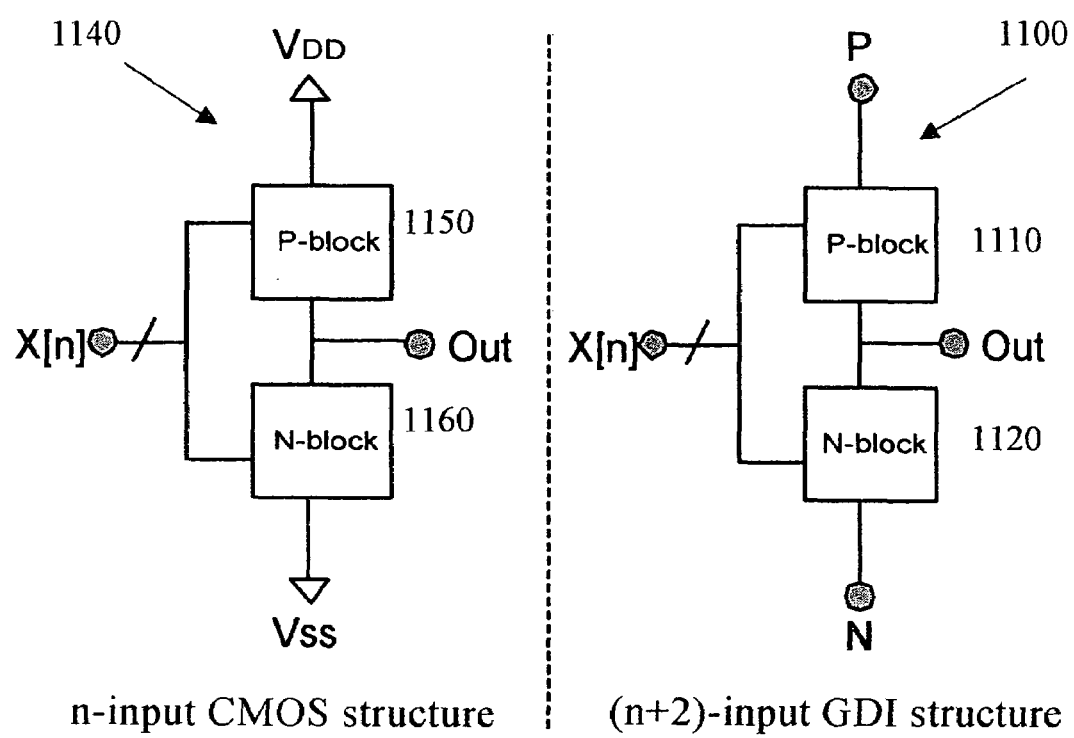

Reference is now made to FIG. 11 which is a simplified block diagram of a comparison between an n-input CMOS logic gate and an (n+2)-input GDI logic circuit, according to a preferred embodiment of the present invention. GDI circuit 1100 consists of two n-input logic blocks, 1110 and 1120, with additional logic inputs at the P and N terminals, yielding a total of n+2 logic inputs. CMOS circuit 1140 is similarly composed of two n-input logic blocks, 1150 and 1160, however the P and N terminals are tied to $V_{DD}$ and $V_{SS}$ respectively, and do not serve as logic terminals. Extension of any n-input CMOS structure to an (n+2)-input GDI cell can be done by introducing a logic input at the first dedicated logic terminal (P) of the PMOS block 1110 (instead of the supply voltage $V_{DD}$), and a second logic input at the second dedicated logic terminal (N) in the NMOS block 1120 (instead of $V_{SS}$). A GDI circuit having more than one transistor in the P and N logic blocks, 1120 and 1130, is designated herein as a multi-transistor GDI circuit. (A comparable extension can be made to any complementary transistor structure, and is not limited to CMOS.)

GDI circuit implementations can be represented by the following logic expression:

$$\text{Out} = \overline{F}(x_1 \ldots x_n)P + F(x_1 \ldots x_n)N \quad (32)$$

where F(x1 . . . xn) is the logic function of the n-MOS block (not of the whole original n-input CMOS structure). An example of such an extension can be seen in FIG. 12, which shows a GDI circuit 1200, having logic blocks 1210 and 1220, consisting of triple-input transistor networks (inputs A, B, and C). The two logic blocks implementing complementary logic functions. Since the P and N terminals GDI logic circuit 1200 serve as logic inputs, there are five logic terminals in all. A complementary CMOS logic circuit having the same structure would have only three logic inputs (A, B, and C).

The expression in equation (32) can be used to implement a Shannon expansion (see E. Shannon, W. Weaver, "The Mathematical Theory of Information", University of Illinois Press, Urbana—Champaign, Ill., 1969, contents of which are hereby incorporated by reference). A function Z with inputs $\{x1, \ldots, xn\}$ can be expanded as:

$$Z(x_1 \ldots x_n) = H(x_2 \ldots x_n)x_1 + J(x_2 \ldots x_n)\overline{x}_1 \quad (33)$$

where the functions H and J are:

$$H = Z|_{x_1=1}, \, J = Z|_{x_1=0} \quad (34)$$

Shannon expansion is a very useful technique for pre-computation-based low-power design of sequential logic circuits due to its multiplexing properties (see M. Alidina, J. Monteiro, S. Devadas, A. Ghosh, and M. Papaefthymiou, "Precomputation-Based Sequential Logic Optimization for Low Power", IEEE Transactions on Very Large Scale Integration (VLSI) Systems, vol. 2, no. 4, pp. 426-435, December 1994), contents of which are hereby incorporated by reference). In multiplexer-based precomputation, input X1 can be used as an enable line for the H and J functions, and as the select line of a multiplexer which chooses between the data of the H and J functions. For a given value of X1 only one of the H or J blocks will operate, significantly reducing the power dissipation of the circuit.

Reference is now made to FIG. 13, which is a simplified block diagram of an extended GDI circuit, according to a preferred embodiment of the present invention. The GDI architecture illustrated in FIG. 13 is based on equation (32). Extended GDI circuit 1300 consists of an n-input switching block 1330 (which may be either a GDI cell or a multi-transistor GDI circuit). Further logic inputs are provided to logic gates 1310 and 1320. The logic output of logic gate 1310 is connected to the first dedicated input of switching block 1330, and the logic output of logic gate 1320 is connected to the second dedicated input of switching block 1330. Extended GDI circuit 1300 operates essentially as a multiplexer, selecting between logic gate A 1310 and logic gate B 1310. Logic gates 1310 and 1320 implement functions A(Xn+1 . . . Xp) and B(Xp+1 . . . Xr) respectively, in any technologically compatible manner. Switching block 1330 connects between the logic gates and the following logic block C 1340. Depending on the value of F(x1 . . . xn), only one of the functions will drive the data computed as a result of its input transitions, while the data transitions from the other function are prevented from propagating to the next logic block C.

The GDI logic circuits (i.e. GDI cell, GDI* cell, multi-transistor GDI circuit, and extended GDI circuit) described above can serve as building blocks for more complex logic circuits. The applicability of the Shannon expansion (33 and 34) to any logic function, allows a GDI implementation of any digital circuit, thereby achieving a low power implementation of the logic function. Due to their special properties, GDI logic circuits can be used for design of low-power combinatorial circuits. In the preferred embodiment two or more GDI logic circuits are interconnected to form a higher order GDI logic circuit. Several embodiments of higher order logic circuits composed of interconnected GDI logic cells are given below, along with performance data.

A preferred embodiment of a method for the design of combinatorial logic circuits consisting of interlinked GDI cells is now presented. The combinatorial circuit design combines two approaches: (1) Shannon expansion and (2) combinational logic pre-computation, where transitions of logic values are prevented from propagating through the circuit if the final result does not change as a result of those transitions. GDI logic circuits can be realized using only the standard GDI cell. This is in contrast to PTL-based logic, which has no simple and universal cell library available. The development of circuit synthesis tools for PTL is consequently problematic.

The preferred embodiment for the design of GDI logic circuits is based on Shannon expansion (27), where any function F can be written as follows:

$$F(x_1 \ldots x_n) = x_1 H(x_2 \ldots x_n) + \overline{x}_1 G(x_2 \ldots x_n) \quad (35)$$
$$= x_1 F(1, x_2 \ldots x_n) + \overline{x}_1 F(0, x_2 \ldots x_n)$$

As shown above, the output function of a GDI cell (where A, B and C are inputs to G, P and N respectively) is:

$$\text{Out} = AC + \overline{A}B \quad (36)$$

The similarity of form between equations (35) and (36), makes the standard GDI cell suitable for implementation of any logic function, which can be written by Shannon expansion. Thus:

If $A = x_1$, $C = F(1, x_1 \ldots x_n)$, $B = F(0, x_1 \ldots x_n)$ then $$\text{Out} = F(x_1 \ldots x_n) = x_1 F(1, x_2 \ldots x_n) + \overline{x}_1 F(0, x_2 \ldots x_n) \quad (37)$$

Reference is now made to FIG. 14 which is a simplified flowchart of a recursive algorithm for implementing logic functions by GDI cells, according to a preferred embodiment of the present invention. The algorithm synthesizes any combinatorial function by means of 3-input GDI cells. The algorithm's steps may be summarized as follows:

Given a function F with n variables:

| | |
|---|---|
| Step 1400 | Check, if function F is equal to 1, 0 or a non-inverted single variable. |
| Step 1410 | If F is equal, provide a connection to a high logic signal, a connection to a low logic signal, or a logic input. |
| Step 1420 | If F is not equal, expand F into two functions H and J according to the Shannon expansion (35) of F for a selected variable Xn. |
| Step 1430 | Go to step 1400 to find GDI implementation for both H and G. |
| Step 1440 | Use a GDI cell MUX for F function implementation, with variable Xn at common input, and the H and J implementations each connected to a separate dedicated logic terminal. |

The algorithm of FIG. 14 can also be expressed in pseudo-code as follows, where $G(d1,g,d2)=not(g)*d1+g*d2$:

Algoritm SyntGDI(f,n)

```
If (f == 1) then return('1')
    else if (f == 0) then return('0')
        else return(G(SyntGDI(f|x_n=1),x_n, SyntGDI(f|x_n=0)));
```

As an example, if $F(x1,x2,x3)=XOR(x1,x2,x3)$, the above procedure returns:

NG(G(NG(0,x3,1),x2,NG(1,x3,0)),x1,G(NG(1,x3,0),
 x2,NG(0,x3,1)))

where 'G' stands for GDI and 'NG' for an inverted GDI cell that is inserted post-process in order to maintain signal integrity. This approach can be used in combination with existing cell library-based synthesis tools to achieve an optimized design.

Reference is now made to FIG. 15, which is a simplified flowchart of a method for designing a logic circuit, according to a preferred embodiment of the present invention. FIG. 15 presents the method of FIG. 14 in more detail, but essentially involves the same recursion, to progressively simplify the logic function. Each recursion reduces the number of function variables by one, until eventually the required function can be represented as an interconnected network of simple GDI multiplexing cells. Once a single variable representation has been reached, the recursion cycles end, combining the GDI cells into a structure that performs the specified logic function. The method thus provides a logic circuit design consisting of interconnected GDI logic cells. The logic cells are dual-transistor GDI cells, as shown in FIG. 2.

In step 1500 a logic function having at least one logic variable is received. The logic function to be synthesized, F, is set equal to the received logic function in step 1510. The synthesis recursion cycle begins at step 1515. In step 1520 the synthesized function is checked to determine if it is a non-inverted single logic variable X. If so, a connection for a logic input is provided in step 1525. The synthesis recursion cycle is then discontinued.

In step 1530 the synthesized function is checked to determine if it is a high logic level. If so, a logic design consisting of a connection to a high logic level is provided in step 1535. The synthesis recursion cycle is then discontinued.

In step 1540 the synthesized function is checked to determine if it is a low logic level. If so, a logic design consisting of a connection to a low logic level is provided in step 1545. The synthesis recursion cycle is then discontinued.

If the logic function being synthesized is not equal to either a high, low, or non-inverted logic variable, a Shannon expansion of F is performed to reduce the number of logic variables by one. In step 1550 a first logic function H, a second logic function J are extracted from a Shannon expansion of the synthesized function for a selected logic variable Xn. A recursion cycle is then performed for each of the extracted functions, to obtain a circuit design for functions H and J.

The recursion cycle for function H involves setting the synthesized function to H in step 1560, and entering a new recursion cycle at step 1515. When the recursion ends, a sub-circuit design of interconnected GDI cells is provided for function H.

Next a recursion cycle for function J is performed. In step 1570 the synthesized function is set to Z, and a new recursion cycle is entered at step 1515. When the recursion ends, a sub-circuit design of interconnected GDI cells is provided for function J.

In step 1580 the sub-circuit designs obtained for functions H and J are combined using a GDI cell. A final logic circuit design is provided consisting of a logic element with the selected logic variable at the common logic terminal G, the output of the first sub-circuit connected to the first dedicated logic terminal P, and the output of the second sub-circuit connected to a second dedicated logic terminal N. The logic circuit output is at the logic element common diffusion terminal. The synthesis recursion cycle then ends.

The Shannon expansion of the logic function being synthesized is performed in step 1550. Reference is now made to FIG. 16, which is a simplified flowchart of a method for extracting the first and second logic functions (H and J) from the synthesized function, according to a preferred embodiment of the present invention. In step 1600, H is extracted from F by setting the selected variable to High, that is $H=F\{X_1 \ldots Xm|Xn=1\}$. In step 1610, J is extracted from F by setting the selected variable to Low, that is $J=F\{X_1 \ldots Xm|Xn=0\}$.

In the preferred embodiment, the circuit design method includes the further step of inserting buffers into the logic circuit design. An analysis was presented above to determine the maximum number of GDI cells which can be cascaded without requiring a buffer to stabilize signal levels. Equations (14) and (25) are used to calculate the values of N1 and N2, and the maximal number of stages which can be cascaded between two buffers equals the minimal value between N1 and N2. N1 and N2 depend on process parameters, frequency demand, and output loads. For example, given a 0.35 um technology process (with $V_{TH}=0.5V$), a frequency demand of 40 MHz, and a load capacitance of 100 fF, the maximal number of stages is dictated by equation (14), where N1 is calculated with $V_{drop}=V_{TH}$. The resulting value indicates that a buffer is required after every two cascaded GDI cells. In the preferred embodiment, buffer elements are inserted between GDI cells to prevent the occurrence of chains that exceed a specified length. The buffer elements may consist of one or more inverters.

Reference is now made to FIG. 17, which is a simplified flowchart of a method for providing a GDI logic circuit, according to a preferred embodiment of the present invention. In step 1700 a GDI logic circuit is designed for a specified function by the method of FIG. 15. In step 1710 the required GDI cells are provided, and in step 1720 the GDI cells are connected as specified by the circuit design.

One advantage of the abovedescribed methods is the ability to calculate the maximal number of transistors needed for implementation of an n-input function, before the actual logic circuit design. The maximal number of transistors is calculated as:

$$M = 2 \cdot 2^{n-1} = 2 \cdot N = 2^n \qquad (38)$$

where M is the maximal number of transistors that are needed to implement the function, N is the maximal count of GDI cells and n is the number of variables in the given function. Knowledge of the maximal number of GDI cells required firmly determines the final maximal area of the circuit.

Using the Shannon expansion in regular logic circuits results in reduced power dissipation but requires significant area overhead. The area overhead is caused by the additional precomputation circuitry that is required. The Shannon-based GDI design does not require a special precomputation circuitry because of the MUX-like nature of the GDI cell, so that most area overhead is eliminated.

EXAMPLES

Reference is now made to the following examples, which together with the above descriptions illustrate the invention in a non-limiting fashion.

Simulations were performed to determine the relative performance of five GDI logic gates to other logic gate technologies. Five sets of comparisons were carried out on various logic gates, MUX, OR, AND, $F_1$, and $F_2$. Reference is now made to FIGS. 18a, 18b, and 18c, which show GDI XOR, AND, and OR gates respectively, and their equivalents in CMOS, TG, and NMOS Pass-Gate (N-PG) technologies. The cells were designed for a minimal number of transistors for each technique. A buffer was added to the N-PG cells, because of low swing of output voltage ($V_{drop} > 0.3 V_{DD}$). Most circuits were implemented with a W/L ratio of 3, to achieve the best power-delay performance. The logic circuits were designed at the transistor-level in a 0.35 μm twin-well CMOS technology (with $V_{TN} = 0.56V$ and $V_{TP} = -0.65V$). The circuits were simulated using Cadence Spectre at 3.3V, 40 Mhz and 27° C., with a load capacitance of 100 fF. In the simulations the well capacitance and other parasitic parameters were taken into account. Each set of comparisons includes a logic cell implemented in the four logic techniques: GDI, CMOS, Transmission Gate and n-MOS Pass Gate. The same logic value transitions were supplied to the inputs of the test circuits for each technique. Measured values apply to the transitions of inputs connected to the transistor gates, in order to achieve a consistent comparison.

Measurements were performed on test circuits that were placed between two blocks, which contain circuits similar to the device under test (DUT). The measured power is that of the DUT, including the power consumed by driving the next stage, thus accounting for the input power consumption, and not just the power directly consumed from supply. This configuration gives more realistic environment conditions for test circuit, instead of the ideal input transitions of simulator's voltage sources.

The fact that no GDI cell contains a full $V_{DD}$ to Gnd supply, implies that the only power consumed is through the inputs, as GDI cells are fed only by the previous circuits. A similar phenomenon is partially observed in most PTL circuits, but in PTL the power consumption from the source is caused by CMOS buffers, which are included in every regular PTL. Yet, in real circuits and simulations, current flow from the sources can be measured in GDI. The current flow is caused by buffers that are connected between cascaded cells. Hence, a fair comparison between the techniques was performed for measurements carried out from series of cells with buffers and not from a single cell. The GDI and TG test circuits contain two basic cells with one output buffer. The N-PG test circuit contains two buffers, one after each cell. The CMOS test circuit has no buffers.

For each technique, measurements of average power, maximal delay and number of transistors were performed. The results of the logic gate comparisons for GDI, CMOS, TG, and N-PG using the circuit topologies shown in FIGS. 18a, 18b, and 18c are given in Table 4.

TABLE 4

| Gate type in series | Logic expression | GDI | | | CMOS | | | TG | | | N-PG | | |
|---|---|---|---|---|---|---|---|---|---|---|---|---|---|
| | | Power (μW) | Delay (nsec) | # tr. | Power (μW) | Delay (nsec) | # tr. | Power (μW) | Delay (nsec) | # tr. | Power (μW) | Delay (nsec) | # tr. |
| MUX | $\overline{A}B + AC$ | 35.7 | 1.1 | 8 | 49.7 | 2.1 | 24 | 44.9 | 1.0 | 16 | 47.5 | 3.1 | 16 |
| OR | $A + B$ | 26.3 | 1.2 | 8 | 32.9 | 1.7 | 12 | 36.2 | 1.3 | 16 | 32.6 | 2.7 | 16 |
| AND | $AB$ | 25.7 | 0.9 | 8 | 34.1 | 1.4 | 12 | 30.8 | 0.8 | 16 | 30.1 | 2.8 | 16 |
| F1 |  | 31.2 | 0.8 | 8 | 45.2 | 1.5 | 12 | 31.8 | 1.1 | 16 | 31.8 | 2.5 | 16 |
| F2 |  | 32.0 | 1.3 | 8 | 43.1 | 1.9 | 12 | 33.2 | 1.4 | 16 | 29.6 | 3.5 | 16 |

Amongst all the design techniques, GDI has the minimal number of transistors. Each GDI gate was implemented using only 2 transistors. The worst case, with respect to transistor count, is for the CMOS MUX gate (multiplexers are the well-known domain of pass-transistor logic). In this sense, the PTL techniques are inferior comparatively to GDI.

Results are given for power dissipation in different gates. The MUX gate has the largest power consumption of all the logic gates, because of its complicated implementation (particularly in CMOS) and the presence of an additional input. On the other hand, the AND gate's power dissipation is the minimal amongst all the gates. Most of GDI logic gates prove to be the most power efficient in comparison with the four other design techniques (only for the F2 gate is there an advantage of N-PG over the GDI gate).

The best performance with respect to circuit delay was measured in the GDI and TG circuits. The advantage of the TG technique in some circuits can be explained by the fact that one n-MOS and one p-MOS transistor are conducting at the same time for each logic state in a TG gate. Note that the results for CMOS delays compared to GDI are in most cases bounded according to (29), as expected. Circuits implemented in N-PG are the slowest, because of the need for additional buffer circuitry in each gate.

In summary, amongst the presented design techniques, GDI proves to have the best performance values and the lowest transistor count. Even in the cases where the power or delay parameters of some GDI gates are inferior, relative to TG or N-PG, the power-delay products and transistor count of GDI are lower. Only the TG design method is a viable alternative to GDI if a high frequency operation is of concern.

A fair comparison of the properties of the different logic techniques mentioned above involves measuring delay and power consumption under different load conditions of the cell. Parametric simulations for power and delay measurement for GDI circuits under differing load conditions were performed. FIG. 19 shows power and delay results for OR and AND cells under different load conditions, for the GDI (F1 configuration), CMOS and PTL techniques. The simulations were carried out in SPECTRE to compare GDI NOR and AND cells implemented in CMOS, N-PG, and TG, in 0.24 μm CMOS technology. A regular CMOS inverter was used as a load for the DUT, with dimensions of 2.4 μm/0.24 μm for PFET and 0.9 μm/0.24 μm for NFET. In this technology the given load size applies a load capacitance of about 1 fF. In order to achieve a dependence of simulations on load conditions, load size was multiplied by a scaling parameter, PS, varying from 1 to 3. The results of power and delay as function of the PS parameter are presented in FIG. 19, and show the consistent advantage of GDI.

In order to cover a wide range of possible circuits, design methods and properties comparisons for several digital combinatorial circuits were implemented using various methods (GDI, PTL and CMOS), design techniques, and technology processes. Table 5 contains an exemplary list of high-level circuits implemented to compare design methods and processes.

TABLE 5

| Circuit type | | Process Technology | | | |
| --- | --- | --- | --- | --- | --- |
| | | 0.35 μm | 0.5 μm | 0.8 μm | 1.6 μm |
| Adder | CLA | — | G, C | G*, C*, P | — |
| | Ripple | — | G, C | — | — |
| | Combined | — | G, C | — | — |
| Comparator | | — | — | G, C, P | G, C, P |
| Multiplier | | — | G, C | — | — |
| Counter** | | G, C | — | — | — |

G—GDI
C—CMOS
P—PTL
*Fabricated circuits
**0.35 twin-well technology

Since the full GDI library is implementable in a regular p-well CMOS process, only the function F1 and its expansions were implemented. FIG. 20 shows GDI circuits and layouts for basic functions for a regular p-well process.

Comparative results were obtained for several high-level circuits, such as the Carry-Lookahead Adder (CLA). The CLA structure is well known and widely used due to its high-speed operation while calculating the carries in parallel. The carry of the i-th stage, $C_i$ may be expressed as:

$$C_i = G_i + P_i C_{i-1} \quad (39)$$

where $$G_i = A_i \cdot B_i \text{ generate signal} \quad (40)$$

$$P_i = A_i + B_i \text{ propagate signal} \quad (41)$$

Expanding this yields $$C_i = G_i + P_i G_{i-1} + P_i P_{i-1} G_{i-2} + \ldots + P_i \ldots P_1 C_0 \quad (42)$$

The sum $S_i$ is generated by $$S = C_{i-1} \oplus A_i \oplus B_i$$

$$\text{or } C_{i-1} \oplus P_i \text{ (if } P_i = A_i \oplus B_i) \quad (43)$$

For four stages of lookahead, the appropriate terms are $$C_0 = G_0 + P_0 CI \quad (44)$$

$$C_1 = G_1 + P_1 G_0 + P_1 P_0 CI \quad (45)$$

$$C_2 = G_2 + P_2 G_1 + P_2 P_1 G_0 + P_2 P_1 P_0 CI \quad (46)$$

$$C_3 = G_3 + P_3 G_2 + P_3 P_2 G_1 + P_3 P_2 P_1 G_0 + P_3 P_2 P_1 P_0 CI \quad (47)$$

FIG. 21 shows examples of generic carry-lookahead adders. FIG. 21a is a basic scheme, and FIG. 21b is a 3-bit carry generator. The PG generation and SUM generation circuits surround a carry-generate block. The circuit presented is 4-bit adder that can be replicated in order to create 8-bit adder, due to fan-in and size limitations of the gates.

FIG. 22 shows a four-bit ripple comparator consisting of a cascade of 4 identical basic units, while the comparison data is transmitted through the units. Comparison of the MSB digit is done first, proceeding down to the LSB. The outcome of comparison in every unit is represented by two signals C and D according to Table 6.

TABLE 6

| C | D | Result |
| --- | --- | --- |
| 1 | 0 | A > B |
| 0 | 1 | A < B |
| 0 | 0 | A = B |

Every basic unit includes two inputs of comparison data from previous units. The logic implementation of each unit is based on following expressions:

$$D_{out} = D_{in} + \overline{A} B \overline{C}_{in} \quad (48)$$

$$C_{out} = C_{in} + A \overline{B} \overline{D}_{in} \quad (49)$$

FIG. 23 shows the structure of a 4-bit multiplier. The multiplier contains an array of interconnected basic cells. The multiplier circuit is based on the generation of partial products and their addition, thereby creating a final product. The following equations represent both the multiplied numbers and the product:

$$X = \sum_{i=0}^{m-1} x_i 2^i, \quad Y = \sum_{j=0}^{n-1} y_j 2^j \quad (50)$$

$$P = X \times Y = \sum_{i=0}^{m-1} x_i 2^i \cdot \sum_{j=0}^{n-1} y_j 2^j = \sum_{i=0}^{m-1} \sum_{j=0}^{n-1} (x_i y_j) 2^{i+j} = \sum_{k=0}^{m+n-1} p_k 2^k \quad (51)$$

The basic multiplier cell is shown in FIG. 24. Each multiplier cell represents one bit of partial product and is responsible for:

1. Generating a bit of the correct partial product in response to the input signals.
2. Adding the generated bit to the cumulative sum propagated from the row above.

The cell consists of two components—an AND gate to generate the partial product bit, and an adder to add this bit to the previous sum.

Simulation results were used to make performance comparisons of some of the higher order digital circuits mentioned above. All given measurements were carried out on a representative pattern of possible input transitions, with the worst case assumption used to find a maximal delay of the circuit, and the power dissipation was calculated as an average over the pattern.

Results are now presented for an eight-bit CLA adder. An eight-bit adder was realized in a 1.6 μm CMOS process. Two chips were designed, and their layouts are shown in FIG. 25. FIG. 25a shows a CLA in GDI and CMOS, and FIG. 25b shows a CLA in GDI and TG. Performance comparisons were done by simulation using Cadence Spectre at $V_{DD}$=5V, $f_{CLK}$=10 MHz and 27° C. Several parameters were measured: average power, maximal delay, power-delay product, number of transistors and circuit area. The results are assembled in Table 7 and FIG. 26.

TABLE 7

| Logic style | Power [mW] | Delay [nsec] | Power-Delay | Number of tran. | Area [μm$^2$] |
|---|---|---|---|---|---|
| GDI | 7.33 | 10.24 | 81.53 | 366 | 375200 |
| CMOS | 8.26 | 14.84 | 144.36 | 392 | 330120 |
| TG | 10.96 | 9.34 | 105.72 | 624 | 668812 |

As can be seen, the GDI Adder proves to be the most power efficient circuit. Power dissipation in GDI is less than in CMOS and in TG, yet the delay of TG is less than that of GDI. The CMOS circuit has the highest delay, 44.9% more than GDI. In spite of the inferior speed of GDI relative to TG, the power-delay product of GDI is less than both TG and CMOS. Because of the use of limited GDI cell library in p-well CMOS process, the number of transistors and area of CMOS and GDI circuits are close, but much less than in the TG Adder implementation.

A comparison of an eight-bit comparator circuit was performed for GDI vs. CMOS and N-PG technologies. The implementation of the eight-bit comparator was carried out in the same 1.6 μm CMOS process described above, at $V_{DD}$=5V, $f_{CLK}$=100 MHz, and 27° C. The layout of an eight-bit comparator chip containing the three circuits that were tested is given in FIG. 27. GDI proves to have the best performance among the tested design methods, as shown in FIG. 28 and Table 8.

TABLE 8

| Logic style | Power [mW] | Delay [nsec] | Power-Delay | Number of tran. | Area [μm$^2$] |
|---|---|---|---|---|---|
| GDI | 1.41 | 4.21 | 6.82 | 96 | 198000 |
| CMOS | 1.82 | 5.16 | 10.51 | 96 | 178980 |
| N_PG | 3.87 | 7.37 | 28.48 | 96 | 148990 |

The results of the power, delay and power-delay product of GDI are best among the compared circuits, while N-PG has the worst performance results. Here, as well as in the Adder circuit, the limited GDI library was used because of process constraints. As a result, the final area of GDI comparator is greater than CMOS and N-PG, while the number of transistors in all 3 circuits is the same.

A comparison between GDI and CMOS performance was also made for a four-bit multiplier. The multiplier was implemented in 0.5 μm CMOS technology, with a 3.3V supply, at 50 MHz and 27° C. In order to achieve a robust measure of the power-delay product, simulations were run on CMOS and GDI circuits that were parametric in their size. Running a simulation with and area parameter of α=2 indicates that the transistors widths are twice the widths for α=1. Spectre simulations were done on schematic circuits, while changing the area parameter, α, from 1 to 8. FIGS. 29-31 show the changing of power (FIG. 29), delay (FIG. 30), and power-delay product (FIG. 31) as function of α. As can been seen, GDI shows better results in all parameters for all area coefficients. Twenty-six transistors were used for the GDI multiplier, relative to 44 transistors used for the CMOS multiplier. An additional comparison was done for circuits with the same delay value (1.03 nsec). The results of area, power dissipation and power-delay are shown in Table 9.

TABLE 9

| GDI | | | CMOS | | |
|---|---|---|---|---|---|
| Area [μm$^2$] | Power [mW] | Power-Delay | Area [μm$^2$] | Power [mW] | Power-Delay |
| 333 | 0.3079 | 0.9297 | 1503 | 1.265 | 1.09 |

An 8-bit Adder designed in GDI and CMOS (see FIG. 25a) was fabricated in 1.6 μm CMOS technology (MOSIS). The voltage supplies of the two circuits were separated in order to enable a separate power measurement. After the post-processing, three types of ICs were available: GDI Adder, CMOS Adder, and ICs containing both circuits connected. Measurements of the dynamic power of the circuits could thus be carried out, while eliminating the static power dissipation and power dissipation of output pads, which contain buffers and additional circuitry. A photograph of the test chip is shown in FIG. 32.

Several sets of measurements and tests were applied to test chips, using the EXCELL 100+ testing system of IMS. In order to demonstrate the influence of scaling on a given GDI circuit, the measurements were performed with various supply voltages.

Operational tests were performed on both circuits to check for proper operation, while using two scripts, which generated patterns of input values. The first set of values was generated according to a binary order of input numbers. The second set included over 20,000 random transitions, which were used for delay and power measurements.

The maximal delay of both circuits was measured by increasing the frequency of input signal, and checking the results of the increase. The frequency at which the first error appears defines the delay of the circuit. Table 10 presents the delays measured for GDI and CMOS adders for various voltage supply levels.

TABLE 10

| | Delay (nsec) vs. Voltage Supply Level | | | | |
|---|---|---|---|---|---|
| Logic Style | 5 Volt | 4 Volt | 3.5 Volt | 3 Volt | 2.5 Volt |
| GDI | 76 | 100 | 116 | 153 | 234 |
| CMOS | 77 | 100 | 117 | 154 | 235 |

Note that for the given implementation and the output load, defined by the testing system, both circuits were designed to have equal delays.

For the dynamic power measurements a set of measurements at low frequencies were performed for various supply voltages, so as to enable eliminating the influence of the circuitry in the output pads which causes high additional power dissipation. The low frequency results represent the static power dissipation of the test chip. Power measurements at high frequencies were performed and the static power values were subtracted from the high frequency results to achieve the dynamic power at the given frequency.

The final results for dynamic power dissipation are shown in Table 11.

TABLE 11

| | Absolute (mWatt) and Normalized (mWatt/MHz) Power vs. Voltage Supply Level | | | | | |
|---|---|---|---|---|---|---|
| Logic Style | 5 Volt | 4.5 Volt | 4 Volt | 3.5 Volt | 3 Volt | 2.5 Volt |
| GDI | 15.2 (1.22) | 9.8 (0.98) | 3.3 (0.83) | 3.1 (0.78) | 2.9 (0.73) | 2.5 (0.63) |
| CMOS | 21.5 (1.72) | 15.5 (1.55) | 6.0 (1.5) | 5.3 (1.33) | 4.8 (1.2) | 2.8 (0.7) |

The values in parentheses are normalized by frequencies of measurements.

Dynamic power measurements were performed for various frequencies, respectively to the voltage supply level. For a 5V supply, the measurements were performed at 12.5 MHz; for a 4.5V supply at 10 MHz; and for other supply voltages at 4 MHz.

Due to the equal delay values in both circuits (see Table 10), the normalized power-delay product has about the same values as those of power measurements. For power and power-delay product, improvements in the range of 11% to 45% were measured.

There is a difference between the simulations and measured data. The difference is caused by the fact that in all the presented circuits the simulations were performed while placing the DUT in the environment of logic circuits designed in the same technique, while in the test chip measurements the single DUT has been connected directly to output pads, causing a significantly higher load capacitance. Still, in both measured and simulated results the relative advantage of GDI is preserved.

GDI implementations were also analyzed for the class of asynchronous circuits. The results presented above show that combinational GDI circuits are fast and low power relative to CMOS and PTL implementations. C-elements and SR latches are compared with a variety of CMOS state holding circuits. A bundled-data controller and two qDI combinational logic circuits (a XOR gate and a full adder) demonstrate that systems employing GDI components outperform standard CMOS implementations in area, power, and speed. Furthermore, GDI components provide some enhanced hazard tolerance. All designs were validated and compared using SpectreS simulations.

C-elements are frequently used in asynchronous design. The C-element changes its output only when both inputs are identical. The output of the C-element as a function of its inputs, a and b, and the present output ĉ is:

$$c = c \cdot (a+b) + a \cdot b \quad (55)$$

The GDI C-element was compared to the five CMOS C-element circuits shown in FIG. 33: dynamic (FIG. 33a), conventional (FIG. 33b), weak feedback (FIG. 33c), static (FIG. 33d), and symmetric (FIG. 33e) circuits. The symmetric circuit (FIG. 33d) has been identified by Al-Assadi et al. as the most energy-efficient and high-speed implementation from amongst the dynamic, conventional, weak feedback, and symmetric circuits.

FIG. 34 shows three GDI implementations of the C-element. The truth table for the C-element is given in Table 12.

TABLE 12

| A | B | C |
|---|---|---|
| 0 | 0 | 0 |
| 0 | 1 | no change |
| 1 | 0 | no change |
| 1 | 1 | 1 |

The dynamic GDI C-element (FIG. 34a) comprises two GDI cells with cross-connected diffusion areas. The common diffusion terminal of the GDI cell is used both as input (B) and output (C). The outer diffusion connections of each GDI cell are used as bi-directional terminals. The dynamic GDI C-element employs only four transistors, as compared to six transistors in the CMOS dynamic circuit (FIG. 33a).

The static GDI C-element (FIG. 34b) employs eight transistors, including four in a keeper, as compared with 10 in the static CMOS circuit (FIG. 33d). When the two inputs carry the same value and are different from the output (A=B≠C), the conducting path from input B to the output is connected and the signal B propagates to the output. Once the output is changed (A=B≠C), the path is disconnected and the output value is preserved by the keeper. At other times, if A·B, the B-to-C path is disconnected and the output is left unchanged.

The paths from input to output in either of the above-described GDI circuits always pass through one NMOS and one PMOS transistors. In contrast, CMOS C-elements contain pull-up paths that traverse two PMOS transistors in series. This difference contributes to the lower delay of the dynamic GDI C-element.

While the A input in both GDI circuits drives transistor gates, the B input does not drive any gates of the GDI cells; rather, it is only gated to the output through pass transistors. The signal path to the output is double-controlled, by the other input (A) and by the output (C). This double-control reduces the probability of output hazards. This advantage is extremely useful in asynchronous design, where the C-element is often assumed an atomic, hazard free building block (see J. Sparsø and S. Furber (eds.), Principles of asynchronous circuit design—A systems perspective, Kluwer Academic Publishers, 2001). However, due to transmission through two pass transistors, the B signal degrades by at least one $V_T$. In addition, the signal needs to drive not only the load, but also the feedback inverter. Consequently, the B→C path becomes critical in the C-element. Finally, the B signal presents an increased load on the previous stage (which sources B).

This problem may be solved by buffer insertion. The buffered GDI C-element is presented in FIG. 34c. Here, instead of adding a two-inverter buffer at the output, the inverters are distributed inside the circuit before and after the output C. This may make the circuit more efficient, charging both external and internal gates. In addition to their amplification role, the inverters perform a swing restoration, so that no $V_T$ drop is observed at the output. The buffered GDI C-element, however, is less area efficient.

One of the common disadvantages of pass gate logic is the static current due to $V_T$ drop, causing static power dissipation (as discussed by Al-Assadi et al.). However, the GDI C-elements presented in FIG. 34 avoid this dissipation, because they are not based on a conducting path with a $V_T$ drop. Once a new value has been written to the output, the keeper retains that value and all paths through the pass gates are disconnected.

GDI and CMOS three-input C-elements are shown in FIGS. 35a and 35b respectively. The three-input C-element is useful in qDI combinational logic, as will be discussed below. As explained above, the problem of a high PMOS stack in CMOS C-elements is somewhat mitigated in the GDI circuit.

A C-element can be replaced by an SR latch when the inputs are mutually exclusive, as shown in FIG. 36. GDI implementations of the C-element by SR latch are presented in FIGS. 37a and 37b (F1 and F2 based respectively). As shown in FIG. 36, the A input is inverted, as is typically useful in asynchronous circuits. The implementation is area-efficient: The SR latch requires only two GDI cells (four transistors).

The mutual exclusivity of the SR inputs contributes to the fact that no $V_T$ drop is observed in the circuit. The drop can occur only when 0 is applied to the diffusion input of one of the GDI cells in the F1-SR latch, or when 1 is applied to one of the GDI cells in the F2 circuit. In each case, thanks to mutual exclusion, the second GDI is biased as a simple inverter, and restores the voltage swing.

C-elements in common applications, such as Muller pipelines (see FIG. 38), require one inverted input. This configuration is common in asynchronous circuits, mostly applied to Acknowledge signal in the data control. While in CMOS C-elements this is achieved by adding an inverter, in GDI the inversion can be performed by simply switching the interconnects of the diffusion nodes as shown FIG. 39. This eliminates the need for an additional inverter and reduces the delay of the Acknowledge signal in the Muller pipeline. In the case of GDI SR latch, an inverter is removed from one of its inputs, making it an even smaller circuit.

To compare GDI and CMOS C-elements, all GDI and CMOS circuits were designed for a 0.35 μm technology with 3.3V supply. The circuits were simulated with the SpectreS simulator using BSIM3v3 MOSFET models with parasitic parameters. Comparisons were performed in terms of average power consumption, maximal delay and number of transistors of the circuit. FIG. 40 illustrates the simulation environment. The C-element is driven by two inverters, which are driven by ideal sources, to imitate the real environment and signals. The inverters are also useful for measuring the current flow from $V_{DD}$ that is caused by transitions in the diffusion inputs in GDI which sink current from the previous logic stage. The C-element drives a 1001 fF load capacitor.

The shorting "x" transistors (see FIG. 33e) are minimal size where W/L=0.35/0.35 μm. Other transistors are 1 μm/1 μm for NMOS and 4 μm/1 μm for PMOS. The weak inverter size is 1 μm/4 μm. Simulation results are presented below.

For the C-element shown in FIG. 41, the best results of average power are observed for dynamic GDI, which require 94% less average power than the static CMOS implementation, and 80% less than the dynamic CMOS circuit (which is the best CMOS implementation in terms of power). GDI SR latch-based C-elements show results close to the CMOS dynamic circuit, and better than any static CMOS implementation.

In terms of maximal delay, the dynamic GDI C-element is the fastest circuit, showing up to 89% maximal delay decrease compared to standard CMOS techniques, and a 63% improvement compared to the symmetric C-element, which is the fastest technique among CMOS circuits.

Dynamic and SR-based GDI circuits are the most area efficient (requiring up to 33% fewer transistors than CMOS). Buffered GDI, on the other hand, requires the highest number of transistors amongst the GDI circuits (12 transistors).

In summary, CMOS C-elements are preferred over GDI for some static circuits, but in other cases the dynamic GDI C-element or the GDI SR latch may offer a superior solution.

Simulations results for C-elements with inverted input A are presented in FIG. 41 (dark bars). While the implementation of one inverted input requires an extra inverter in CMOS C-elements, GDI circuits either retain the same complexity or even get smaller (in the case of SR-based C-elements). This contributes to the superior performance of GDI.

Concerning average power, GDI offers up to 85% improvement in power dissipation compared to CMOS. This is consistent with the size reduction in SR-based circuits by elimination of the input inverter.

As for maximal delay, SR-F1, SR-F2 and the dynamic GDI demonstrate the shortest delay among all circuits. In total the delay improvement in GDI is in the 22%-82% range compared to CMOS.

Note that the inverted input GDI C-element is slower than the non-inverted input one. This is due to the fact that while in the non-inverted GDI each path through the pass-transistors contains one NMOS and one PMOS transistors, in the inverted input GDI one of the paths goes through two PMOS transistors.

As explained above, inverted-input CMOS circuits are bigger than non-inverted ones, and the opposite is true for the SR-based GDI circuits. Other GDI circuits have the same size in both cases.

Comparisons between GDI and CMOS implementations of Bundled-Data Controllers were also made, in order to demonstrate the relative advantages of GDI over CMOS in a complex asynchronous circuit. FIG. 42 shows the filter structure and the STG flow for a Bundled-Data Filter Controller (see J. Cortadella, M. Kishinevsky, A. Kondratyev and L. Lavagno, "Introduction to asynchronous circuit design: specification and synthesis," Tutorial, Async. Conference, 2000, contents of which are hereby incorporated by reference). The Petrify CMOS implementation of the controller is shown in FIG. 43a. A CMOS Symmetric C-element is used in this comparison to obtain a low-power circuit.

FIG. 43a shows a CMOS-based Bundled-Data Controller. For the GDI circuit (FIG. 43b), the inverted-input AND gates is replaced by GDI OR gates and inverters. Using the GDI OR element resulted in a reduced number of transistors, and the inverters help with swing-restoration. The inputs of the C-element are mutually exclusive, and hence it has been replaced by the smaller, faster, and lower power GDI SR latch.

RC delay units with time constant of 0.1 ns were inserted between each Request and its corresponding Acknowledge signals, to emulate a reasonable environment.

Simulation results are shown in FIG. 44. The GDI implementation requires only 20 transistors, as opposed to 50 in CMOS. The GDI controller is approximately three times faster than the CMOS circuit, consuming about the same power. The reduced circuit complexity and the superior properties of the abovedescribed GDI SR-F2 are the main contributors to the advantages of the GDI controller.

Results are now presented for GDI qDI combinational logic circuits. The qDI combinational logic circuit is implemented in CMOS and GDI, according to the DR-ST design methodology (see I. David, R. Ginosar, and M. Yoeli, "An Efficient Implementation of Boolean Functions as Self-Timed Circuits," IEEE Trans. Computers, pp. 2-11, January 1992, contents of which are hereby incorporated by reference). The n-input, m-output DR-ST circuit comprises four interconnected subnets (see FIG. 45): ORN and CEN detect when all the inputs become defined or undefined. DRN is a monotonic implementation of the dual rail combinational functions, and OUTN enforces the strong conditions (all outputs remain undefined until all inputs become defined, and all outputs remain defined as long as not all inputs have become undefined). Other qDI techniques include Delay Insensitive Minterm Synthesis (DIMS) (see R. O. Ozdag and P. A. Beerel, "High-speed QDI asynchronous pipelines," in Proc. International Symposium on Advanced Research in Asynchronous Circuits and Systems, pp. 13-22, April 2002, contents of which are hereby incorporated by reference) and RSPCFB (see J. Sparsø and J. Straunstrup, "Delay insensitive multi-ring structures," Integration, the VLSI journal, 15(3), 313-340, October 1993, contents of which are hereby incorporated by reference).

A simple XOR gate is used as an example. The CMOS and GDI implementations of the ORN and DRN subnets of the XOR DR-ST gate are presented in FIG. 46 and FIG. 47 respectively. Symmetric C-elements are used for the CMOS CEN and OUTN subnets, while the GDI implementation is based on the buffered GDI C-element.

Three different combinations of subnet implementations are shown in FIG. 48. FIG. 48*a* shows a CMOS implementation, with all four subnets as CMOS circuits. FIG. 48*b* shows a GDI implementation, with all four subnets as GDI cells. FIG. 48*c* shows a hybrid implementation, with the ORN and DRN subnets as GDI cells, and the CEN and OUTN subnets as CMOS circuits.

Simulation results are shown in FIG. 49. The GDI and hybrid circuits are 38% smaller than the CMOS one. The GDI circuit is slower and consumes more power than the CMOS circuit, due to the use of buffered GDI C-elements, which are required in this case for their drive capability. The hybrid circuit, however, consumes only half the power as CMOS while being just as fast. When hazard immunity and low supply voltage tolerance are critical, such as in low noise, low power applications, an all-GDI circuit should be considered.

A more complex DR-ST combinational logic circuit is now presented. CMOS and Hybrid circuits of a full adder are designed and compared. The ORN and DRN subnets are presented in FIG. 50 and FIG. 51 respectively, and are either GDI or CMOS based. (In the DRN subnet Full Adder each gate may be implemented with either CMOS or GDI.) The CEN subnet is based on a 3-input static CMOS C-element, while OUTN comprises 2-input symmetric CMOS C-elements.

Simulation results are shown in FIG. 52. In the DR-ST combinational logic circuit, which is relatively large compared to the circuits described above, the hybrid implementation outperforms CMOS in all aspects. The hybrid circuit is about half the size and consumes only about ⅔ the power, while being 10% faster than the CMOS one.

Reference is now made to FIG. 53, which is a circuit diagram of a GDI 1-to-2 Decoder, according to a preferred embodiment of the present invention. Decoder 5300 contains only two GDI cells, 5310 and 5320. The two GDI cells have their logic inputs (5312 and 5322) connected together to form the decoder logic input, their first dedicated logic terminals (5314 and 5324) tied together to form Out1, and their second dedicated logic terminals (5316 and 5326) tied together to form Out2. Decoder 5300 is a four-transistor structure that can be used as an efficient basis for implementation of low-power area-efficient decoders. Table 13 gives the decoder truth table.

TABLE 13

| In | Out1 | Out2 |
|----|------|------|
| '0' | ◢ | '0' |
| ◢ | '0' | ◢ |

Many of the abovedescribed preferred embodiments are described in A. Morgenshtein, A. Fish, I. A. Wagner, "Gate-Diffusion Input (GDI)—A Novel Power Efficient Method for Digital Circuits: A Detailed Methodology," 14th IEEE International ASIC/SOC Conference, USA, September 2001, A. Morgenshtein, A. Fish, I. A. Wagner, "Gate-Diffusion Input (GDI)—A Technique for Low Power Design of Digital Circuits: Analysis and Characterization," ISCAS'02, USA, May 2002, A. Morgenshtein, A. Fish, I. A. Wagner, "Gate-Diffusion Input (GDI)—A Power Efficient Method for Digital Combinatorial Circuits," IEEE Transactions on VLSI Systems, vol. 10, no. 5, October 2002, and A. Morgenshtein, M. Moreinis and R. Ginosar, "Asynchronous Gate-Diffusion-Input (GDI) Circuits" to be published in IEEE Transactions on TVLSI Systems, which are all hereby incorporated by reference. Contents of any books and articles given above are hereby incorporated by reference.

The GDI logic technique described above provides a low-power alternative to existing logic circuit techniques. GDI is suitable for design of fast, low power circuits, using reduced number of transistors, while improving logic level swing and static power characteristics, and allowing simple top-down design by using a small cell library. GDI is suitable for implementation of a wide spectrum of logic circuits, using a variety of transistor technologies. GDI logic circuit performance is testable, so that automatic design and verification tools for GDI circuits can be readily developed. Accurate simulations of designed logic circuits can be performed prior to manufacture. GDI logic and logic circuit design methodology are therefore a promising new approach to logic circuit design.

It is expected that during the life of this patent many relevant logic circuits, logic gates, logic cells, transistors, and transistor technologies will be developed and the scope of the terms logic circuit, logic gate, logic cell, transistor, and transistor technology is intended to include all such new technologies a priori.

As used herein the term "about" refers to ±10%.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A complementary logic circuit, comprising:
   a first logic input;
   a second logic input;
   a first dedicated logic terminal;
   a second dedicated logic terminal;
   a first logic block comprising:
      a p-type transistor network for implementing a predetermined logic function, said p-type transistor network comprising a plurality of p-type transistors, and having an outer diffusion connection, a first network gate connection, and an inner diffusion connection, said outer diffusion connection of said p-type transistor network being connected to said first dedicated logic terminal, and said first network gate connection of said p-type transistor network being connected to said first logic input; and
   a second logic block comprising:
      an n-type transistor network implementing logic function complementary to said predetermined logic function, said n-type transistor network comprising a plurality of n-type transistors, and having an outer diffusion connection, a first network gate connection, and an inner diffusion connection, said outer diffusion connection of said n-type transistor network being connected to said second dedicated logic terminal, and said first network gate connection of said n-type transistor network being connected to said second logic input;
   said inner diffusion connections of said p-type transistor network and of said n-type transistor network being connected to form a common diffusion logic terminal, wherein said outer diffusion connection of said p-type transistor network and said outer diffusion connection of said n-type transistor network are separately configured, such that said p-type transistor network and said n-type transistor network share a single common diffusion logic terminal.

2. A complementary logic circuit according to claim 1, wherein said first and second logic inputs are connected to form a first common logic input.

3. A complementary logic circuit according to claim 2, comprising one of a group of logic circuits comprising: an OR gate, an inverted OR (NOR) gate, an AND gate, a multiplexer gate, an inverter gate, and an exclusive OR (XOR) gate.

4. A complementary logic circuit according to claim 1, wherein each of said logic terminals is separately configurable to serve as a logic input.

5. A complementary logic circuit according to claim 1, wherein each of said logic terminals is separately configurable to serve as a logic output.

6. A complementary logic circuit according to claim 1, further comprising a third logic input connected to a second network gate connection of said p-type transistor network.

7. A complementary logic circuit according to claim 6, further comprising a fourth logic input connected to a second network gate connection of said n-type transistor network.

8. A complementary logic circuit according to claim 7, said third and fourth logic inputs being connected to form a second common logic input.

9. A complementary logic circuit according to claim 1, further comprising a fourth logic input connected to a second network gate connection of said n-type transistor network.

10. A complementary logic circuit according to claim 1, wherein said p-type transistor network comprises one of a group of networks comprising:
    a network of p-type field effect transistors (FET), a network of p-type p-well complementary metal-oxide semiconductor (CMOS) transistors, a network of p-type n-well complementary metal-oxide semiconductor (CMOS) transistors, a network of p-type twin-well complementary metal-oxide semiconductor (CMOS) transistors, a network of p-type silicon on insulator (SOI) transistors, and a network of p-type silicon on sapphire (SOS) transistors.

11. A complementary logic circuit according to claim 1, wherein said n-type transistor network comprises one of a group of networks comprising: a network of n-type FETs, a network of n-type p-well CMOS transistors, a network of n-type n-well CMOS transistors, a network of n-type twin-well CMOS transistors, a network of n-type SOI transistors, and a network of n-type SOS transistors.

12. A complementary logic circuit according to claim 1, wherein said logic circuit is operable to implement a ((NOT A) OR B) logic operation upon logic inputs A and B.

13. A complementary logic circuit according to claim 1, wherein said logic circuit is operable to implement a ((NOT A) AND B) logic operation upon logic inputs A and B.

14. A logic circuit, comprising interconnected logic elements, said logic elements comprising:
    a first logic input;
    a second logic input;
    a first dedicated logic terminal;
    a second dedicated logic terminal;
    a p-type transistor, having an outer diffusion connection, a gate connection, and an inner diffusion connection; and
    an n-type transistor, having an outer diffusion connection, a gate connection, and an inner diffusion connection;
    said first logic input being connected to said gate connection of said p-type transistor, said second logic input being connected to said gate connection of said n-type transistor, said first dedicated logic terminal being connected to said outer diffusion connection of said p-type transistor, said second dedicated logic terminal being connected to said outer diffusion connection of said n-type transistor, and said inner diffusion connection of said p-type transistor and said inner diffusion connection of said n-type transistor being connected to form a common diffusion logic terminal, wherein for each of said logic elements each of said logic terminals is separately configurable to serve as a logic output.

15. A logic circuit according to claim 14, wherein for each of logic elements said first and second logic inputs are connected to form a common logic input.

16. A logic circuit according to claim 15, comprising one of a group of logic circuits comprising: an SR latch, a D latch, a T latch, and a toggle flip-flop (TFF).

17. A logic circuit according to claim 14, wherein for each of logic elements each of said logic terminals is separately configurable to serve as a logic input.

18. A logic circuit according to claim 14, wherein a type of said p-type transistor comprises one of a group of transistor types comprising: p-type FET transistors, p-type p-well CMOS transistors, p-type n-well CMOS transistors, p-type twin-well CMOS transistors, p-type SOI transistors, and p-type SOS transistors.

19. A logic circuit according to claim 14, wherein said a type of n-type transistor comprises one of a group of transistor types comprising: n-type FET transistors, n-type p-well CMOS transistors, n-type n-well CMOS transistors, n-type twin-well CMOS transistors, n-type SOI transistors, and n-type SOS transistors.

20. A logic circuit according to claim 14, further comprising at least one stabilizing buffer element.

21. A logic circuit according to claim 14, further comprising at least one inverter.

22. A logic circuit according to claim 14, wherein said logic circuit comprises a C-element.

23. A logic circuit according to claim 14, wherein said logic circuit comprises a latch.

24. A logic circuit according to claim 14, wherein said logic circuit comprises a bundle data filter controller.

25. A logic circuit according to claim 14, wherein said logic circuit comprises a one to two decoder.

26. A logic circuit according to claim 14, comprising one of a group of logic circuits comprising: a carry-lookahead adder (CLA), a ripple adder, a combined ripple-CLA adder, a ripple comparator, a multiplier, and a counter.

27. A logic circuit according to claim 14, comprising one of a group of logic circuits comprising: an OR gate, an inverted OR (NOR) gate, an AND gate, a multiplexer gate, an inverter gate, and an exclusive OR (XOR) gate.

28. A logic circuit according to claim 14, wherein said logic circuit is operable to implement a ((NOT A) OR B) logic operation upon logic inputs A and B.

29. A logic circuit according to claim 14, wherein said logic circuit is operable to implement a ((NOT A) AND B) logic operation upon logic inputs A and B.

30. A logic circuit, comprising interconnected logic elements, said logic elements comprising:
a first logic input;
a second logic input;
a first dedicated logic terminal;
a second dedicated logic terminal;
a first logic block comprising:
a p-type transistor network for implementing a predetermined logic function, said p-type transistor network comprising a plurality of p-type transistors, and having an outer diffusion connection, a first network gate connection, and an inner diffusion connection,
said outer diffusion connection of said p-type transistor network being connected to said first dedicated logic terminal, and said first network gate connection of said p-type transistor network being connected to said first logic input; and
a second logic block comprising:
a n-type transistor network implementing logic function complementary to said predetermined logic function, said n-type transistor network comprising a plurality of n-type transistors, and having an outer diffusion connection, a first network gate connection, and an inner diffusion connection,
said outer diffusion connection of said n-type transistor network being connected to said second dedicated logic terminal, and said first network gate connection of said n-type transistor network being connected to said second logic input;
said inner diffusion connections of said p-type transistor network and of said n-type transistor network being connected to form a common diffusion logic terminal, wherein said outer diffusion connection of said p-type transistor network and said outer diffusion connection of said n-type transistor network are separately configured, such that said p-type transistor network and said n-type transistor network share a single common diffusion logic terminal.

31. A logic circuit according to claim 30, wherein for each of said logic elements said first and second logic inputs are connected to form a first common logic input.

32. A logic circuit according to claim 30, wherein for each of said logic elements each of said logic terminals is separately configurable to serve as a logic input.

33. A logic circuit according to claim 30, wherein for each of said logic elements each of said logic terminals is separately configurable to serve as a logic output.

34. A logic circuit according to claim 30, further comprising a third logic input connected to a second network gate connection of said p-type transistor network.

35. A complementary logic circuit according to claim 34, further comprising a fourth logic input connected to a second network gate connection of said n-type transistor network.

36. A complementary logic circuit according to claim 35, said third and fourth logic inputs being connected to form a second common logic input.

37. A logic circuit according to claim 30, further comprising a fourth logic input connected to a second network gate connection of said n-type transistor network.

38. A logic circuit according to claim 30, wherein said p-type transistor network comprises one of a group of networks comprising: a network of p-type field effect transistors (FET), a network of p-type p-well complementary metal-oxide semiconductor (CMOS) transistors, a network of p-type n-well complementary metal-oxide semiconductor (CMOS) transistors, a network of p-type twin-well complementary metal-oxide semiconductor (CMOS) transistors, a network of p-type silicon on insulator (SOI) transistors, and a network of p-type silicon on sapphire (SOS) transistors.

39. A logic circuit according to claim 30, wherein said n-type transistor network comprises one of a group of networks comprising: a network of n-type FETs, a network of n-type p-well CMOS transistors, a network of n-type n-well CMOS transistors, a network of n-type twin-well CMOS transistors, a network of n-type SOI transistors, and a network of n-type SOS transistors.

40. A logic circuit according to claim 30, further comprising at least one buffer element.

41. A logic circuit according to claim 30, further comprising at least one inverter.

42. A logic element comprising:
a first logic input;
a second logic input;
a first dedicated logic terminal;
a second dedicated logic terminal;

a p-type transistor, having an outer diffusion connection, a gate connection, and an inner diffusion connection; and an n-type transistor, having an outer diffusion connection, a gate connection, and an inner diffusion connection;

said first logic input being connected to said gate connection of said p-type transistor, said second logic input being connected to said gate connection of said n-type transistor, said first dedicated logic terminal being connected to said outer diffusion connection of said p-type transistor, said second dedicated logic terminal being connected to said outer diffusion connection of said n-type transistor, and said inner diffusion connection of said p-type transistor and said inner diffusion connection of said n-type transistor being connected to form a common diffusion logic terminal, said first and second logic inputs being configured as independent inputs, wherein each of said logic terminals is separately configurable to serve as a logic output.

43. A logic element according to claim 42, wherein each of said logic terminals is separately configurable to serve as a logic input.

* * * * *